United States Patent
Buller et al.

(10) Patent No.: US 8,742,252 B2
(45) Date of Patent: Jun. 3, 2014

(54) ELONGATED PHOTOVOLTAIC CELLS IN CASINGS WITH A FILLING LAYER

(75) Inventors: Benyamin Buller, Cupertino, CA (US); Chris M. Gronet, Portola Valley, CA (US); Ratson Morad, Palo Alto, CA (US); Markus E. Beck, San Jose, CA (US)

(73) Assignee: Solyndra, LLC, Fremont, CA (US)

( * ) Notice: Subject to any disclaimer, the term of this patent is extended or adjusted under 35 U.S.C. 154(b) by 1439 days.

(21) Appl. No.: 11/821,524

(22) Filed: Jun. 22, 2007

(65) Prior Publication Data

US 2011/0000534 A1    Jan. 6, 2011

Related U.S. Application Data

(63) Continuation of application No. 11/378,847, filed on Mar. 18, 2006.

(51) Int. Cl.
   *H01L 31/0203*    (2014.01)

(52) U.S. Cl.
   USPC ................ 136/251; 136/246; 136/259

(58) Field of Classification Search
   USPC .................................................. 438/57
   See application file for complete search history.

(56) References Cited

U.S. PATENT DOCUMENTS

| | | | |
|---|---|---|---|
| 2,985,775 A | 5/1961 | Matlow et al. | |
| 3,005,862 A | 10/1961 | Escoffery | |
| 3,046,324 A | 7/1962 | Matlow | |
| 3,247,292 A | 4/1966 | Thelen | |
| 3,976,508 A | 8/1976 | Mlavsky | |
| 3,990,914 A * | 11/1976 | Weinstein et al. | 136/246 |
| 4,078,944 A | 3/1978 | Mlavsky | |
| 4,113,531 A | 9/1978 | Zanio et al. | |

(Continued)

FOREIGN PATENT DOCUMENTS

| | | |
|---|---|---|
| DE | 32 09 548 | 3/1982 |
| DE | 43 39 547 | 11/1993 |

(Continued)

OTHER PUBLICATIONS

Birkmire et al., 2005, "Cu(InGa)Se$_2$ Solar Cells on a Flexible Polymer Web," Prog. Photovolt 13: 141-148.

(Continued)

*Primary Examiner* — Jayne Mershon
(74) *Attorney, Agent, or Firm* — Brett A. Lovejoy; Ying Ying Zhou; Morgan, Lewis & Bockius, LLP

(57) ABSTRACT

A solar cell unit comprising a cylindrical shaped solar cell and a transparent tubular casing is provided. The tubular shaped solar cell comprises a back-electrode, a semiconductor junction circumferentially disposed on the back-electrode and a transparent conductive layer disposed on the semiconductor junction. The transparent tubular casing is circumferentially sealed onto the transparent conductive layer of the cylindrical shaped solar cell. A solar cell unit comprising a cylindrical shaped solar cell, a filler layer, and a transparent tubular casing is provided. The cylindrical shaped solar cell comprises a cylindrical substrate, a back-electrode circumferentially disposed on the cylindrical substrate, a semiconductor junction circumferentially disposed on the back-electrode, and a transparent conductive layer disposed on the semiconductor junction. The filler layer is circumferentially disposed on the transparent conductive layer and the transparent tubular casing is circumferentially disposed onto the filler layer.

19 Claims, 31 Drawing Sheets

(56) References Cited

U.S. PATENT DOCUMENTS

| | | | |
|---|---|---|---|
| 4,170,507 A | 10/1979 | Keeling et al. | |
| 4,217,148 A | 8/1980 | Carlson | |
| 4,292,092 A | 9/1981 | Hanak | |
| 4,461,922 A * | 7/1984 | Gay et al. | 136/249 |
| 4,686,323 A | 8/1987 | Biter et al. | |
| 4,783,373 A | 11/1988 | Baumeister et al. | |
| 4,913,744 A | 4/1990 | Hoegl et al. | |
| 5,437,736 A | 8/1995 | Cole | |
| 5,449,413 A | 9/1995 | Beauchamp et al. | |
| 5,468,988 A | 11/1995 | Glatfelter et al. | |
| 5,474,620 A | 12/1995 | Nath et al. | |
| 5,902,416 A | 5/1999 | Kern et al. | |
| 6,107,564 A | 8/2000 | Aguilera et al. | |
| 6,204,443 B1 | 3/2001 | Kiso et al. | |
| 6,258,620 B1 | 7/2001 | Morel et al. | |
| 6,294,723 B2 | 9/2001 | Uematsu et al. | |
| 6,355,873 B1 | 3/2002 | Ishikawa | |
| 6,359,210 B2 | 3/2002 | Ho et al. | |
| 6,410,843 B1 | 6/2002 | Kishi et al. | |
| 6,548,751 B2 | 4/2003 | Sverdrup, Jr. et al. | |
| 6,555,739 B2 | 4/2003 | Kawam | |
| 6,683,244 B2 | 1/2004 | Fujimori et al. | |
| 6,706,959 B2 | 3/2004 | Hamakawa et al. | |
| 6,706,963 B2 | 3/2004 | Gaudiana et al. | |
| 6,762,359 B2 | 7/2004 | Asai et al. | |
| 6,806,414 B2 | 10/2004 | Shiotsuka et al. | |
| 6,940,008 B2 | 9/2005 | Shiotsuka et al. | |
| 7,094,452 B2 | 8/2006 | Yamashita et al. | |
| 7,122,398 B1 * | 10/2006 | Pichler | 438/66 |
| 7,235,736 B1 | 6/2007 | Buller et al. | |
| 2002/0130311 A1 | 9/2002 | Lieber et al. | |
| 2002/0158578 A1 * | 10/2002 | Eliashevich et al. | 313/512 |
| 2002/0179138 A1 | 12/2002 | Lawheed | |
| 2002/0180909 A1 | 12/2002 | Lubart et al. | |
| 2003/0056820 A1 * | 3/2003 | MacDonald | 136/247 |
| 2003/0064292 A1 | 4/2003 | Neudecker et al. | |
| 2003/0121544 A1 * | 7/2003 | Hirata et al. | 136/256 |
| 2004/0035460 A1 | 2/2004 | Gonsiorawski | |
| 2004/0063320 A1 | 4/2004 | Hollars | |
| 2005/0040374 A1 * | 2/2005 | Chittibabu et al. | 252/501.1 |
| 2005/0098202 A1 | 5/2005 | Maltby, Jr. | |
| 2005/0236032 A1 | 10/2005 | Aoki | |
| 2006/0086384 A1 | 4/2006 | Nakata | |
| 2006/0107997 A1 | 5/2006 | Matsui et al. | |
| 2006/0185714 A1 | 8/2006 | Nam et al. | |
| 2006/0263606 A1 | 11/2006 | Aberle et al. | |
| 2006/0272699 A1 | 12/2006 | Lauvray et al. | |
| 2007/0079864 A1 | 4/2007 | Gronet | |
| 2007/0125420 A1 | 6/2007 | Ezure et al. | |
| 2007/0193622 A1 | 8/2007 | Sai | |
| 2007/0215195 A1 | 9/2007 | Buller et al. | |
| 2007/0215197 A1 | 9/2007 | Buller et al. | |
| 2008/0047599 A1 | 2/2008 | Buller et al. | |
| 2008/0272463 A1 * | 11/2008 | Butcher et al. | 257/615 |
| 2008/0302415 A1 | 12/2008 | Buller et al. | |
| 2009/0007963 A1 | 1/2009 | Buller et al. | |

FOREIGN PATENT DOCUMENTS

| | | |
|---|---|---|
| DE | 43 43 514 | 12/1993 |
| DE | 44 06 760 | 3/1994 |
| DE | 197 32 876 | 7/1997 |
| EP | 1150357 | 10/2001 |
| FR | 75 30980 | 10/1975 |
| JP | A-S58-151071 | 9/1983 |
| JP | A-S58-158976 | 9/1983 |
| JP | A-S59-47773 | 3/1984 |
| JP | S59-125670 | 7/1984 |
| JP | S59-143377 | 8/1984 |
| JP | S59-144177 | 8/1984 |
| JP | 60 187066 | 4/1985 |
| JP | A-H06-209057 | 7/1994 |
| JP | A-H07-120072 | 5/1995 |
| JP | A-H10-341030 | 12/1998 |
| JP | A-H11-103085 | 4/1999 |
| JP | A-2000-174299 | 6/2000 |
| JP | 2000-294821 | 10/2000 |
| JP | A-2001-007375 | 1/2001 |
| JP | A-2004-186547 | 7/2004 |
| JP | 2004-293118 | 10/2004 |
| JP | A-2005-99693 | 4/2005 |
| JP | A-2006-80396 | 3/2006 |
| WO | WO 84/04425 | 11/1984 |
| WO | WO 2004/001858 | 12/2003 |
| WO | WO 2005/034149 A2 | 4/2004 |
| WO | WO 2004/061417 A2 | 7/2004 |
| WO | WO 2005-029657 | 3/2005 |
| WO | WO 2007-002110 | 1/2007 |
| WO | WO 2008-060315 | 3/2007 |
| WO | WO 2008-112239 | 3/2008 |
| WO | WO 2008-137141 | 5/2008 |
| WO | WO 2009-042184 | 4/2009 |

OTHER PUBLICATIONS

Bube, 1998, "Photovoltaic Materials," Properties of Semiconductor Materials 1: 1-277.

Chaisitak et al., 2000, "Improvement in Performances of ZnO:B/i-ZnO/Cu(InGa)Se$_2$ Solar Cells by Surface Treatments for Cu(InGa)Se$_2$," The Japan Society of Applied Physics 39: 1660-1664.

Collares-Pereira et al., 1989, "Amorphous Silicon Photovoltaic Solar Cells—Inexpensive, High-Yield Optical Designs," ASME 111: 112-116.

Cuevas et al., 1982, "50 Per Cent More Output Power from an Albedo-collecting Flat Panel Using Bifacial Solar Cells," Solar Energy 29: 419-420.

Edmonds, 1990, "The Performance of Bifacial Solar Cells in Static Solar Concentrators," Solar Energy Materials 21: 173-190.

Garrison et al., 1983, "Two fixed, evacuate, glass, solar collectors using nonimaging concentration," International Conference on Nonimaging Concentrators, Aug. 25-26, 1983, San Diego, California.

Jensen et al., 2003, "Back Contact Cracking During Fabrication of CIGS Solar Cells on Polyimide Substrates," NREL/CD, 877-881.

Joliet et al., 1985, "Laser-induced Synthesis of Thin CuInSe$_2$ Films," Appl. Phys. Lett. 46: 266-267.

Khosrofian et al., 1983, "Measurement of a Gaussian Laser Beam Diameter Through the Direct Inversion of Knife-edge Data," Applied Optics 22: 3406-3410.

Lugue, 1984, "Static Concentrators: A Venture to Meet the Low Cost Target in Photovoltaics," Solar Cells 12: 141-145.

Lugue, 1984-1985, "Diffusing Reflectors for Bifacial Photovoltaic Panels," Solar Cells 13: 277-292.

Lugue et al., 2003, "Handbook of Photovoltaic Science and Engineering," Wiley, Chapter 1.

Malbranche et al., 2000-2001, "The Three Ways to Exploit Solar Energy," CLEFS CEA No. 44: 25-37.

Miñano 1984, "Design of Static Concentrators with the Receiver Immersed in a Dielectric Tube," 1$^{st}$ E.C. Conference on Solar Heating: 599-603.

Miñano et al., 1983, "Design of optimal and ideal 2-D concentrators wit hthe collector immersed in a dielectric tube," Applied Optics 22: 3960-3965.

O'Gallagher et al., 1982, "A new evacuated CPC collector tube," Solar Energy, vol. 29: 575-577.

Otoma et al., 1991, "Growth of CuGaS$_2$ by Alternating-source-feeding MOVPE," Journal of Crystal Growth 115: 807-810.

Pandy et al., 1996, "Handbook of Semiconductor Electrodeposition," Applied Physics: 1-285.

Romeo, 2002, "Growth and Characterization of High Efficiency CdTe/CDS Solar Cells," Dissertation submitted to the Swiss Federal Institute of Technology Zurich: 1-103.

Sang et al., 2001, "Performance Improvement of CIGS-based Modules by Depositing High-quality Ga-doped ZnO Windows with Magnetron Sputtering," Solar Energy Materials & Solar Cells 67: 237-245.

Simpson et al., 2004, "Manufacturing Process Advancements for Flexible CIGS PV on Stainless Foil," Major FY Publications.

(56) References Cited

OTHER PUBLICATIONS

Stolt et al., 1994, "CIS Solar Cells with ZnO Windows Deposited by ALE," IEEE, 250-253.

"Tangram Technology Ltd.—Polymer Data File—PMMA" website, http://www.tangram.co.uk/TI-Polymer-PMMA.html from Jan. 12, 2002. Available from www.archive.org. 7 pages.

Trupke, T. et al, "Improving solar cell efficiencies by down-conversion of high-energy photons" J. Appl. Phys. 92, 1668-1674, 2002.

Uematsu et al., 2001, "Design and Characterization of Flat-Plate Static-Concentrator Photovoltaic Modules," Solar Energy Materials & Solar Cells 67:441-448.

Uematsu et al., 2001, "Fabrication and Characterization of a Flat-Plate Static-Concentrator Photovoltaic Module," Solar Energy Materials & Solar Cells 67:425-434.

Winston et al., 1978, "Two-dimensional concentrators for inhomogeneous media," J. Opt. Society of America vol. 68: 289-291.

R. Antony et al., Realization of red light-emitting diodes with a confinement layer., Optical Materials. 12, 291-294. (1999).

Y.R. Park et al., Structural and optical properties of rutile and anatase $TiO_2$ thin films: Effects Co doping., Thin Solida Films. 484, 34-38 (2005).

C.A. Gueymard et al., Proposed Reference Irradiance Spectra for Solar Energy Systems Testing., Solar Energy. 73, 443-467. (2002).

Burgelman, M. et al., Modeling polycrystalline semiconductor solar cells., Thin Solid Films. 361-362, 527-532. (2000).

Fan, F-R. et al, Phthalocyanine Thin Films as Semiconductor Electrodes, J. Am. Chem. Soc., 101 (17) 4779-4787. (1979).

D. Gebeyehu et al., Hybrid solar cells based on dye-sensitized nanoporous $TiO_2$ electrodes and conjugated polymers as hole transport materials., Synth Met. 125, 279-287 (2002).

Liao, [112] Polar Suraces of Cu(In, Ga)Se2, Properties and Effects on Crystal Growth, Department of Materials Science and Engineering, University of Illinois, pp. 1-75, (2003).

Tsvigunov et al., Shock_wave Synthesis of High Density Modification of Zinc Oxide, Glass and Ceramics, vol. 68, Nos. 1-2, pp. 22-29, 2010.

Gloeckler et al., Gand-Gap Grading in Cu(In,Ga)Se2 Solar Cells, Journal of Physics and Chemistry of Solids, vol. 66, pp. 1891-1894, 2005.

Javaraman, Fabrication and Characterization of CIS/CdS and Cu2S/CdS Devices for Applications in Nano Structured Solar Cells, Published Thesis open for inspection, University of Kentucky Library, pp. 1-117, 2005.

Norako et al., Synthesis of Metastable Wurtzite CuInSe2 Nanocrystals, Chemistry of materials, vol. 22, pp. 1613-1615, 2010.

Wang et al., Effects of Substrate Temperature on the Structural and Electrical Properties of CIGS Films Based on the One-State Co-Evaporation Process, Semiconductor Science and Technology, vol. 25, pp. 1-6, 2010.

J.F. Guillemoles, The puzzle of Cu(In,Ga)Se2 (CIGS) solar cells stability, Thin Solid Films 403Å404 (2002) 405.

Young et al. 2002, A new thin-film $CuGaSc_2$/$Cu(In,Ga)Se_2$ Bifacial, Tandem Solar Cell with Both Junctions Formed Simultaneously, 29th IEEE PV Specialists Conference, New Orleans, Louisiana May 20-24.

Miyazaki et al., 2004, Efficiency Improvement of Cu(InGa) $Se_2$ Thin Film Solar Cells with a High Ga Composition Using Rapid Thermal Annealing, Japanese Journal of Applied Physics, 43, pp. 4244-42547.

Negami et al., 2000, CIGS Solar Cells Using a Novel Window $Zn_{j-1}$—$Mg_x$ Film, Photovoltaic Specialists Conference, Conference Record of the Twenty Eight IEEE, pp. 634-637.

Delahoy et al., 2004, New Technologies for CIGS Photovoltaics, Solar Energy, 77, pp. 785-793.

Rojahn et al., 2001, Photovoltaics on Wire, Mat. Res. Soc. Symp. Proc. 664, pp. A2.1.1-A2.1.6.

Scheidt et al., 2004, Optical second harmonic imaging of zinc oxide thin films grown by metal organic chemical vapour deposition (MOCVD), phys. Stat. sol.(c) 1,9, pp. 2243-2249.

\* cited by examiner

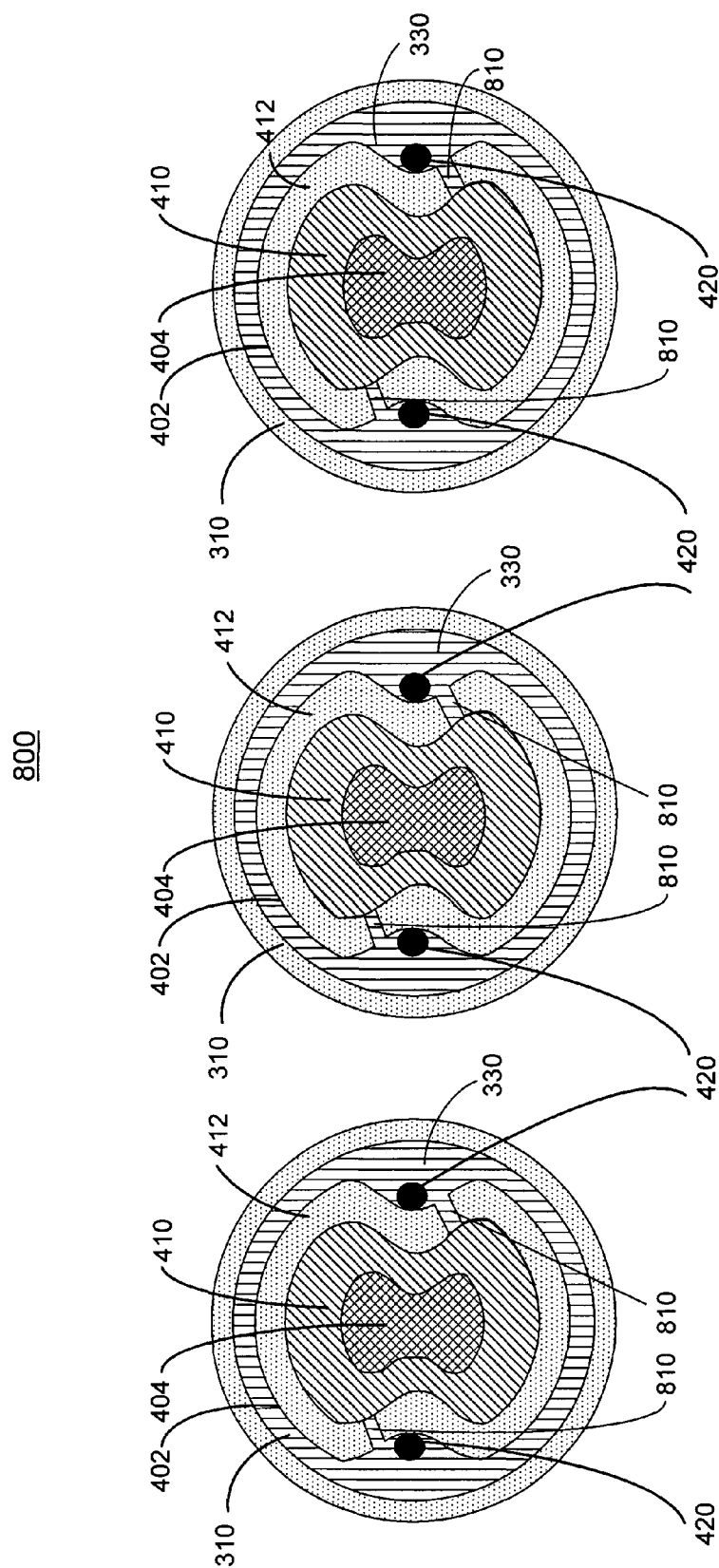

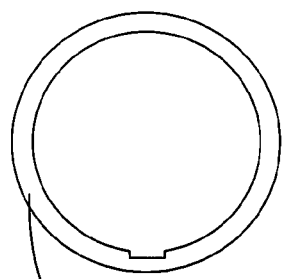
310 in Fig. 4
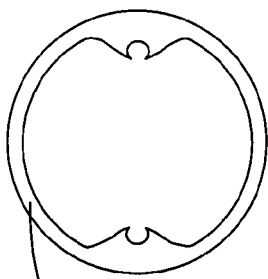
310 in Fig. 7
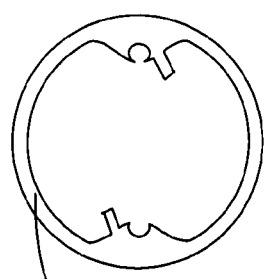
310 in Fig. 8
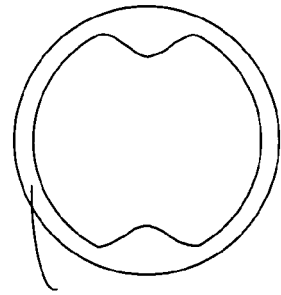
310 in Fig. 9
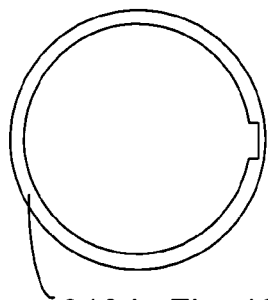
310 in Fig. 10
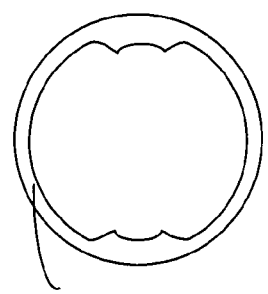
310 in Fig. 13
Fig. 14

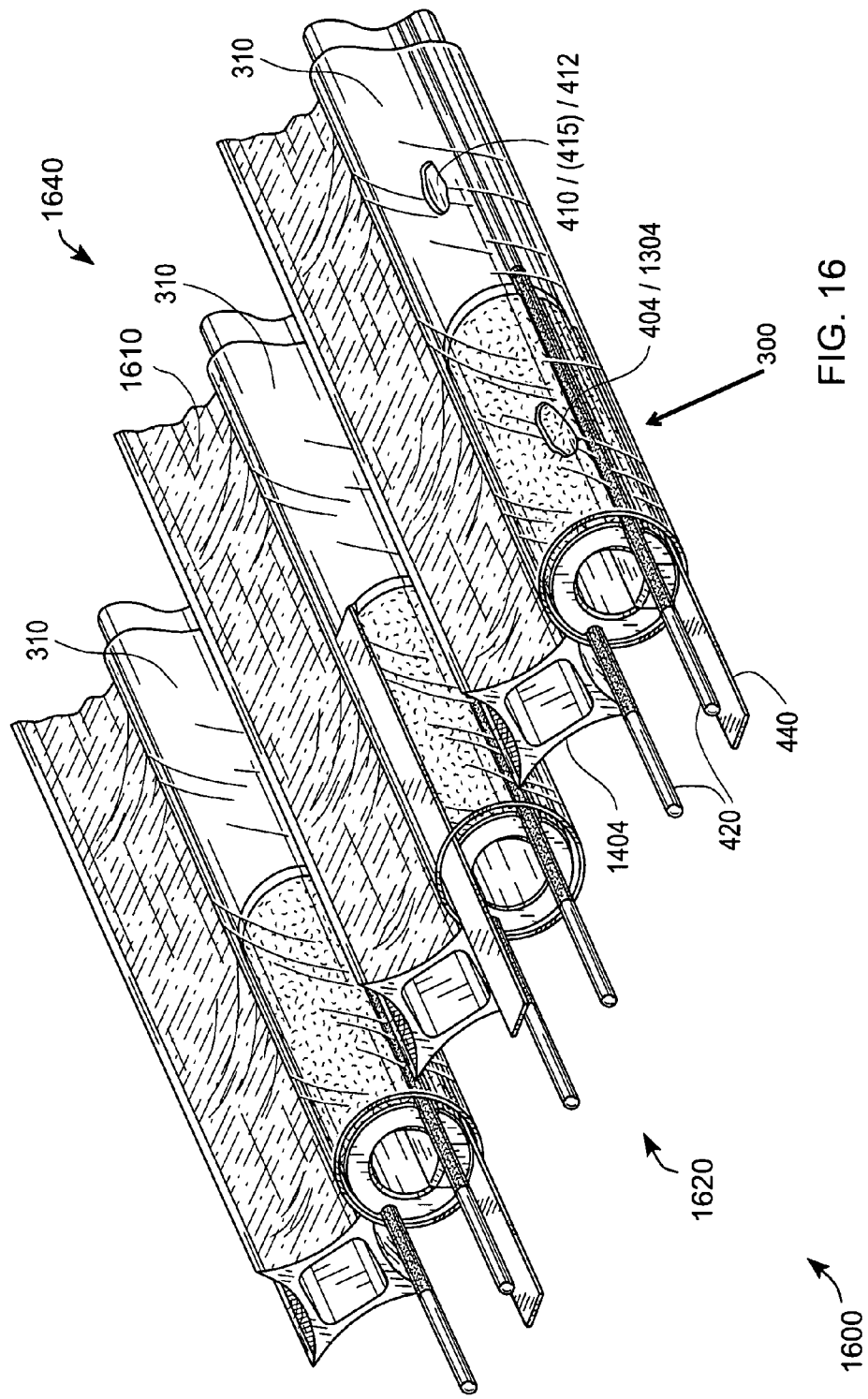

ELONGATED PHOTOVOLTAIC CELLS IN CASINGS WITH A FILLING LAYER

CROSS REFERENCE TO RELATED APPLICATION

This application is a continuation of U.S. patent application Ser. No. 11/378,847, entitled "Elongated Photovoltaic Cells in Tubular Casings," filed on Mar. 18, 2006.

1. FIELD OF THE INVENTION

This invention relates to solar cell assemblies for converting solar energy into electrical energy and more particularly to improved solar cell assemblies.

2. BACKGROUND OF THE INVENTION

Solar cells are typically fabricated as separate physical entities with light gathering surface areas on the order of 4-6 $cm^2$ or larger. For this reason, it is standard practice for power generating applications to mount the cells in a flat array on a supporting substrate or panel so that their light gathering surfaces provide an approximation of a single large light gathering surface. Also, since each cell itself generates only a small amount of power, the required voltage and/or current is realized by interconnecting the cells of the array in a series and/or parallel matrix.

A conventional prior art solar cell structure is shown in FIG. 1. Because of the large range in the thickness of the different layers, they are depicted schematically. Moreover, FIG. 1 is highly schematic so that it represents the features of both "thick-film" solar cells and "thin-film" solar cells. In general, solar cells that use an indirect band gap material to absorb light are typically configured as "thick-film" solar cells because a thick film of the absorber layer is required to absorb a sufficient amount of light. Solar cells that use a direct band gap material to absorb light are typically configured as "thin-film" solar cells because only a thin layer of the direct band-gap material is needed to absorb a sufficient amount of light.

The arrows at the top of FIG. 1 show the source of direct solar illumination on the cell. Layer 102 is the substrate. Glass or metal is a common substrate. In thin-film solar cells, substrate 102 can be a polymer-based backing, metal, or glass. In some instances, there is an encapsulation layer (not shown) coating substrate 102. Layer 104 is the back electrical contact for the solar cell.

Layer 106 is the semiconductor absorber layer. Back electrical contact 104 makes ohmic contact with absorber layer 106. In many but not all cases, absorber layer 106 is a p-type semiconductor. Absorber layer 106 is thick enough to absorb light. Layer 108 is the semiconductor junction partner-that, together with semiconductor absorber layer 106, completes the formation of a p-n junction. A p-n junction is a common type of junction found in solar cells. In p-n junction based solar cells, when semiconductor absorber layer 106 is a p-type doped material, junction partner 108 is an n-type doped material. Conversely, when semiconductor absorber layer 106 is an n-type doped material, junction partner 108 is a p-type doped material. Generally, junction partner 108 is much thinner than absorber layer 106. For example, in some instances junction partner 108 has a thickness of about 0.05 microns. Junction partner 108 is highly transparent to solar radiation. Junction partner 108 is also known as the window layer, since it lets the light pass down to absorber layer 106.

In a typical thick-film solar cell, absorber layer 106 and window layer 108 can be made from the same semiconductor material but have different carrier types (dopants) and/or carrier concentrations in order to give the two layers their distinct p-type and n-type properties. In thin-film solar cells in which copper-indium-gallium-diselenide (CIGS) is the absorber layer 106, the use of CdS to form junction partner 108 has resulted in high efficiency cells. Other materials that can be used for junction partner 108 include, but are not limited to, $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$ and doped ZnO.

Layer 110 is the counter electrode, which completes the functioning cell. Counter electrode 110 is used to draw current away from the junction since junction partner 108 is generally too resistive to serve this function. As such, counter electrode 110 should be highly conductive and transparent to light. Counter electrode 110 can in fact be a comb-like structure of metal printed onto layer 108 rather than forming a discrete layer. Counter electrode 110 is typically a transparent conductive oxide (TCO) such as doped zinc oxide (e.g., aluminum doped zinc oxide, gallium doped zinc oxide, boron doped zinc oxide), indium-tin-oxide (ITO), tin oxide ($SnO_2$), or indium-zinc oxide. However, even when a TCO layer is present, a bus bar network 114 is typically needed in conventional solar cells to draw off current since the TCO has too much resistance to efficiently perform this function in larger solar cells. Network 114 shortens the distance charge carriers must move in the TCO layer in order to reach the metal contact, thereby reducing resistive losses. The metal bus bars, also termed grid lines, can be made of any reasonably conductive metal such as, for example, silver, steel or aluminum. In the design of network 114, there is design a trade off between thicker grid lines that are more electrically conductive but block more light, and thin grid lines that are less electrically conductive but block less, light. The metal bars are preferably configured in a comb-like arrangement to permit light rays through TCO layer 110. Bus bar network layer 114 and TCO layer 110, combined, act as a single metallurgical unit, functionally interfacing with a first ohmic contact to form a current collection circuit. In U.S. Pat. No. 6,548,751 to Sverdrup et al., hereby incorporated by reference herein in its entirety, a combined silver bus bar network and indium-tin-oxide layer function as a single, transparent ITO/Ag layer.

Layer 112 is an antireflective coating that can allow a significant amount of extra light into the cell. Depending on the intended use of the cell, it might be deposited directly on the top conductor as illustrated in FIG. 1. Alternatively or additionally, antireflective coating 112 made be deposited on a separate cover glass that overlays top electrode 110. Ideally, the antireflective coating reduces the reflection of the cell to very near zero over the spectral region in which photoelectric absorption occurs, and at the same time increases the reflection in the other spectral regions to reduce heating. U.S. Pat. No. 6,107,564 to Aguilera et al., hereby incorporated by reference herein in its entirety, describes representative antireflective coatings that are known in the art.

Solar cells typically produce only a small voltage. For example, silicon based solar cells produce a voltage of about 0.6 volts (V). Thus, solar cells are interconnected in series or parallel in order to achieve greater voltages. When connected in series, voltages of individual cells add together while current remains the same. Thus, solar cells arranged in series reduce the amount of current flow through such cells, compared to analogous solar cells arrange in parallel, thereby improving efficiency. As illustrated in FIG. 1, the arrangement of solar cells in series is accomplished using interconnects 116. In general, an interconnect 116 places the first electrode of one solar cell in electrical communication with the counter-electrode of an adjoining solar cell.

As noted above and as illustrated in FIG. 1, conventional solar cells are typically in the form of a plate structure. Although such cells are highly efficient when they are smaller, larger planar solar cells have reduced efficiency because it is harder to make the semiconductor films that form the junction in such solar cells uniform. Furthermore, the occurrence of pinholes and similar flaws increase in larger planar solar cells. These features can cause shunts across the junction.

A number of problems are associated with solar cell designs present in the known art. A number of prior art solar cell designs and some of the disadvantages of each design will now be discussed.

As illustrated in FIG. 2A, U.S. Pat. No. 6,762,359 B2 to Asia et al. discloses a solar cell 210 including a p-type layer 12 and an n-type layer 14. A first electrode 32 is provided on one side of the solar cell. Electrode 32 is in electrical contact with n-type layer 14 of solar cell 210. Second electrode 60 is on the opposing side of the solar cell. Electrode 60 is in electrical contact with the p-type layer of the solar cell. Light-transmitting layers 200 and 202 form one side of device 210 while layer 62 forms the other side. Electrodes 32 and 60 are separated by insulators 40 and 50. In some instances, the solar cell has a tubular shape rather than the spherical shape illustrated in FIG. 2. While device 210 is functional, it is unsatisfactory. Electrode 60 has to pierce absorber 12 in order to make an electrical contact. This results in a net loss in absorber area, making the solar cell less efficient. Furthermore, such a junction is difficult to make relative to other solar cell designs.

As illustrated in FIG. 2B, U.S. Pat. No. 3,976,508 to Mlaysky discloses a tubular solar cell comprising a cylindrical silicon tube 2 of n-type conductivity that has been subjected to diffusion of boron into its outer surface to form an outer p-conductivity type region 4 and thus a p-n junction 6. The inner surface of the cylindrical tube is provided with a first electrode in the form of an adherent metal conductive film 8 that forms an ohmic contact with the tube. Film 8 covers the entire inner surface of the tube and consists of a selected metal or metal alloy having relatively high conductivity, e.g., gold, nickel, aluminum, copper or the like, as disclosed in U.S. Pat. Nos. 2,984,775, 3,046,324 and 3,005,862. The outer surface is provided with a second electrode in the form of a grid consisting of a plurality of circumferentially extending conductors 10 that are connected together by one or more longitudinally-extending conductors 12. The opposite ends of the outer surface of the hollow tube are provided with two circumferentially-extending terminal conductors 14 and 16 that intercept the longitudinally-extending conductors 12. The spacing of the circumferentially-extending conductors 10 and the longitudinally-extending conductors 12 is such as to leave areas 18 of the outer surface of the tube exposed to solar radiation. Conductors 12, 14 and 16 are made wider than the circumferentially-extending conductors 10 since they carry a greater current than any of the latter. These conductors are made of an adherent metal film like the inner electrode 8 and form ohmic contacts with the outer surface of the tube. While the solar cell disclosed in FIG. 2 is functional, it is also unsatisfactory. Conductors 12, 14, and 16 are not transparent to light and therefore the amount of light that the solar cell receives is reduced.

U.S. Pat. No. 3,990,914 to Weinstein and Lee discloses another form of tubular solar cell. Like Mlaysky, the Weinsten and Lee solar cell has a hollow core. However, unlike Mlaysky, Weinstein and Lee dispose the solar cell on a glass tubular support member. The Weinstein and Lee solar cell has the drawback of being bulky and expensive to build.

Referring to FIGS. 2C and 2D, Japanese Patent Application Kokai Publication Number S59-125670, Toppan Printing Company, published Jul. 20, 1984 (hereinafter "S59-125670") discloses a rod-shaped solar cell. The rod shaped solar cell is depicted in cross-section in FIG. 2C. A conducting metal is used as core 1 of the cell. A light-activated amorphous silicon semiconductor layer 3 is provided on core 1. An electrically conductive transparent conductive layer 4 is built up on top of semiconductor layer 3. The transparent conductive layer 4 can be made of materials such as indium oxide, tin oxide or indium tin oxide (ITO) and the like. As illustrated in FIG. 2C, a layer 5, made of a good electrical conductor, is provided on the lower portion of the solar cell. The publication states that this good conductive layer 5 is not particularly necessary but helps to lower the contact resistance between the rod and a conductive substrate 7 that serves as a counter-electrode. As such, conductive layer 5 serves as a current collector that supplements the conductivity of counter-electrode 7 illustrated in FIG. 2D.

As illustrated in FIG. 2D, rod-shaped solar cells 6 are multiply arranged in a row parallel with each other, and counter-electrode layer 7 is provided on the surface of the rods that is not irradiated by light so as to electrically make contact with each transparent conductive layer 4. The rod-shaped solar cells 6 are arranged in parallel and both ends of the solar cells are hardened with resin or a similar material in order to fix the rods in place.

S59-125670 addresses many of the drawbacks associated with planar solar cells. However, S59-125670 has a number of significant drawbacks that limit the efficiency of the disclosed devices. First, the manner in which current is drawn off the exterior surface is inefficient because layer 5 does not wrap all the way around the rod (e.g., see FIG. 2C). Second, substrate 7 is a metal plate that does not permit the passage of light. Thus, a full side of each rod is not exposed to light and can thus serve as a leakage path. Such a leakage path reduces the efficiency of the solar cell. For example, any such dark junction areas will result in a leakage that will detract from the photocurrent of the cell. Another disadvantage with the design disclosed in FIGS. 2C and 2D is that the rods are arranged in parallel rather than in series. Thus, the current levels in such devices will be large, relative to a corresponding serially arranged model, and therefore subject to resistive losses.

Referring to FIG. 2E, German Unexamined Patent Application DE 43 39 547 A1 to Twin Solar-Technik Entwicklungs-GmbH, published May 24, 1995, (hereinafter "Twin Solar") also discloses a plurality of rod-shaped solar cells 2 arranged in a parallel manner inside a transparent sheet 28, which forms the body of the solar cell. Thus, Twin Solar does not have some of the drawbacks found in S59-125670. Transparent sheet 28 allows light in from both faces 47A and 47B. Transparent sheet 28 is installed at a distance from a wall 27 in such a manner as to provide an air gap 26 through which liquid coolant can flow. Thus, Twin Solar devices have the drawback that they are not truly bifacial. In other words, only face 47A of the Twin Solar device is capable of receiving direct light. As defined here, "direct light" is light that has not passed through any media other than air. For example, light that has passed through a transparent substrate, into a solar cell assembly and exited the assembly, is no longer direct light once it exits the solar cell assembly. Light that has merely reflected off of a surface, however, is direct light provided that it has not passed through a solar cell assembly. Under this definition of direct light, face 47B is not configured to receive direct light. This is because all light received by face 47B must first traverse the body of the solar cell apparatus after entering the solar cell apparatus through face 47A. Such light must then traverse cooling chamber 26, reflect off back wall 42, and finally re-enter the solar cell through face 47B. The solar cell assembly is therefore inefficient because direct light cannot enter both sides of the assembly.

Although tubular designs of solar cells have addressed many of the drawbacks associated with planar solar cells, some problems remain unresolved. The capacity of solar cells to withstand physical shock is one unresolved problem. Conventional solar cell panels often crack after a certain number of years, often even before the gained energy benefit can balance their production costs. Solar cell assemblies are often built from small individual solar cell units. This approach provides efficiency and flexibility. Smaller solar cells are easier to manufacture at a large scale, and they can also be assembled into different sizes and shapes to suit the ultimate application. Inevitably, the smaller solar cell unit design also comes with the price of fragility. The smaller solar cell units easily break under pressure during transportation or routine handling processes. What are needed in the art are methods and systems that provide support and strength to solar cell units while maintaining the advantages of the small design.

Discussion or citation of a reference herein will not be construed as an admission that such reference is prior art to the present invention.

3. SUMMARY OF THE INVENTION

One aspect of the invention provides a solar cell unit comprising a cylindrical shaped solar cell and a transparent tubular casing. The cylindrical shaped solar cell comprises a back-electrode, a semiconductor junction layer circumferentially disposed on the back-electrode, and a transparent conductive layer disposed on the semiconductor junction. The transparent tubular casing is circumferentially sealed onto the cylindrically shaped solar cell so that there is no air between the transparent tubular casing and the cylindrically shaped solar cell in the solar cell unit. In some embodiments, the transparent tubular casing is made of plastic or glass. In some embodiments, the cylindrically shaped solar cell further comprises a cylindrical substrate and the back-electrode is circumferentially disposed on the cylindrical substrate. The cylindrical substrate can be made of a wide variety of materials including plastic, metal, or glass. Typically, the cylindrical substrate is hollowed (e.g., a tube). Therefore, fluids such as air, nitrogen, or helium can be passed through the cylindrical substrate in many embodiments of the present invention. In some embodiments, however, the cylindrical substrate is solid.

In some embodiments, the semiconductor junction comprises a homojunction, a heterojunction, a heteroface junction, a buried homojunction, a p-i-n junction, or a tandem junction. In some embodiments, the conductor junction comprises an absorber layer and a junction partner layer and the junction partner layer is, circumferentially disposed on the absorber layer. In some embodiments, the absorber layer is copper-indium-gallium-diselenide and the junction partner layer is $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO.

In some embodiments, the cylindrical shaped solar cell further comprises an intrinsic layer circumferentially disposed on the semiconductor junction. In such embodiments, the transparent conductive layer is disposed on the intrinsic layer rather than the semiconductor junction.

In some embodiments, the solar cell unit further comprises a filler layer circumferentially disposed on the transparent conductive layer. In such embodiments, the transparent tubular casing is circumferentially disposed on the filler layer thereby circumferentially sealing the tubular shaped solar cell.

In some embodiments, a water resistant layer is circumferentially disposed on the transparent conductive layer. In such embodiments, the transparent tubular casing is circumferentially disposed on the water resistant layer thereby circumferentially sealing the cylindrical shaped solar cell.

In some embodiments, a water resistant layer is circumferentially disposed on the transparent conductive layer and a filler layer circumferentially is disposed on the water resistant layer. In such embodiments the transparent tubular casing is circumferentially disposed on the filler layer thereby circumferentially sealing the cylindrical shaped solar cell.

In some embodiments, the solar cell unit further comprises a filler layer circumferentially disposed on the transparent conductive layer and a water resistant layer circumferentially disposed on the water resistant layer. In such embodiments, the transparent tubular casing is circumferentially disposed on the water resistant layer thereby circumferentially sealing the cylindrical shaped solar cell. In some embodiments, the solar cell unit further comprises an antireflective coating circumferentially disposed on the transparent tubular casing.

In some embodiments the cylindrically shaped solar cell further comprises at least one electrode strip, where each electrode strip in the at least one electrode strip is overlayed on the transparent conductive layer of the solar cell along the long cylindrical axis of the solar cell. In some embodiments, the at least one electrode strip comprises a plurality of electrode strips that are positioned at spaced intervals on the transparent conductive layer such that the plurality of electrode strips run parallel or approximately parallel to each other along the cylindrical axis of the solar cell. The plurality of electrode strips can be spaced out at, for example, sixty degree intervals on a surface of the transparent conductive layer of the solar cell. In fact, the electrode strips in the plurality of electrode strips can be spaced out at any type of even interval or uneven interval on the surface of the transparent conductive layer of the solar cell. In some embodiments, a length of the cylindrical shaped solar cell is between 0.3 meters and 2 meters. In some embodiments, an outer surface of the transparent tubular casing is textured.

Another aspect of the present invention provides a solar cell assembly comprising a plurality of solar cell units. Each solar cell unit in the plurality of solar cell units has the structure of any of the solar cell units described above. The solar cell units in the plurality of solar cell units are arranged in coplanar rows to form the solar cell assembly. In some embodiments, the solar assembly further comprises an albedo surface positioned to reflect sunlight into the plurality of solar cell units. In some embodiments, the albedo surface has an albedo that exceeds 95%. In some embodiments, the albedo surface is a Lambertian, diffuse, or involute reflector surface. In some embodiments, a first solar cell unit and a second solar cell unit in the plurality of solar cell units is electrically arranged in series or in parallel.

Still another aspect of the present invention comprises a solar cell assembly comprising a plurality of solar cell units and a plurality of internal reflectors. Each of the solar cell units in the plurality of solar cell units has the structure of any of the solar cell units described above. In this embodiment, the plurality of internal reflectors are arranged in coplanar rows in which internal reflectors in the plurality of solar cell units abut solar cell units in the plurality of solar cell units thereby forming the solar cell assembly. In some embodiments, an internal reflector in the plurality of internal reflectors has a hollow core. In some embodiments, an internal reflector in the plurality of internal reflectors comprises a plastic casing with a layer of reflective material deposited on the plastic casing. In some embodiments, an internal reflector in the plurality of internal reflectors is a single piece made out of a reflective material. In some embodiments, a cross-sectional shape of an internal reflector in the plurality of internal reflectors is astroid. In some embodiments, a cross-sectional shape of an internal reflector in the plurality of internal reflectors is four-sided and a side of the four-sided cross-sectional shape is linear, parabolic, concave, circular or elliptical. In some embodiments, a cross-sectional shape of an internal reflector in the plurality of internal reflectors is four-sided and a side of the four-sided cross-sectional shape defines a diffuse surface on the internal reflector.

Still another aspect of the invention provides a solar cell unit comprising a cylindrical shaped solar cell, a filler layer, and a transparent tubular casing. In some embodiments the cylindrical shaped solar cell comprises a cylindrical substrate, a back-electrode circumferentially disposed on the cylindrical substrate, a semiconductor junction circumferentially disposed on the back-electrode, and a transparent conductive layer disposed on the semiconductor junction. The cylindrical substrate can be a hollowed cylinder (e.g., tube) or a solid cylinder. The filler layer is circumferentially disposed on the transparent conductive layer and the transparent tubular casing is circumferentially disposed onto the filler layer. In some embodiments in accordance with this aspect of the invention, the semiconductor junction comprises an absorber layer and a junction partner layer and the junction partner layer is circumferentially disposed on the absorber layer while the absorber layer is circumferentially disposed on the back-electrode. In some embodiments in accordance with this aspect of the invention, the solar cell unit further comprises an antireflective coating circumferentially disposed on the transparent tubular casing.

Yet another aspect of the invention comprises a solar cell unit comprising a cylindrical shaped solar cell, a water resistant layer, a filler layer, and a transparent tubular casing. The cylindrical shaped solar cell comprises a cylindrical substrate, a back-electrode circumferentially disposed on the cylindrical substrate, a semiconductor junction circumferentially disposed on the back-electrode, and a transparent conductive layer disposed on the semiconductor junction. The cylindrical substrate can be a solid cylinder or a hollowed cylinder (e.g., a tube). The water resistant layer is circumferentially disposed on the transparent conductive layer. The filler layer circumferentially disposed on the water resistant layer. The transparent tubular casing is circumferentially disposed onto the filler layer.

Still another aspect of the invention provides a solar cell unit comprising a cylindrical shaped solar cell, a filler layer, a water resistant layer, and a transparent tubular casing. The cylindrical shaped solar cell comprises a cylindrical substrate, a back-electrode circumferentially disposed on the cylindrical substrate, a semiconductor junction circumferentially disposed on the back-electrode, and a transparent conductive layer disposed on the semiconductor junction. The cylindrical substrate can be solid or hollowed (e.g., a tube). The filler layer is circumferentially disposed on the transparent conductive layer. The water resistant layer is circumferentially disposed on the filler layer. The transparent tubular casing is circumferentially disposed onto the water resistant layer.

4. BRIEF DESCRIPTION OF THE DRAWINGS

FIG. 8 is a cross-sectional view of elongated solar cells electrically arranged in series in an assembly where counter-electrodes abut individual solar cells and the outer TCO is cut, in accordance with another embodiment of the present invention.

FIG. 14 illustrate molded tubular casing in accordance with some embodiments of the present invention.

FIG. 16 illustrates a perspective view of a solar cell architecture in accordance with an embodiment of the present invention.

Like reference numerals refer to corresponding parts throughout the several views of the drawings. Dimensions are not drawn to scale.

5. DETAILED DESCRIPTION

Disclosed herein are solar cell assemblies for converting solar energy into electrical energy and more particularly to improved solar cells and solar cell arrays. The solar cells of the present invention have an elongated cylindrical shape.

5.1 Basic Structure

Figure 3A:
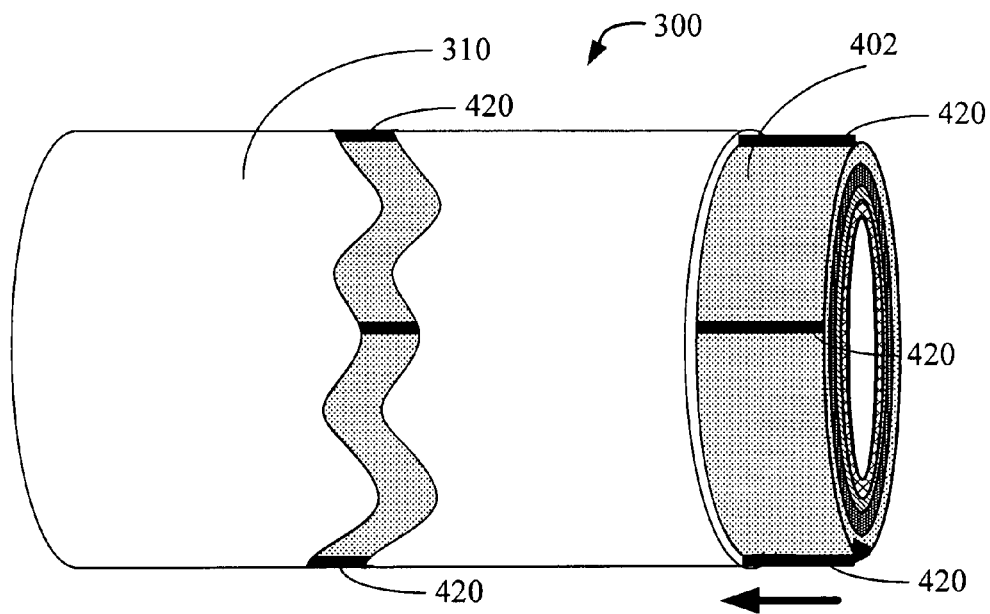
FIG. 3A illustrates a photovoltaic element with tubular casing, in accordance with an embodiment of the present invention.
Figure 3B:
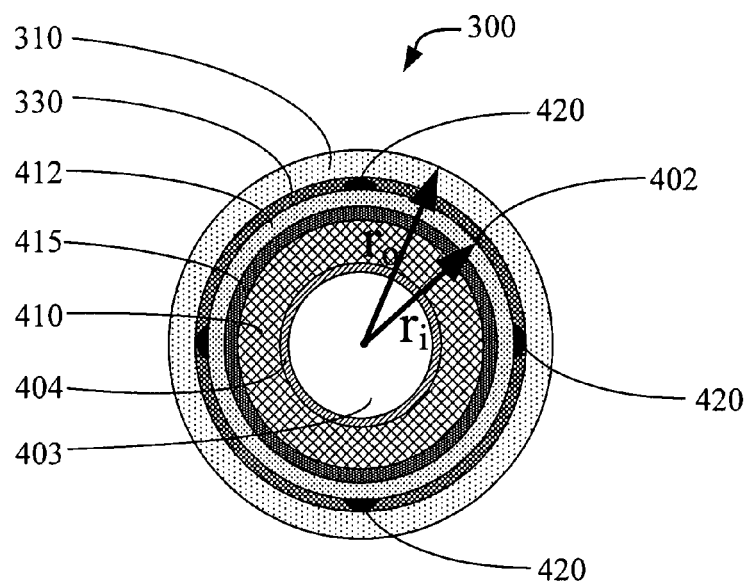
FIG. 3B illustrates a cross-sectional view of an elongated solar cell in a transparent tubular casing, in accordance with an embodiment of the present invention.

The present invention provides individually circumferentially covered cylindrical solar cell units 300 that are illustrated in perspective view in FIG. 3A and cross-sectional view in FIG. 3B. In a solar cell unit 300, an elongated cylindrical solar cell 402 (FIG. 3C) is circumferentially covered by a transparent tubular casing 310 (FIG. 3D). In some embodiments, solar cell unit 300 comprises a solar cell 402 coated with a transparent tubular casing 310. In some embodiments, only one end of elongated solar cell 402 is exposed by transparent tubular casing 310 in order to form an electrical connection with adjacent solar cells 402 or other circuitry. In some embodiments, both ends of elongated solar cell 402 are exposed by transparent tubular casing 310 in order to form an electrical connection with adjacent solar cells 402 or other circuitry. As used herein, the term cylindrical means objects having a cylindrical or approximately cylindrical shape. In fact, cylindrical objects can have irregular shapes so long as the object, taken as a whole, is roughly cylindrical. Such cylindrical shapes can be solid (e.g., a rod) or hollowed (e.g., a tube). As used herein, the term tubular means objects having a tubular or approximately tubular shape. In fact, tubular objects can have irregular shapes so long as the object, taken as a whole, is roughly tubular.

Although most discussions in the present application pertaining to solar cell units 300 are in the context of either the encapsulated embodiments or circumferentially covered embodiments, it is to be appreciated that such discussions serve as no limitation to the scope of the present invention. Any transparent tubular casing that provides support and protection to elongated solar cells and permits electrical connections between the elongated solar cells are within the scope of the systems and methods of the present invention.

Descriptions of exemplary solar cells 402 are provided in this section as well as Sections 5.2 through 5.8. For instance, examples of semiconductor junctions that can be used in solar cells 402 are discussed in Section 5.2. Exemplary systems and methods for manufacturing transparent tubular casing 310 are described in Section 5.1.2. Systems and methods for coating solar cells 402 with transparent tubular casing 310 in order to form solar cell units 300 are found in Section 5.1.3. Solar cell units 300 can be assembled into solar cell assemblies of various sizes and shapes to generate electricity and potentially heat water or other fluids.

FIG. 3B illustrates the cross-sectional view of an exemplary embodiment of solar cell unit 300. Other exemplary embodiments of solar cells (e.g., 402 in FIG. 4A) are also suitable for coating by transparent tubular casing 310.

Substrate 403.

Substrate 403 serves as a substrate for solar cell 402. In some embodiments, substrate 403 is made of a plastic, metal, metal alloy, or glass. Substrate 403 is cylindrical shaped. In some embodiments, substrate 403 has a hollow core, as illustrated in FIG. 3B. In some embodiments, substrate 403 has a solid core. In some embodiments, the shape of substrate 403 is only approximately that of a cylindrical object, meaning that a cross-section taken at a right angle to the long axis of substrate 403 defines an ellipse rather than a circle. As the term is used herein, such approximately shaped objects are still considered cylindrically shaped in the present invention. In some embodiments, substrate 403 is made of a urethane polymer, an acrylic polymer, a fluoropolymer, polybenzamidazole, polyimide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene. In some embodiments, substrate 403 is made of aluminosilicate glass, borosilicate glass (e.g., Pyrex, Duran, Simax, etc.), dichroic glass, germanium/semiconductor glass, glass ceramic, silicate/fused silica glass, soda lime glass, quartz glass, chalcogenide/sulphide glass, fluoride glass, pyrex glass, a glass-based phenolic, cereated glass, or flint glass. In some embodiments, substrate 403 is a solid cylindrical shape. Such solid cylindrical substrates 403 can be made out of a plastic, glass, metal, or metal alloy.

Back-Electrode 404.

A back-electrode 404 is circumferentially disposed on substrate 403. Back-electrode 404 serves as the first electrode in the assembly. In general, back-electrode 404 is made out of any material such that it can support the photovoltaic current generated by solar cell unit 300 with negligible resistive losses. In some embodiments, back-electrode 404 is composed of any conductive material, such as aluminum, molybdenum, tungsten, vanadium, rhodium, niobium, chromium, tantalum, titanium, steel, nickel, platinum, silver, gold, an alloy thereof, or any combination thereof. In some embodiments, back-electrode 404 is composed of any conductive material, such as indium tin oxide, titanium nitride, tin oxide, fluorine doped tin oxide, doped zinc oxide, aluminum doped zinc oxide, gallium doped zinc oxide, boron doped zinc oxide indium-zinc oxide, a metal-carbon black-filled oxide, a graphite-carbon black-filled oxide, carbon-black-filled oxide, a superconductive carbon black-filled oxide, an epoxy, a conductive glass, or a conductive plastic. As defined herein, a conductive plastic is one that, through compounding techniques, contains conductive fillers which, in turn, impart their conductive properties to the plastic. In some embodiments, the conductive plastics used in the present invention to form back-electrode 404 contain fillers that form sufficient conductive current-carrying paths through the plastic matrix to support the photovoltaic current generated by solar cell unit 300 with negligible resistive losses. The plastic matrix of the conductive plastic is typically insulating, but the composite produced exhibits the conductive properties of the filler.

Semiconductor Junction 410.

A semiconductor junction 410 is formed around back-electrode 404. Semiconductor junction 410 is any photovoltaic homojunction, heterojunction, heteroface junction, buried homojunction, p-i-n junction or tandem junction having an absorber layer that is a direct band-gap absorber (e.g., crystalline silicon) or an indirect band-gap absorber (e.g., amorphous silicon). Such junctions are described in Chapter 1 of Bube, *Photovoltaic Materials,* 1998, Imperial College Press, London, as well as Lugue and Hegedus, 2003, *Handbook of Photovoltaic Science and Engineering,* John Wiley & Sons, Ltd., West Sussex, England, each of which is hereby incorporated by reference herein in its entirety. Details of exemplary types of semiconductors junctions 410 in accordance with the present invention are disclosed in Section 5.2, below. In addition to the exemplary junctions disclosed in Section 5.2, below, junctions 410 can be multijunctions in which light traverses into the core of junction 410 through multiple junctions that, preferably, have successfully smaller band gaps. In some embodiments, semiconductor junction 410 include a copper-indium-gallium-diselenide (CIGS) absorber layer.

Optional Intrinsic Layer 415.

Optionally, there is a thin intrinsic layer (i-layer) 415 circumferentially coating semiconductor junction 410. The i-layer 415 can be formed using any undoped transparent oxide including, but not limited to, zinc oxide, metal oxide, or any transparent material that is highly insulating. In some embodiments, i-layer 415 is highly pure zinc oxide.

Transparent Conductive Layer 412.

Transparent conductive layer 412 is circumferentially disposed on the semiconductor junction layers 410 thereby completing the circuit. As noted above, in some embodiments, a thin i-layer 415 is circumferentially disposed on semiconductor junction 410. In such embodiments, transparent conductive layer 412 is circumferentially disposed on i-layer 415. In some embodiments, transparent conductive layer 412 is made of tin oxide $SnO_x$ (with or without fluorine doping), indium-tin oxide (ITO), doped zinc oxide (e.g., aluminum doped zinc oxide, gallium doped zinc oxide, boron dope zinc oxide), indium-zinc oxide or any combination thereof. In some embodiments, transparent conductive layer 412 is either p-doped or n-doped. In some embodiments, transparent conductive layer is made of carbon nanotubes. Carbon nanotubes are commercially available, for example from Eikos (Franklin, Mass.) and are described in U.S. Pat. No. 6,988,925, which is hereby incorporated by reference herein in its entirety. For example, in embodiments where the outer semiconductor layer of junction 410 is p-doped, transparent conductive layer 412 can be p-doped. Likewise, in embodiments where the outer semiconductor layer of junction 410 is n-doped, transparent conductive layer 412 can be n-doped. In general, transparent conductive layer 412 is preferably made of a material that has very low resistance, suitable optical transmission properties (e.g., greater than 90%), and a deposition temperature that will not damage underlying layers of semiconductor junction 410 and/or optional i-layer 415. In some embodiments, transparent conductive layer 412 is an electrically conductive polymer material such as a conductive polytiophene, a conductive polyaniline, a conductive polypyrrole, a PSS-doped PEDOT (e.g., Bayrton), or a derivative of any of the foregoing. In some embodiments, transparent conductive layer 412 comprises more than one layer, including a first layer comprising tin oxide $SnO_x$ (with or without fluorine doping), indium-tin oxide (ITO), indium-zinc oxide, doped zinc oxide (e.g., aluminum doped zinc oxide, gallium doped zinc oxide, boron doped zinc oxide) or a combination thereof and a second layer comprising a conductive polytiophene, a conductive polyaniline, a conductive polypyrrole, a PSS-doped PEDOT (e.g., Bayrton), or a derivative of any of the foregoing. Additional suitable materials that can be used to form transparent conductive layer are disclosed in United States Patent publication 2004/0187917A1 to Pichler, which is hereby incorporated by reference herein in its entirety.

Optional Electrode Strips 420.

Figure 4A:
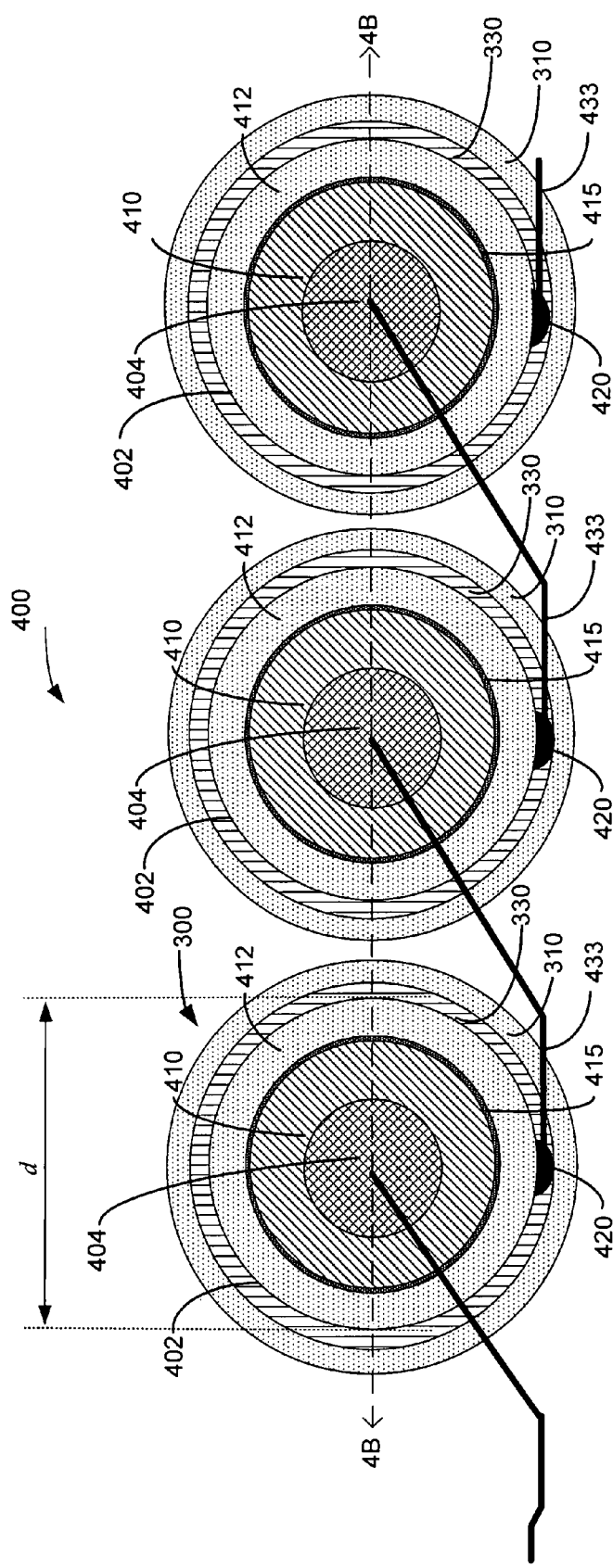
FIG. 4A is a cross-sectional view of elongated solar cells in tubular casing that are electrically arranged in series and geometrically arranged in a parallel or near parallel manner, in accordance with an embodiment of the present invention.

In some embodiments in accordance with the present invention, counter-electrode strips or leads 420 are disposed on transparent conductive layer 412 in order to facilitate electrical current flow. In some embodiments, electrode strips 420 are thin strips of electrically conducting material that run lengthwise along the long axis (cylindrical axis) of the cylindrically shaped solar cell, as depicted in FIG. 4A. In some embodiments, optional electrode strips are positioned at spaced intervals on the surface of transparent conductive layer 412. For instance, FIG. 3B, electrode strips 420 run parallel to each other and are spaced out at ninety degree intervals along the cylindrical axis of the solar cell. In some embodiments, electrode strips 420 are spaced out at five degree, ten degree, fifteen degree, twenty degree, thirty degree, forty degree, fifty degree, sixty degree, ninety degree or 180 degree intervals on the surface of transparent conductive layer 412. In some embodiments, there is a single electrode strip 420 on the surface of transparent conductive layer 412. In some embodiments, there is no electrode strip 420 on the surface of transparent conductive layer 412. In some embodiments, there is two, three, four, five, six, seven, eight, nine, ten, eleven, twelve, fifteen or more, or thirty or more electrode strips on transparent conductive layer 412, all running parallel, or near parallel, to each down the long (cylindrical) axis of the solar cell. In some embodiments electrode strips 420 are evenly spaced about the circumference of transparent conductive layer 412, for example, as depicted in FIG. 3B. In alternative embodiments, electrode strips 420 are not evenly spaced about the circumference of transparent conductive layer 412. In some embodiments, electrode strips 420 are only on one face of the solar cell. Elements 403, 404, 410, 415 (optional), and 412 of FIG. 3B collectively comprise solar cell 402 of FIG. 3A. In some embodiments, electrode strips 420 are made of conductive epoxy, conductive ink, copper or an alloy thereof, aluminum or an alloy thereof, nickel or an alloy thereof, silver or an alloy thereof, gold or an alloy thereof, a conductive glue, or a conductive plastic.

In some embodiments, there are electrode strips that run along the long (cylindrical) axis of the solar cell and these electrode strips are interconnected to each other by grid lines. These grid lines can be thicker than, thinner than, or the same width as the electrode strips. These grid lines can be made of the same or different electrically material as the electrode strips.

In some embodiments, electrode strips 420 are deposited on transparent conductive layer 412 using ink jet printing. Examples of conductive ink that can be used for such strips include, but are not limited to silver loaded or nickel loaded conductive ink. In some embodiments epoxies as well as anisotropic conductive adhesives can be used to construct electrode strips 420. In typical embodiments, such inks or epoxies are thermally cured in order to form electrode strips 420.

Optional Filler Layer 330.

The addition of counter-electrode strips or leads 420 often renders the shape of the circular solar cells irregular. Care is taken to exclude air from the solar cell unit to avoid oxidation. Accordingly, in some embodiments of the present invention, as depicted in FIG. 3B, a filler layer 330 of sealant such as ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, and/or a urethane is coated over transparent conductive layer 412 to seal out air and, optionally, to provide complementary fitting to a transparent tubular casing 310. In some embodiments, filler layer 330 is a Q-type silicone, a silsequioxane, a D-type silicon, or an M-type silicon. However, in some embodiments, optional filler layer 330 is not needed even when one or more electrode strips 420 are present. Additional suitable materials for optional filler layer 330 are disclosed in Section 5.1.4, below.

Transparent Tubular Casing 310.

Transparent tubular casing 310 is circumferentially disposed on transparent conductive layer 412 and/or optional filler layer 330. In some embodiments tubular casing 310 is made of plastic or glass. In some embodiments, elongated solar cells 402, after being properly modified for future packaging as described below, are sealed in the transparent tubular casing 310. As shown in FIG. 4A, transparent tubular casing 310 fits over the outermost layer of elongated solar cell 402. In some embodiments, elongated solar cell 402 is inside transparent tubular casing 310 such that adjacent elongated solar cells 402 do not form electric contact with each other except at the ends of the solar cells. Methods, such as heat shrinking, injection molding, or vacuum loading, can be used to construct transparent tubular casing 310 such they exclude oxygen and water from the system as well as to provide complementary fitting to the underlying solar cell 402. In some embodiments, transparent tubular casing 310, for example as depicted in FIG. 14, can be used to cover elongated solar cells 402.

In some embodiments, transparent tubular casing 310 is made of a urethane polymer, an acrylic polymer, polymethylmethacrylate (PMMA), a fluoropolymer, silicone, polydimethyl siloxane (PDMS), silicone gel, epoxy, ethylene vinyl acetate (EVA), perfluoroalkoxy fluorocarbon (PFA), nylon/polyamide, cross-linked polyethylene (PEX), polyolefin, polypropylene (PP), polyethylene terephtalate glycol (PETG), polytetrafluoroethylene (PTFE), thermoplastic copolymer (for example, ETFE®, which is a derived from the polymerization of ethylene and tetrafluoroethylene: TEFLON® monomers), polyurethane/urethane, polyvinyl chloride (PVC), polyvinylidene fluoride (PVDF), Tygon®, vinyl, Viton®, or any combination or variation thereof. Additional suitable materials for optional filler layer 330 are disclosed in Section 5.1.4, below.

In some embodiments, transparent tubular casing 310 comprises a plurality of transparent tubular casing layers. In some embodiments, each transparent tubular casing is composed of a different material. For example, in some embodiments, transparent tubular casing 310 comprises a first transparent tubular casing layer and a second transparent tubular casing layer. Depending on the exact configuration of the solar cell, the first transparent tubular casing layer is disposed on the transparent conductive layer 412, optional filler layer 330 or the water resistant layer. The second transparent tubular casing layer is disposed on the first transparent tubular casing layer.

In some embodiments, each transparent tubular casing layer has different properties. In one example, the outer transparent tubular casing layer has excellent UV shielding properties whereas the inner transparent tubular casing layer has good water proofing characteristics. Moreover, the use of multiple transparent tubular casing layers can be used to reduce costs and/or improve the overall properties of transparent tubular casing 310. For example, one transparent tubular casing layer may be made of an expensive material that has a desired physical property. By using one or more additional transparent tubular casing layers, the thickness of the expensive transparent tubular casing layer may be reduced, thereby achieving a savings in material costs. In another example, one transparent tubular casing layer may have excellent optical properties (e.g., index of refraction, etc.) but be very heavy. By using one or more additional transparent tubular casing layers, the thickness of the heavy transparent tubular casing layer may be reduced, thereby reducing the overall weight of transparent tubular casing 310.

Optional Water Resistant Layer.

In some embodiments, one or more layers of water resistant layer are coated over solar cell 402 to prevent the damaging effects of water molecules. In some embodiments, this water resistant layer is circumferentially coated onto transparent conductive layer 412 prior to depositing optional filler layer 330 and encasing the solar cell 402 in transparent tubular casing 310. In some embodiments, such water resistant layers are circumferentially coated onto optional filler layer 330 prior to encasing the solar cell 402 in transparent tubular casing 310. In some embodiments, such water resistant layers are circumferentially coated onto transparent tubular casing 310 itself. In embodiments where a water resistant layer is provided to seal molecular water from solar cell 402, it is important that the optical properties of the water resistant layer not interfere with the absorption of incident solar radiation by solar cell 402. In some embodiments, this water resistant layer is made of clear silicone, SiN, $SiO_xN_y$, $SiO_x$, or $Al_2O_3$, where x and y are integers. In some embodiments, water resistant layer is made of a Q-type silicone, a silsequioxane, a D-type silicon, or an M-type silicon.

Optional Antireflective Coating.

In some embodiments, an optional antireflective coating is also circumferentially disposed on transparent tubular casing 310 to maximize solar cell efficiency. In some embodiments, there is a both a water resistant layer and an antireflective coating deposited on transparent tubular casing 310. In some embodiments, a single layer serves the dual purpose of a water resistant layer and an anti-reflective coating. In some embodiments, antireflective coating, made of $MgF_2$, silicon nitrate, titanium nitrate, silicon monoxide (SiO), or silicon oxide nitrite. In some embodiments, there is more than one layer of antireflective coating. In some embodiments, there is more than one layer of antireflective coating and each layer is made of the same material. In some embodiments, there is more than one layer of antireflective coating and each layer is made of a different material.

In some embodiments, some of the layers of multi-layered solar cells 402 are constructed using cylindrical magnetron sputtering techniques. In some embodiments, some of the layers of multi-layered solar cells 402 are constructed using conventional sputtering methods or reactive sputtering methods on long tubes or strips. Sputtering coating methods for long tubes and strips are disclosed in for example, Hoshi et al., 1983, "Thin Film Coating Techniques on Wires and Inner Walls of Small Tubes via Cylindrical Magnetron Sputtering," *Electrical Engineering in Japan* 103:73-80; Lincoln and Blickensderfer, 1980, "Adapting Conventional Sputtering Equipment for Coating Long Tubes and Strips," *J. Vac. Sci. Technol.* 17:1252-1253; Harding, 1977, "Improvements in a dc Reactive Sputtering System for Coating Tubes," *J. Vac. Sci. Technol.* 14:1313-1315; Pearce, 1970, "A Thick Film Vacuum Deposition System for Microwave Tube Component Coating," *Conference Records of 1970 Conference on Electron Device Techniques* 208-211; and Harding et al., 1979, "Production of Properties of Selective Surfaces Coated onto Glass Tubes by a Magnetron Sputtering System," *Proceedings of the International Solar Energy Society* 1912-1916, each of which is hereby incorporated by reference herein in its entirety.

Optional Fluorescent Material.

In some embodiments, a fluorescent material (e.g., luminescent material, phosphorescent material) is coated on a surface of a layer of solar cell 300. In some embodiments, the fluorescent material is coated on the luminal surface and/or the exterior surface of transparent tubular casing 310. In some embodiments, the fluorescent material is coated on the outside surface of transparent conductive oxide 412. In some embodiments, solar cell 300 includes an optional filler layer 300 and the fluorescent material is coated on the optional filler layer. In some embodiments, solar cell 300 includes a water resistant layer and the fluorescent material is coated on the water resistant layer. In some embodiments, more than one surface of a solar cell 300 is coated with optional fluorescent material. In some embodiments, the fluorescent material absorbs blue and/or ultraviolet light, which some semiconductor junctions 410 of the present invention do not use to convert to electricity, and the fluorescent material emits light in visible and/or infrared light which is useful for electrical generation in some solar cells 300 of the present invention.

Fluorescent, luminescent, or phosphorescent materials can absorb light in the blue or UV range and emit visible light. Phosphorescent materials, or phosphors, usually comprise a suitable host material and an activator material. The host materials are typically oxides, sulfides, selenides, halides or silicates of zinc, cadmium, manganese, aluminum, silicon, or various rare earth metals. The activators are added to prolong the emission time.

In some embodiments, phosphorescent materials are incorporated in the systems and methods of the present invention to enhance light absorption by solar cell 300. In some embodiments, the phosphorescent material is directly added to the material used to make optional transparent tubular casing 310. In some embodiments, the phosphorescent materials are mixed with a binder for use as transparent paints to coat various outer or inner layers of solar cell 300, as described above.

Exemplary phosphors include, but are not limited to, copper-activated zinc sulfide (ZnS:Cu) and silver-activated zinc sulfide (ZnS:Ag). Other exemplary phosphorescent materials include, but are not limited to, zinc sulfide and cadmium sulfide (ZnS:CdS), strontium aluminate activated by europium ($SrAlO_3$:Eu), strontium titanium activated by praseodymium and aluminum (SrTiO3:Pr, Al), calcium sulfide with strontium sulfide with bismuth ((Ca,Sr)S:Bi), copper and magnesium activated zinc sulfide (ZnS:Cu,Mg), or any combination thereof.

Methods for creating phosphor materials are known in the art. For example, methods of making ZnS:Cu or other related phosphorescent materials are described in U.S. Pat. No. 2,807,587 to Butler et al.; U.S. Pat. No. 3,031,415 to Morrison et al.; U.S. Pat. No. 3,031,416 to Morrison et al.; U.S. Pat. No. 3,152,995 to Strock; U.S. Pat. No. 3,154,712 to Payne; U.S. Pat. No. 3,222,214 to Lagos et al.; U.S. Pat. No. 3,657,142 to Poss; U.S. Pat. No. 4,859,361 to Reilly et al., and U.S. Pat. No. 5,269,966 to Karam et al., each of which is hereby incorporated by reference herein in its entirety. Methods for making ZnS:Ag or related phosphorescent materials are described in U.S. Pat. No. 6,200,497 to Park et al., U.S. Pat. No. 6,025,675 to Ihara et al.; U.S. Pat. No. 4,804,882 to Takahara et al., and U.S. Pat. No. 4,512,912 to Matsuda et al., each of which is hereby incorporated herein by reference in its entirety. Generally, the persistence of the phosphor increases as the wavelength decreases. In some embodiments, quantum dots of CdSe or similar phosphorescent material can be used to get the same effects. See Dabbousi et al., 1995, "Electroluminescence from CdSe quantum-dot/polymer composites," Applied Physics Letters 66 (11): 1316-1318; Dabbousi et al., 1997 "(CdSe)ZnS Core-Shell Quantum Dots: Synthesis and Characterization of a Size Series of Highly Luminescent Nanocrystallites," J. Phys. Chem. B, 101: 9463-9475; Ebenstein et al., 2002, "Fluorescence quantum yield of CdSe:ZnS nanocrystals investigated by correlated atomic-force and single-particle fluorescence microscopy," Applied Physics Letters 80: 4033-4035; and Peng et al., 2000, "Shape control of CdSe nanocrystals," Nature 404: 59-61; each of which is hereby incorporated by reference herein in its entirety.

In some embodiments, optical brighteners are used in the optional fluorescent layers of the present invention. Optical brighteners (also known as optical brightening agents, fluorescent brightening agents or fluorescent whitening agents) are dyes that absorb light in the ultraviolet and violet region of the electromagnetic spectrum, and re-emit light in the blue region. Such compounds include stilbenes (e.g., trans-1,2-diphenylethylene or (E)-1,2-diphenylethene). Another exemplary optical brightener that can be used in the optional fluorescent layers of the present invention is umbelliferone (7-hydroxycoumarin), which also absorbs energy in the UV portion of the spectrum. This energy is then re-emitted in the blue portion of the visible spectrum. More information on optical brighteners is in Dean, 1963, *Naturally Occurring Oxygen Ring Compounds*, Butterworths, London; Joule and Mills, 2000, *Heterocyclic Chemistry*, 4$^{th}$ edition, Blackwell Science, Oxford, United Kingdom; and Barton, 1999, *Comprehensive Natural Products Chemistry* 2: 677, Nakanishi and Meth-Cohn eds., Elsevier, Oxford, United Kingdom, 1999.

Circumferentially Disposed.

In the present invention, layers of material are successively circumferentially disposed on a cylindrical substrate 403 in order to form a solar cell. As used herein, the term circumferentially disposed is not intended to imply that each such layer of material is necessarily deposited on an underlying layer. In fact, the present invention teaches methods by which such layers are molded or otherwise formed on an underlying layer. Nevertheless, the term circumferentially disposed means that an overlying layer is disposed on an underlying layer such that there is no annular space between the overlying layer and the underlying layer. Furthermore, as used herein, the term circumferentially disposed means that an overlying layer is disposed on at least fifty percent of the perimeter of the underlying layer. Furthermore, as used herein, the term circumferentially disposed means that an overlying layer is disposed along at least half of the length of the underlying layer.

Circumferentially Sealed.

In the present invention, the term circumferentially sealed is not intended to imply that an overlying layer or structure is necessarily deposited on an underlying layer or structure. In fact, the present invention teaches methods by which such layers or structures (e.g., transparent tubular casing 310) are molded or otherwise formed on an underlying layer or structure. Nevertheless, the term circumferentially sealed means that an overlying layer or structure is disposed on an underlying layer or structure such that there is no annular space between the overlying layer or structure and the underlying layer or structure. Furthermore, as used herein, the term circumferentially sealed means that an overlying layer is disposed on the full perimeter of the underlying layer. In typical embodiments, a layer or structure circumferentially seals an underlying layer or structure when it is circumferentially disposed around the full perimeter of the underlying layer or structure and along the full length of the underlying layer or structure. However, the present invention contemplates embodiments in which a circumferentially sealing layer or structure does not extend along the full length of an underlying layer or structure.

5.1.1 Solar Cell Unit Assemblies

Figure 4B:
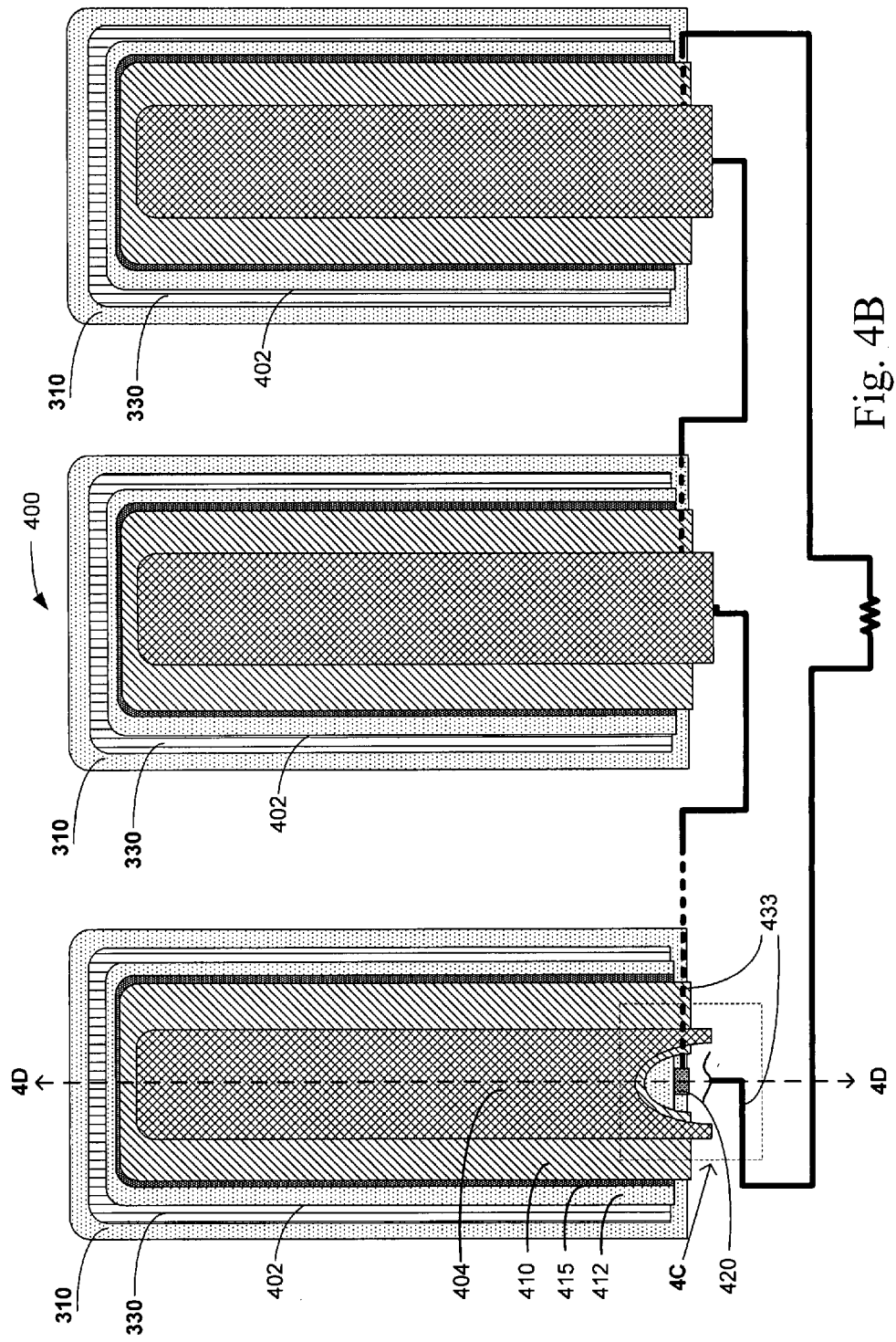
FIG. 4B is a cross-sectional view taken about line 4B-4B of FIG. 4A depicting the serial electrical arrangement of solar cells in an assembly, in accordance with an embodiment of the present invention.

FIG. 4A illustrates a cross-sectional view of the arrangement of three solar cell units 300 arranged in a coplanar fashion in order to form a solar cell assembly 400. FIG. 4B provides a cross-sectional view with respect to line 4B-4B of FIG. 4A. In FIG. 4, back-electrode 404 is depicted as a solid cylindrical substrate. However, in some embodiments in accordance with FIG. 4, rather than being a solid cylindrical substrate, back-electrode is a thin layer of electrically conducting material circumferentially disposed on substrate 403 as depicted in FIG. 3B. All other layers in FIG. 4 are as illustrated in FIG. 3B. Like in FIG. 3B, optional filler layer 330 in the embodiments depicted in FIG. 4 is optional.

Figure 1:
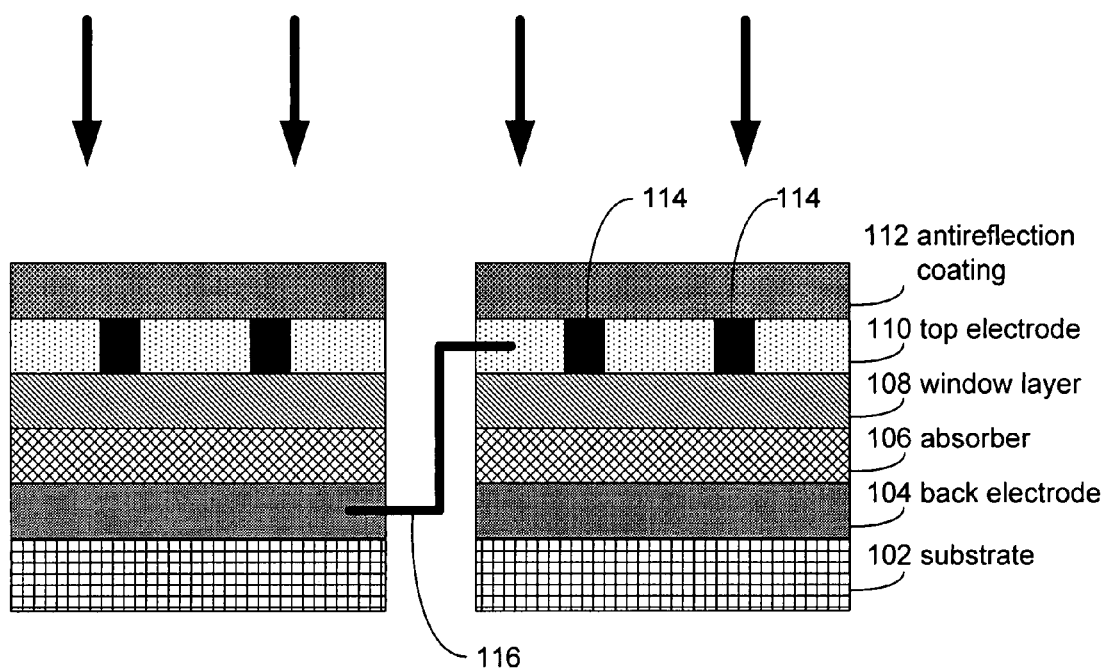
FIG. 1 illustrates interconnected solar cells in accordance with the prior art.
Figure 2A:
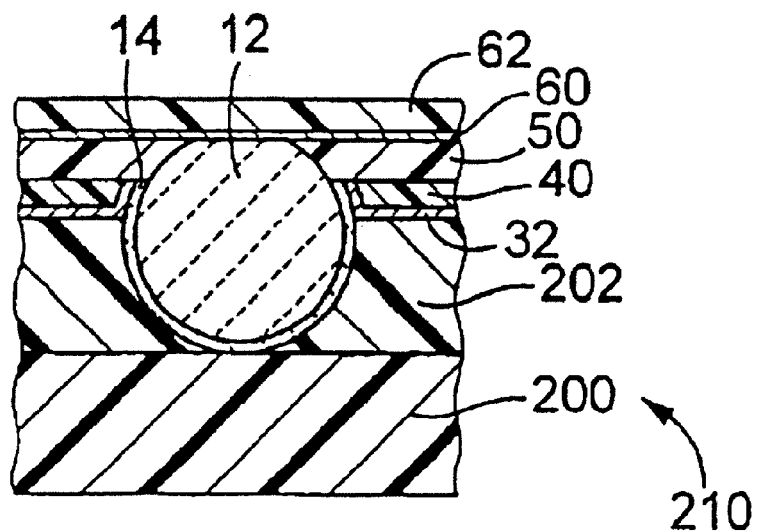
FIG. 2A illustrates a spherical solar cell including a p-type inner layer and an n-type outer layer in accordance with the prior art.
Figure 2B:
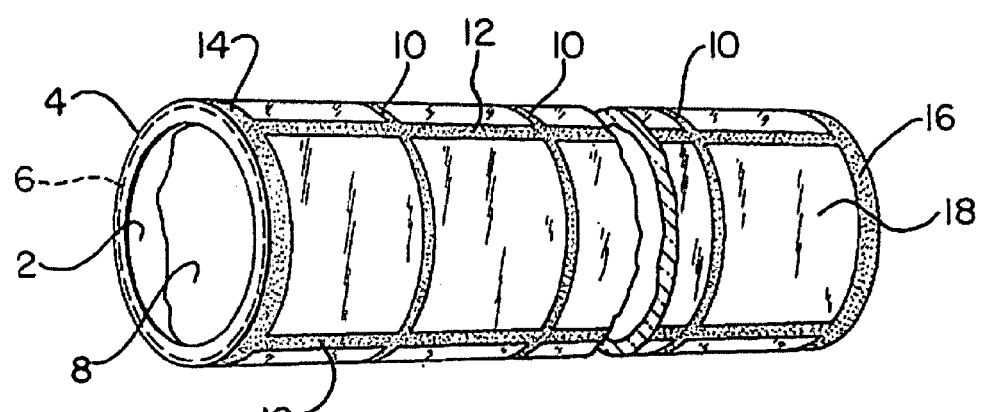
FIG. 2B illustrates a tubular photovoltaic element comprising a cylindrical silicon tube of n-type conductivity that has been subjected to diffusion of boron into its outer surface to form an outer p-conductivity type region and thus a tubular solar cell in accordance with the prior art.
Figure 2C:
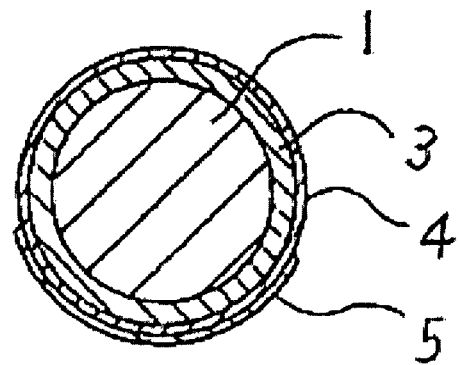
FIG. 2C is a cross-sectional view of an elongated solar cell in accordance with the prior art.
Figure 2D:
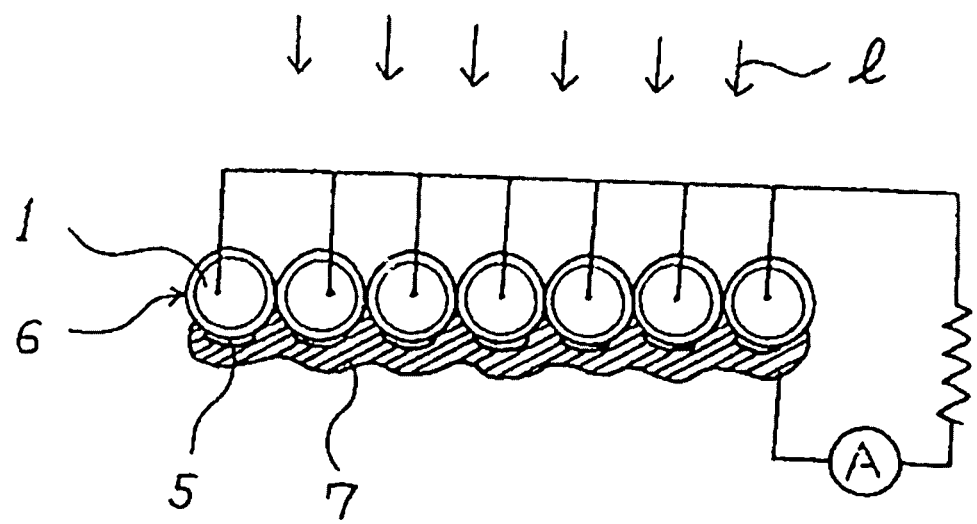
FIG. 2D is a cross-sectional view of a solar cell assembly in which a plurality of elongated solar cells are affixed to an electrically conductive substrate in accordance with the prior art.
Figure 2E:
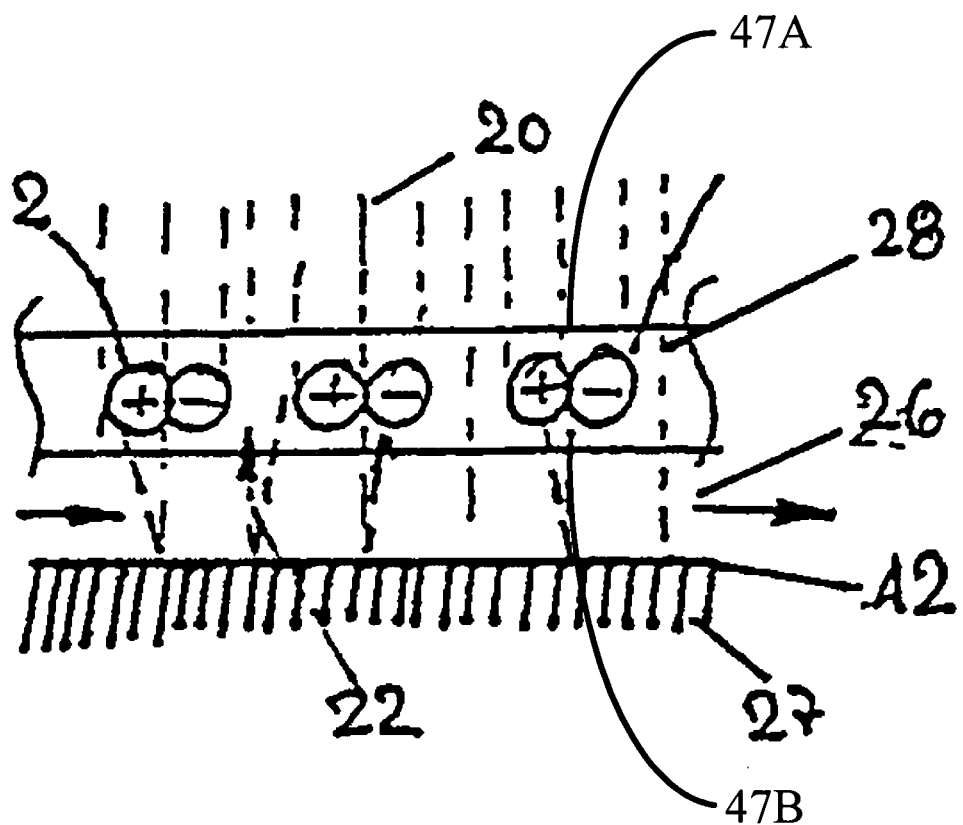
FIG. 2E is a cross-sectional view of a solar cell assembly disposed a distance away from a reflecting wall in accordance with the prior art.

As can be seen with FIGS. 4A and 4B, each elongated cell 402 has a length that is great compared to the diameter d of its cross-section. An advantage of the architecture shown in FIG. 4A is that there is no front side contact that shades solar cells 402. Such a front side contact is found in known devices (e.g., elements 10 of FIG. 2B). Another advantage of the architecture shown in FIG. 4A is that elongated cells 402 are electrically connected in series rather than in parallel. In such a series configuration, the voltage of each elongated cell 402 is summed. This serves to increase the voltage across the system, thereby keeping the current down, relative to comparable parallel architectures, and minimizes resistive losses. A serial electrical arrangement is maintained by arranging all or a portion of the elongated solar cells 402 as illustrated in FIGS. 4A and 4B. Another advantage of the architecture shown in FIG. 4A is that the resistance loss across the system is low. This is because each electrode component of the circuit is made of highly conductive material. For example, as noted above, conductive core 404 of each solar cell 402 is made of a conductive material such as metal. In the alternative, where conductive core 404 is not a solid, but rather comprises a back-electrode layer circumferentially deposited on substrate 403, the back-electrode layer 404 is highly conductive. Regardless of whether back-electrode 404 is in a solid configuration as depicted in FIG. 4 or a thin layer as depicted in FIG. 3B, such back-electrodes 404 carry current without an appreciable current loss due to resistance. While larger conductive cores 404 (FIG. 4) and/or thicker back-electrode 404 (FIG. 3B) ensure low resistance, transparent conductive layers encompassing such larger conductive cores 404 must carry current further to contacts (counter-electrode strips or leads) 420. Thus, there is an upper bound on the size of conductive cores 404 and/or substrate 403. In view of these and other considerations, diameter d is between 0.5 millimeters (mm) and 20 mm in some embodiments of the present invention. Thus, conductive core 404 (FIG. 4) and/or substrate 403 (FIG. 3B) are sized so that they are large enough to carry a current without appreciable resistive losses, yet small enough to allow transparent conductive 412 to efficiently deliver current to counter-electrode strip 420.

The advantageous low resistance nature of the architecture illustrated in FIG. 4A is also facilitated by the highly conductive properties of counter-electrode strip 420. In some embodiments, for example, counter-electrode strips 420 are composed of a conductive epoxy (e.g., silver epoxy) or conductive ink and the like. For example, in some embodiments, counter-electrode strips 420 are formed by depositing a thin metallic layer on a suitable substrate and then patterning the layer into a series of parallel strips. Each counter-electrode strip 420 is affixed to a solar cell 402 with a conductive epoxy along the length of a solar cell 402, as shown in FIG. 4D. In some embodiments, counter-electrode strips 420 are formed directly on solar cells 402. In other embodiments, counter-electrode strips 420 are formed on the outer transparent conductive layer 412, as illustrated in FIG. 3B. In some embodiments, connections between counter-electrode strip 420 to electrodes 433 are established in series as depicted in FIG. 4B.

Still another advantage of the architecture illustrated in FIG. 4A is that the path length through the absorber layer (e.g., layer 502, 510, 520, or 540 of FIG. 5) of semiconductor junction 410 is, on average, longer than the path length through of the same type of absorber layer having the same width but in a planar configuration. Thus, the elongated architecture illustrated in FIG. 4A allows for the design of thinner absorption layers relative to analogous planar solar cell counterparts. In the elongated architecture, the thinner absorption layer absorbs the light because of the increased path length through the layer. Because the absorption layer is thinner relative to comparable planar solar cells, there is less resistance and, hence, an overall increase in efficiency in the cell relative to analogous planar solar cells. Additional advantages of having a thinner absorption layer that still absorbs sufficient amounts of light is that such absorption layers require less material and are thus cheaper. Furthermore, thinner absorption layers are faster to make, thereby further lowering production costs.

Another advantage of elongated solar cells 402 illustrated in FIG. 4A is that they have a relatively small surface area, relative to comparable planar solar cells, and they possess radial symmetry. Each of these properties allow for the controlled deposition of doped semiconductor layers necessary to form semiconductor junction 410. The smaller surface area, relative to conventional flat panel solar cells, means that it is easier to present a uniform vapor across the surface during deposition of the layers that form semiconductor junction 410. The radial symmetry can be exploited during the manufacture of the cells in order to ensure uniform composition (e.g., uniform material composition, uniform dopant concentration, etc.) and/or uniform thickness of individual layers of semiconductor junction 410. For example, the conductive core 404 upon which layers are deposited to make solar cells 402 can be rotated along its longitudinal axis during such deposition in order to ensure uniform material composition and/or uniform thickness.

The cross-sectional shape of solar cells 402 is generally circular in FIG. 4B. In other embodiments, solar cell 402 bodies with a quadrilateral cross-section or an elliptical shaped cross-section and the like are used. In fact, there is no limit on the cross-sectional shape of solar cells 402 in the present invention, so long as the solar cells 402 maintain a general overall rod-like shape in which their length is much larger than their diameter and they possess some form of cross-sectional radial symmetry or approximate cross-sectional radial symmetry.

In some embodiment, as illustrated in FIG. 4A, a first and second elongated solar cell (rod-shaped solar cell) 402 are electrically connected in series by an electrical contact 433 that connects the back-electrode 404 (first electrode) of the first elongated solar cell 402 to the corresponding counter-electrode strip 420 of the second elongated solar cell 402. Thus, as illustrated in FIG. 4A, elongated solar cells 402 are the basic unit that respectively forms the semiconductor layer 410, the transparent conductive layer 412, and the metal conductive core 404 of the elongated solar cell 402. In some embodiments, the elongated solar cells 402 are multiply arranged in a row parallel or nearly parallel with respect to each other and rest upon independent leads (counter-electrodes) 420 that are electrically isolated from each other. Advantageously, in the configuration illustrated in FIG. 4A, elongated solar cells 402 can receive direct light through transparent tubular casing 310.

In some embodiments, not all elongated solar cells 402 in assembly 400 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, transparent conductive 412 of the first elongated solar cell 402 is electrically connected to transparent conductive layer 412 of the second elongated solar cell 402 either by contacting the transparent conductive layers of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

Figure 4C:
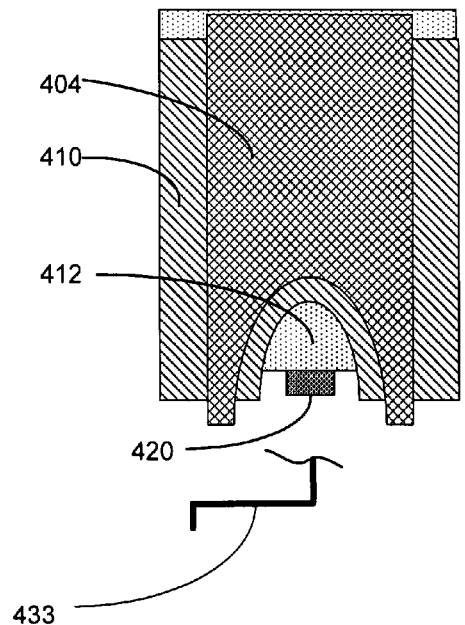
FIG. 4C is a blow-up perspective view of region 4C of FIG. 4B, illustrating various layers in elongated solar cells, in accordance with one embodiment of the present invention.
Figure 4D:
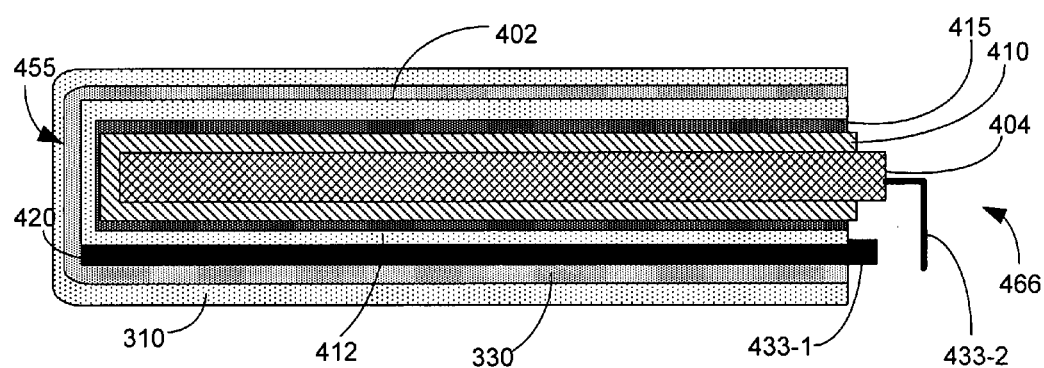
FIG. 4D is a cross-sectional view of an elongated solar cell taken about line 4D-4D of FIG. 4B, in accordance with an embodiment of the present invention.

FIG. 4C is an enlargement of region 4C of FIG. 4B in which a portion of back-electrode 404 and transparent conductive layer 412 have been cut away to illustrate the positional relationship between counter-electrode strip 420, electrode 433, back-electrode 404, semiconductor layer 410, and transparent conductive layer 412. Furthermore, FIG. 4C illustrates how electrical contact 433 joins back-electrode 404 of one elongated solar cell 402 to counter-electrode 420 of another solar cell 402.

One advantage of the configuration illustrated in FIG. 4 is that electrical contacts 433 that serially connect solar cells 402 together only need to be placed on one end of assembly 400, as illustrated in FIG. 4B. However, encapsulation shields each solar cell 402 from unwanted electrical contacts from adjacent solar cells 402, making encapsulation relatively simple. Thus, referring to FIG. 4D, which is a cross-sectional view of an elongated solar 402 cell taken about line 4D-4D of FIG. 4B, it is possible to completely seal far-end 455 of solar cell 402 with transparent tubular casing 310 in the manner illustrated. In some embodiments, the layers in this seal are identical to the layers circumferentially disposed lengthwise on conductive core 404, namely, in order of deposition on conductive core 404 and/or substrate 403, semiconductor junction 410, optional thin intrinsic layer (i-layer) 415, and transparent conductive layer 412. In such embodiments, end 455 can receive sunlight and therefore contribute to the electrical generating properties of the solar cell 402. In some embodiments, transparent tubular casing 310 open at both ends of solar cell 402 such that electrical contacts can be extended from either end of the solar cell.

FIG. 4D also illustrates how, in some embodiments, the various layers deposited on conductive core 404 are tapered at end 466 where electrical contacts 433 are found. For instance, a terminal portion of back-electrode 404 is exposed, as illustrated in FIG. 4D. In other words, semiconductor junction 410, optional i-layer 415, and transparent conductive layer 412 are stripped away from a terminal portion of conductive core 404. Furthermore, a terminal portion of semiconductor junction 410 is exposed as illustrated in FIG. 4D. That is, optional i-layer 415 and transparent conductive layer 412 are stripped away from a terminal portion of semiconductor junction 410. The remaining portions of the conductive core 404, semiconductor junction 410, optional i-layer 415, and transparent conductive layer 412 are coated by transparent tubular casing 310. Such a configuration is advantageous because it prevents a short from developing between transparent conductive layer 412 and conductive core 404. In FIG. 4D, elongated solar cell 402 is positioned on counter-electrode strip 420 which, in turn, is positioned against electrically resistant transparent tubular casing 310. However, there is no requirement that counter-electrode strip 420 make contact with electrically resistant transparent tubular casing 310. In fact, in some embodiments, elongated solar cells 402 and their corresponding counter-electrode strips 420 are sealed within transparent conductive layer 412 such that there is no unfavorable electrical contact. In such embodiments, elongated solar cells 402 and corresponding electrode strips 420 are fixedly held in place by a sealant such as ethylene vinyl acetate or silicone. In some embodiments in accordance with the present invention, counter-electrode strips 420 are replaced with metal wires that are attached to the sides of solar cell 402. In some embodiments in accordance with the present invention, solar cells 402 implement a segmented design to eliminate the requirement of additional wire- or strip-like counter-electrodes. Details on segmented solar cell design are found in copending U.S. patent application Ser. No. 11/378,847, entitled "Monolithic Integration of Cylindrical Solar Cells," filed Mar. 18, 2006, which is hereby incorporated by reference herein in its entirety.

FIG. 4D further provides a perspective view of electrical contacts 433 that serially connect elongated solar cells 402. For instance, a first electrical contact 433-1 electrically interfaces with counter-electrode 420 whereas a second electrical contact 433-2 electrically interfaces with back-electrode 404 (the first electrode of elongated solar cell 402). First electrical contact 433-1 serially connects the counter-electrode of elongated solar cell 402 to the back-electrode 404 of another elongated solar cell. Second electrical contact 433-2 serially connects the back-electrode 404 of elongated solar cell 402 to the counter-electrode 420 of another elongated solar cell 402, as shown in FIG. 4B. Such an electrical configuration is possible regardless of whether back-electrode 404 is itself a solid cylindrical substrate or is a layer of electrically conducting material on a substrate 403 as depicted in FIG. 3B. Each solar cell 402 is coated by a transparent tubular casing 310.

In addition, FIG. 4D provides an encapsulated solar cell 402 where an optional filler layer 330 and a transparent tubular casing 310 cover the solar cell, leaving only one end 466 to establish electrical contracts. It is to be appreciated that, in some embodiments, the optional filler layer 330 and transparent tubular casing 310 are configured such that both ends (e.g., 455 and 466 in FIG. 4D) of the elongated solar cell 402 are available to establish electrical contacts.

Figure 7A:
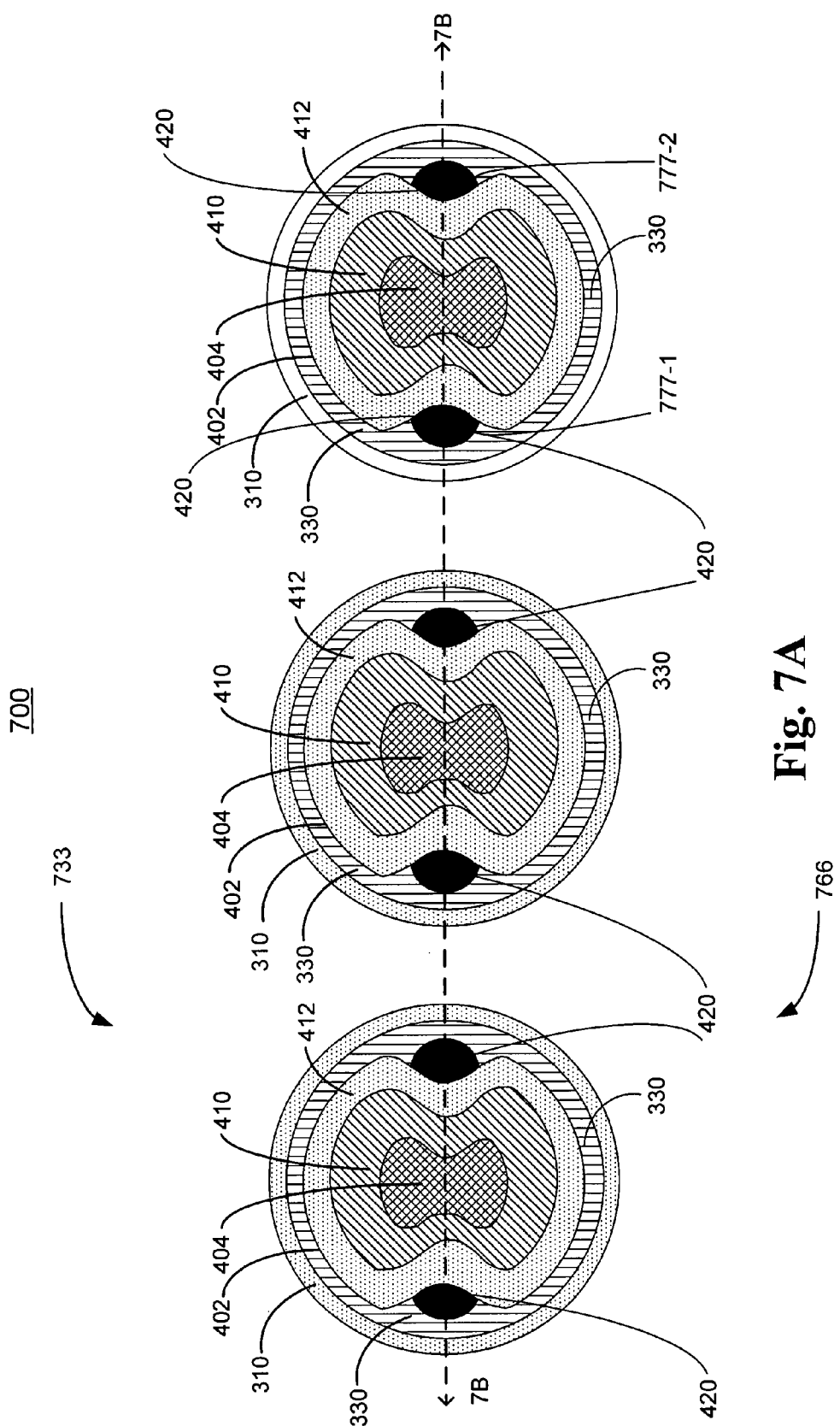
FIG. 7A is a cross-sectional view of elongated solar cells electrically arranged in series in an assembly where counter-electrodes abut individual solar cells, in accordance with another embodiment of the present invention.

FIG. 7A illustrates a solar cell assembly 700 in accordance with another embodiment of the present invention. Solar cell assembly 700 comprises a plurality of elongated solar cells 402, each encapsulated in transparent tubular casing 310. Each elongated solar cell 402 in the plurality of elongated solar cells has a back-electrode 404 configured as a first electrode. In the embodiments depicted in FIG. 7A, back electrode 404 is a solid cylindrical electrically conducting substrates. However, in alternative embodiments in accordance with FIG. 7, back-electrode 404 is a thin film of electrically conducting material deposited on a hollowed tubular shaped substrate as in the case of FIG. 3B. The principals taught in FIG. 7 apply to each such form of back-electrode 404. In FIG. 7, a semiconductor junction 410 is circumferentially disposed on the conductive core 402 and a transparent conductive layer 412 is circumferentially disposed on semiconductor junction 410. In some embodiments, the plurality of elongated solar cells 402 are geometrically arranged in a parallel or a near parallel manner thereby forming a planar array having a first face (facing side 733 of assembly 700) and a second face (facing side 766 of assembly 700). The plurality of elongated solar cells is arranged such that one or more elongated solar cells in the plurality of elongated solar cells do not contact adjacent elongated solar cells. In some embodiments, the plurality of elongated solar cells is arranged such that each of the elongated solar cells in the plurality of elongated solar cells does not directly contact (through transparent conductive layer 412) adjacent elongated solar cells 402. In some embodiments, the plurality of elongated solar cells is arranged such that each of the elongated solar cells in the plurality of elongated solar cells does directly contact the outer transparent tubular casing 310 of adjacent elongated solar cells 402.

In some embodiments, there is a first groove 777-1 and a second groove 777-2 that each runs lengthwise on opposing sides of solar cell 402. In FIG. 7A, some but not all grooves 777 are labeled. In some embodiments, there is a counter-electrode 420 in one or both grooves of the solar cells. In the embodiment illustrated in FIG. 6A, there is a counter-electrode fitted lengthwise in both the first and second grooves of each solar cell in the plurality of solar cells. Such a configuration is advantageous because it reduces the path length of current drawn off of transparent conductive layer 412. In other words, the maximum length that current must travel in transparent conductive layer 412 before it reaches a counter-electrode 420 is a quarter of the circumference of the transparent conductive layer. By contrast, in configurations where there is only a single counter-electrode 420 associated with a given solar cell 402, the maximum length that current must travel in transparent conductive layer 412 before it reaches a counter-electrode 420 is a full half of the circumference of the transparent conductive layer 412. The present invention encompasses grooves 777 that have a broad range of depths and shape characteristics and is by no means limited to the shape of the grooves 777 illustrated in FIG. 7A. In general, any groove shape 777 that runs along the long axis of a solar cell 402 and that can accommodate all or part of counter-electrode 420 is within the scope of the present invention. For example, in some embodiments not illustrated by FIG. 7A, each groove 777 is patterned so that there is a tight fit between the contours of the groove 777 and the counter-electrode 420.

As illustrated in FIG. 7A, there are a plurality of metal counter-electrodes 420, and each respective elongated solar cell 402 in the plurality of elongated solar cells is bound to at least a first corresponding metal counter-electrode 420 in the plurality of metal counter-electrodes such that the first metal counter-electrode lies in a groove 777 that runs lengthwise along the respective elongated solar cell. Furthermore, in the solar cell assembly illustrated in FIG. 7A, each respective elongated solar cell 402 is bound to a second corresponding metal counter-electrode 420 such that the second metal counter-electrode lies in a second groove 777 that runs lengthwise along the respective elongated solar cell 402. As further illustrated in FIG. 7A, the first groove 777 and the second groove 777 are on opposite or substantially opposite sides of the respective elongated solar cell 402 and run along the long axis of the cell.

In some embodiments, transparent tubular casing 310, such as the transparent tubular casing 310 depicted in FIG. 14, is used to encase elongated solar cells 402. Because it is important to exclude air from the solar cell unit 402, an optional filler layer 330 is circumferentially disposed between solar cell 402 and transparent tubular casing 310 in the manner illustrated in FIG. 7A in some embodiments of the present invention. In some embodiments, filler layer 330 prevents the seepage of oxygen and water into solar cells 402. In some embodiments, filler layer 330 comprises EVA or silicone. In some embodiments, the individually encased solar cells 402 are assembled into a planar array as depicted in FIG. 7A. The plurality of elongated solar cells 402 are configured to receive direct light from both face 733 and face 766 of the planar array.

Figure 7B:
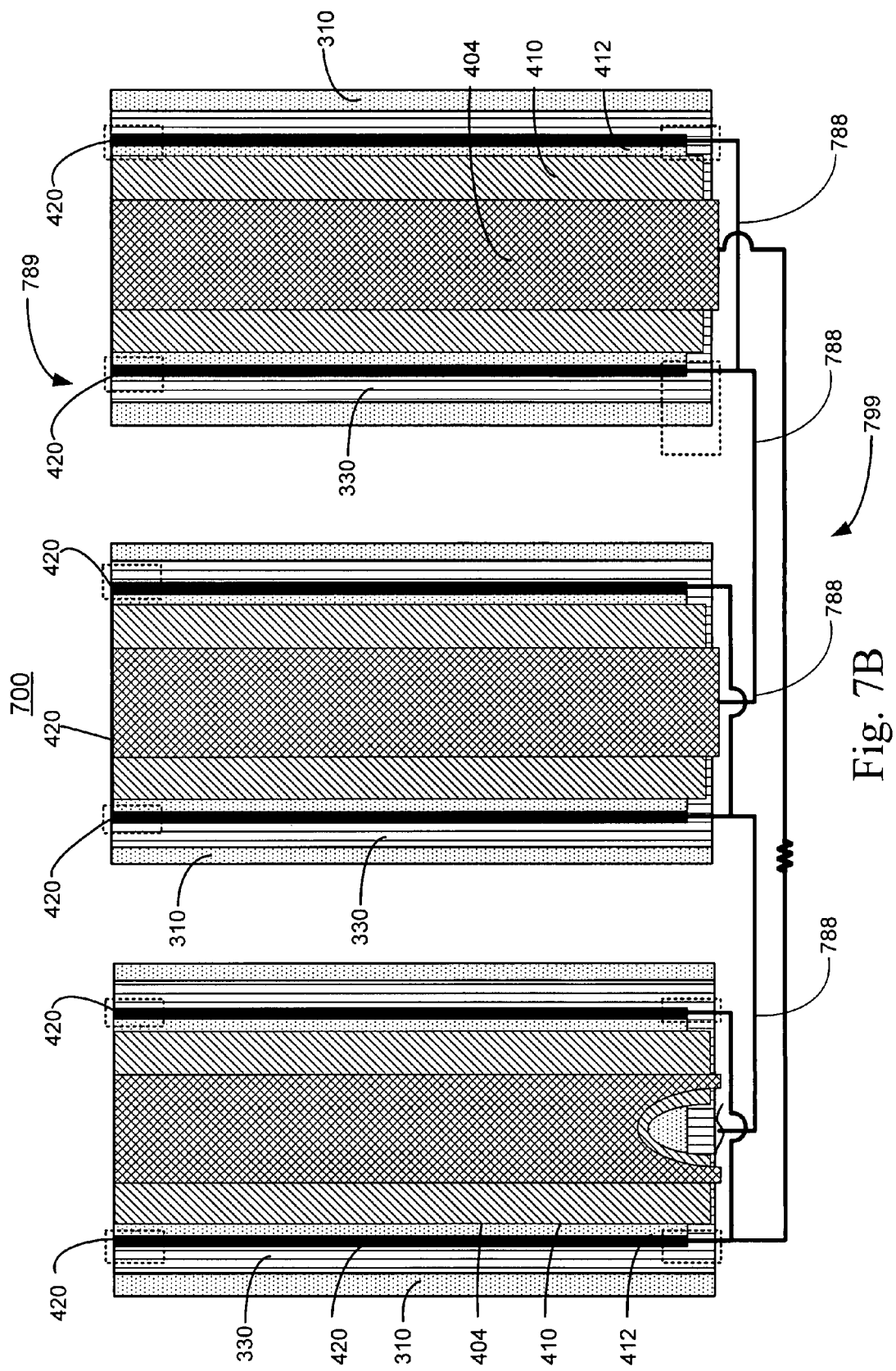
FIG. 7B is a cross-sectional view taken about line 7B-7B of FIG. 7A that depicts the serial arrangement of the cylindrical solar cells in an assembly, in accordance with an embodiment of the present invention.

FIG. 7B provides a cross-sectional view with respect to line 7B-7B of FIG. 7A. Solar cells 402 are electrically connected to other in series by arranging the solar cells such that they do not touch each other, as illustrated in FIGS. 7A and 7B and by the use of electrical contacts as described below in conjunction with FIG. 7B. Although the individual solar cells are shown separate from each other to reveal the encasing by transparent tubular casing 310, no actual separation distance between solar cells 402 is required since transparent tubular casing 310 shields the individual solar cells 402 of solar cell unit 300 from any unfavorable electrical contacts. However, tight space or no space packing is not a required for individually shielded solar cell unit 300. In fact, the presence of the transparent tubular casing 310 provides more versatility in the solar cell assembly. For instance, in some embodiments, the distance between adjacent solar cell units 300 is 0 microns or greater, 0.1 microns or greater, 0.5 microns or greater, or between 1 and 5 microns, or optimally correlated with the size and dimensions of the solar cell units 300.

Referring to FIG. 7B, serial electrical contact between solar cells 402 is made by electrical contacts 788 that electrically connect the back-electrode 404 of one elongated solar cell 402 to the corresponding counter-electrodes 120 of a different solar cell 402. FIG. 7B further illustrates a cutaway of metal conductive core 404 and semiconductor junction 410 in one solar cell 402 to further illustrate the architecture of solar cells 402.

The solar cell assembly illustrated in FIG. 7 has several advantages. First, the planar arrangement of the solar cells 402 leaves almost zero percent shading in the assembly. For instance, the assembly can receive direct sunlight from both face 733 and face 766. Second, in embodiments where individually encapsulated solar cells 402 are aligned parallel to each other with no or little space separation, the structure is completely self-supporting. Still another advantage of the assembly is ease of manufacture. Unlike solar cells such as that depicted in FIG. 2B, no complicated grid or transparent conductive oxide on glass is required. For example, to assemble a solar cell 402 and its corresponding counter-electrodes 420 together to complete the circuit illustrated in FIG. 7A, counter-electrode 420, when it is in the form of a wire, can be covered with conductive epoxy and dropped in the groove 777 of solar cell 402 and allowed to cure.

As illustrated in FIG. 7B, conductive core 404, junction 410, and transparent conductive layer 412 are flush with each other at end 789 of elongated solar cells 402. In contrast, at end 799, the conductive core protrudes a bit with respect to junction 410 and transparent conductive layer 412 as illustrated. Junction 410 also protrudes a bit at end 799 with respect to transparent conductive layer 412. The protrusion of conductive core 404 at end 799 means that the sides of a terminal portion of the conductive core 404 are exposed (e.g., not covered by junction 410 and transparent conductive layer 412). The purpose of this configuration is to reduce the chances of shorting counter-electrode 420 (or the epoxy used to mount the counter-electrode in groove 777) with transparent conductive layer 412. In some embodiments, all or a portion of the exposed surface area of counter-electrodes 420 are shielded with an electrically insulating material in order to reduce the chances of electrical shortening. For example, in some embodiments, the exposed surface area of counter-electrodes 420 in the boxed regions of FIG. 7B is shielded with an electrically insulating material.

Still another advantage of the assembly illustrated in FIG. 7 is that the counter-electrode 420 can have much higher conductivity without shadowing. In other words, counter-electrode 420 can have a substantial cross-sectional size (e.g., 1 mm in diameter when solar cell 402 has a 6 mm diameter). Thus, counter-electrode 420 can carry a significant amount of current so that the wires can be as long as possible, thus enabling the fabrication of larger panels.

The series connections between solar cells 402 can be between pairs of solar cells 402 in the manner depicted in FIG. 7B. However, the invention is not so limited. In some embodiments, two or more solar cells 402 are grouped together (e.g., electrically connected in a parallel fashion) to form a group of solar cells and then such groups of solar cells are serially connected to each other. Therefore, the serial connections between solar cells can be between groups of solar cells where such groups have any number of solar cells 402 (e.g., 2, 3, 4, 5, 6, etc.). However, FIG. 7B illustrates a preferred embodiment in which each contact 788 serially connects only a pair of solar cells 402.

Yet another advantage of the assembly illustrated in FIG. 7B is that transparent tubular casing 310 is circumferentially disposed on solar cells 402. In some embodiments, an optional filler layer 330 lies between the outer surface of solar cell 402 and the inner surface of transparent tubular casing 310. Although FIG. 7B only depicts electrical circuitry at one end of adjacent solar cell units 300, it is possible for electrical circuitry to be established at both ends of solar cell units 300 or between the two ends of solar cell units 300.

The solar cell design in accordance with the present invention is advantageous in that each individual solar cell 402 is encapsulated by transparent tubular casing 310. transparent tubular casing 310 is at least partial transparent and made of non-conductive material such as plastics or glass. Accordingly, solar cell assemblies made according to the present design do not require insulator lengthwise between each solar cell 402. Yet another embodiment of solar cell assembly 700 is that there is no extra absorption loss from a transparent conductive layer or a metal grid on one side of the assembly. Further, assembly 700 has the same performance or absorber area exposed on both sides 733 and 766. This makes assembly 700 symmetrical.

Still another advantage of assembly 700 is that all electrical contacts 788 end at the same level (e.g., in the plane of line 7B-7B of FIG. 7A). As such, they are easier to connect and weld with very little substrate area wasted at the end. This simplifies construction of the solar cells 402 while at the same time serves to increase the overall efficiency of solar cell assembly 700. This increase in efficiency arises because the welds can be smaller.

Although not illustrated in FIG. 7, in some embodiments in accordance with FIG. 7, there is an intrinsic layer 415 circumferentially disposed between the semiconductor junction 410 and the transparent conductive layer 412 in an elongated solar cell 402 in the plurality of elongated solar cells 402. Intrinsic layer 415 can be made of an undoped transparent oxide such as zinc oxide, metal oxide, or any transparent metal that is highly insulating. In some embodiments, the semiconductor junction 410 of solar cells 402 in assembly 700 comprise an inner coaxial layer and an outer coaxial layer where the outer coaxial layer comprises a first conductivity type and the inner coaxial layer comprises a second, opposite, conductivity type. In an exemplary embodiment, the inner coaxial layer comprises copper-indium-gallium-diselenide (CIGS) whereas the outer coaxial layer comprises $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO. In some embodiments not illustrated by FIG. 7, conductive cores 404 in solar cells 402 are hollowed.

FIG. 8 illustrates a solar cell assembly 800 of the present invention that is identical to solar cell assembly 700 of the present invention with the exception that transparent conductive layer 412 is interrupted by breaks 810 that run along the long axis of solar cells 402 and cut completely through transparent conductive layer 412. In the embodiment illustrated in FIG. 8, there are two breaks 810 that run the length of solar cell 402. The effect of such breaks 810 is that they electrically isolate the two counter-electrodes 420 associated with each solar cell 402 in solar cell assembly 800. There are many ways in which breaks 800 can be made. For example, a laser or an HCl etch can be used.

In some embodiments, not all elongated solar cells 402 in assembly 800 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, transparent conductive layer 412 of the first elongated solar cell 402 is electrically connected to transparent conductive layer 412 of the second elongated solar cell 402 either by contacting the transparent conductive layers of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

In some embodiments, transparent tubular casing 310, such as depicted in FIG. 14, is used to encase elongated solar cells 402. Because it is important to exclude air from the solar cell unit 402, a filler layer 330 may be used to prevent oxidation of the solar cell 402. As illustrated in FIG. 8, filler layer 330 (for example EVA) prevents seepage of oxygen and water into solar cells 402. Filler layer is disposed between solar cell 402 and the inner layer of transparent tubular casing 310. In some embodiments, the individually encapsulated solar cells 402 are assembled into a planar array as depicted in FIG. 8.

Figure 9:
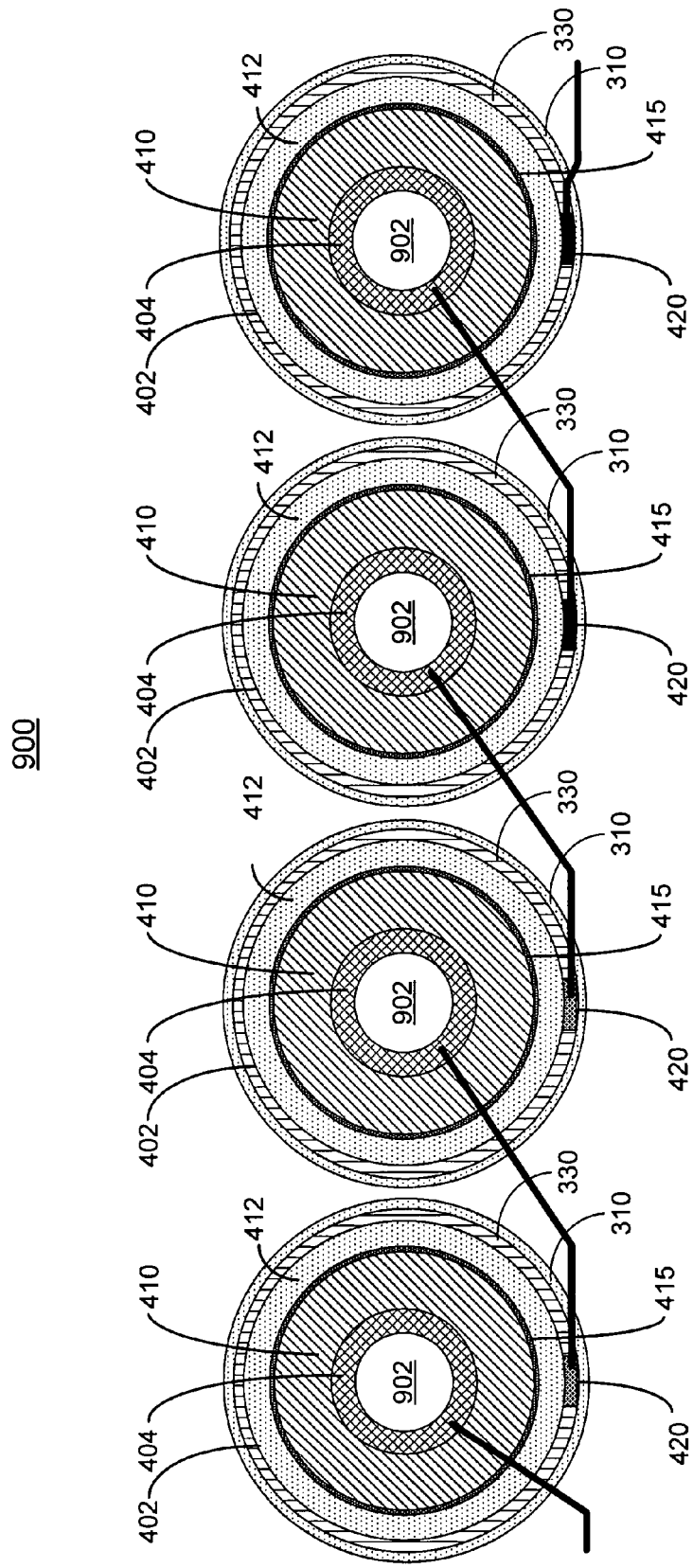
FIG. 9 is a cross-sectional view of elongated solar cells electrically arranged in series in an assembly in which the inner metal electrode is hollowed, in accordance with an embodiment of the present invention.

FIG. 9 illustrates a solar cell assembly 900 of the present invention in which back-electrodes 404 are hollowed. In fact, back-electrode 404 can be hollowed in any of the embodiments of the present invention. One advantage a hollowed back-electrode 404 design is that it reduces the overall weight of the solar cell assembly. Back-electrode 404 is hollowed when there is a channel that extends lengthwise through all or a portion of back-electrode 404. In some embodiments, back-electrode 404 is metal tubing. In some embodiments, back-electrode 404 is a thin layer of electrically conducting material, e.g. molybdenum, that is deposited on a substrate 403 as illustrated in FIG. 3B.

In some embodiments, not all elongated solar cells 402 in assembly 900 are electrically arranged in series. For example, in some embodiments, there are pairs of elongated solar cells 402 that are electrically arranged in parallel. The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

Figure 10:
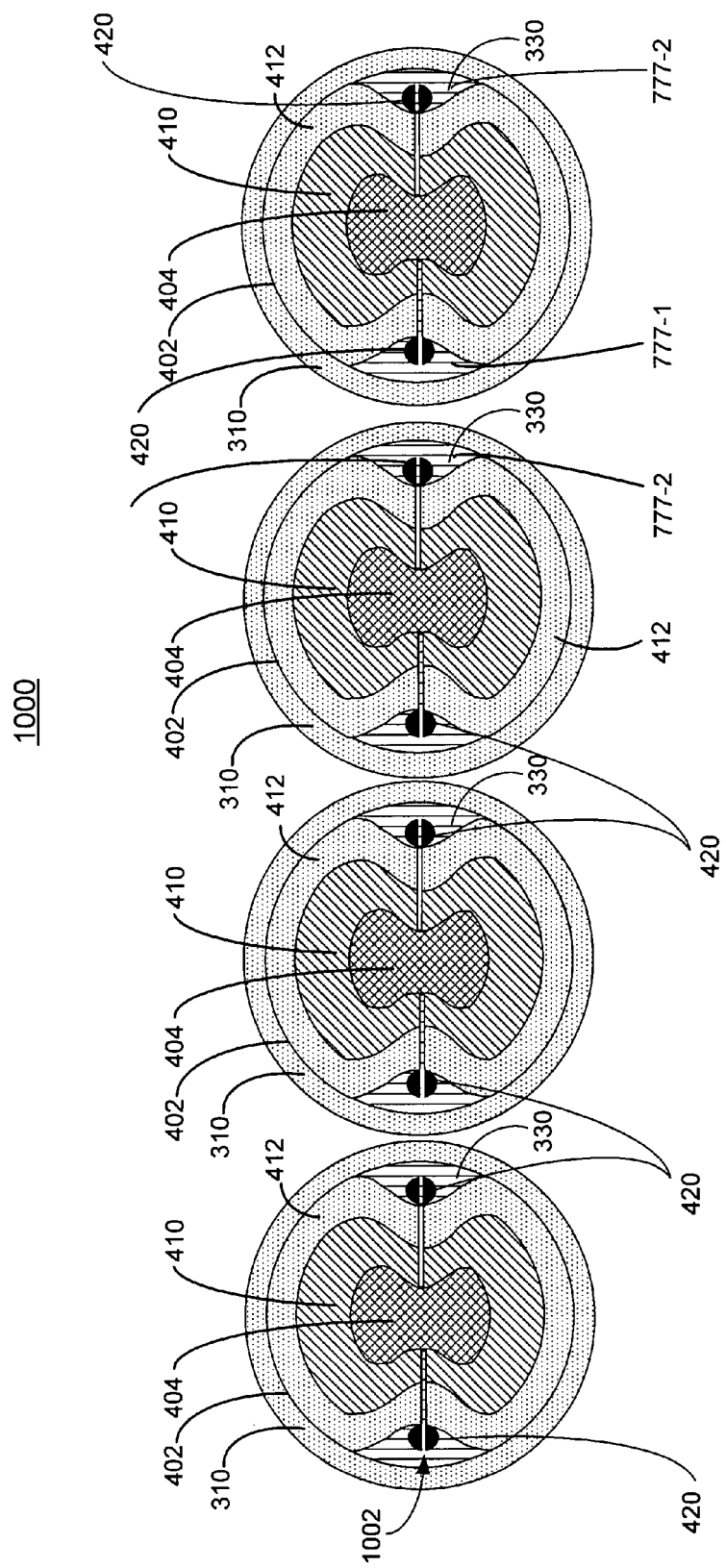
FIG. 10 is a cross-sectional view of elongated solar cells electrically arranged in series in an assembly in which a groove pierces the counter-electrodes, transparent conducting oxide layer, and junction layers of the solar cells, in accordance with an embodiment of the present invention.

In some embodiments, a transparent tubular casing 310, for example as depicted in FIG. 14, can be used to circumferentially cover elongated solar cells 402. Because it is important to exclude air from the solar cell unit 402, additional sealant may be used to prevent oxidation of the solar cell 402. Alternatively, as illustrated in FIG. 9, an optional filler layer 330 (for example, EVA or silicone, etc.) may be used to prevent seepage of oxygen and water into solar cells 402. In some embodiments, the individually encased solar cells 402 are assembled into a planar array as depicted in FIG. 9. FIG. 10 illustrates a solar cell assembly 1000 of the present invention in which counter-electrodes 420, transparent conductive layers 412, and junctions 410 are pierced, in the manner illustrated, in order to form two discrete junctions in parallel. In some embodiments, transparent tubular casing 310, for example as depicted in FIG. 14, may be used to encase elongated solar cells 402 with or without optional filler layer 330.

Figure 15:
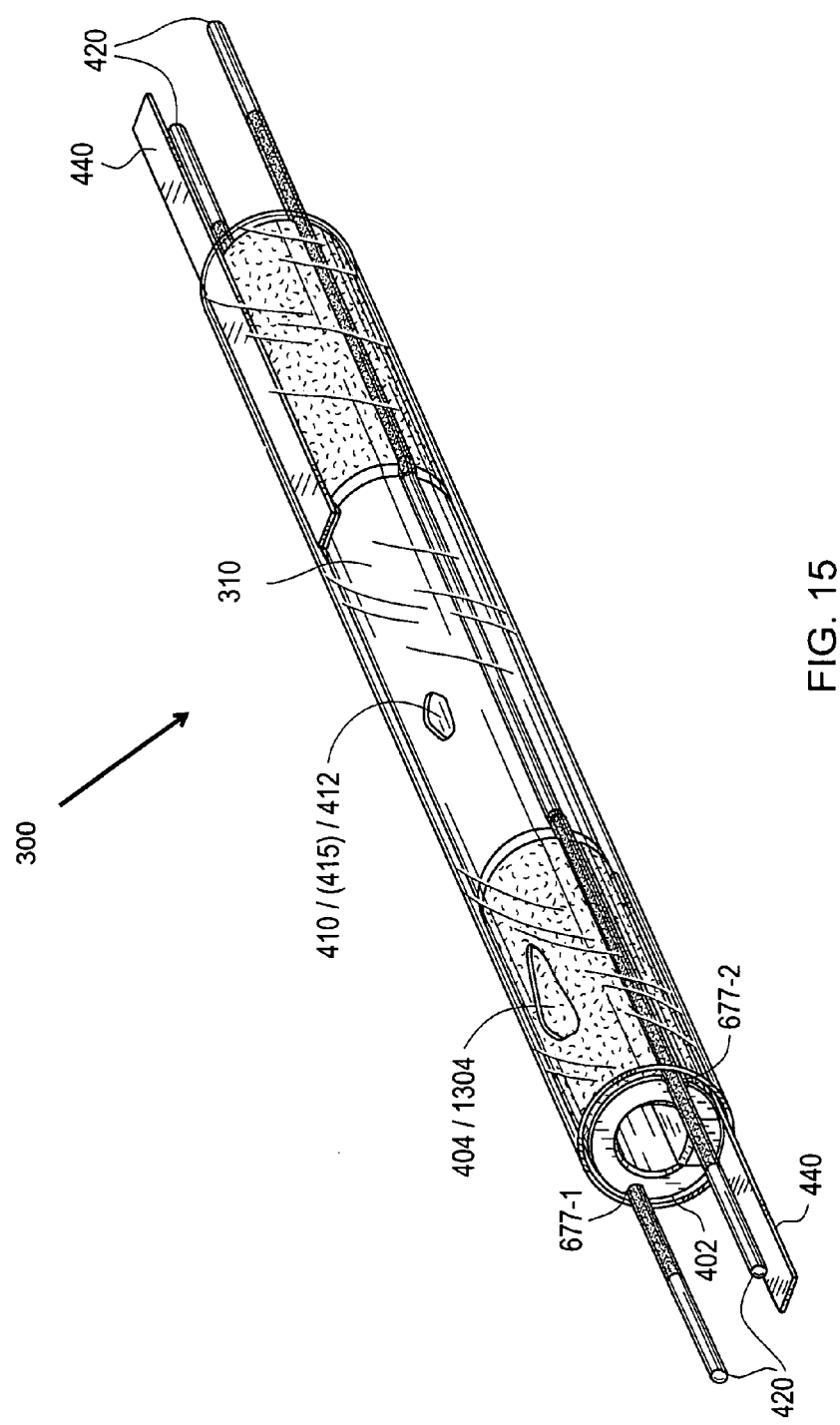
FIG. 15 illustrates a perspective view of an elongated solar cell architecture with protruding electrode attachments, in accordance with an embodiment of the present invention.

FIG. 15 illustrates an elongated solar cell 402 in accordance with the present invention. A transparent tubular casing 310 encases the elongated solar cell 402, leaving only ends of electrodes 420 exposed to establish suitable electrical connections. The ends of the elongated solar cell 402 are stripped and conductive layer 404 is exposed. As in previous embodiments, back-electrode 404 serves as the first electrode in the assembly and transparent conductive layer 412 on the exterior surface of each elongated solar cell 402 serves as the counter-electrode. In some embodiments in accordance with the present invention as illustrated in FIG. 15, however, protruding counter-electrodes 420 and electrodes 440, which are attached to the elongated solar cell 402, provide convenient electrical connection.

In typical embodiments as shown in FIG. 15, there is a first groove 677-1 and a second groove 677-2 that each runs lengthwise on opposing sides of elongated solar cell 402. In some embodiments, counter-electrodes 420 are fitted into grooves 677 in the manner illustrated in FIG. 15. Typically, such counter-electrodes 420 are glued into grooves 677 using a conductive ink or conductive glue. For example, CuPro-Cote (available from Lessemf.com, Albany, N.Y.), which is a sprayable metallic coating system using a non-oxidizing copper as a conductor, can be used. In preferred embodiments, counter-electrodes 420 are fitted in to grooves 677 and then a bead of conductive ink or conductive glue is applied. As in previous embodiments, the present invention encompasses grooves 677 that have a broad range of depths and shape characteristics and is by no means limited to the shape of the grooves 677 illustrated in FIG. 15. In general, any type of groove 677 that runs along the long axis of a first solar cell 402 and that can accommodate all or part of counter-electrode 420 is within the scope of the present invention. Counter-electrodes 420 conduct current from the combined layer 410/(415)/412. At the regions at both ends of elongated solar cell 402, counter-electrodes 420 are sheathed as shown in FIG. 15 so that they are electrically isolated from conductive layer 404. The ends of protruding counter-electrodes 420, however, are unsheathed so they can form electric contact with additional devices.

In the embodiments as depicted in FIG. 15, a second set of electrodes 440 are attached to the exposed back-electrode 404. The second set of electrodes 440 conduct current from back-electrode 404. As illustrated in FIG. 15, an embodiment in accordance with the present invention has two electrodes 440 attached at two opposing ends of each elongated solar cell 402. Typically, electrodes 440 are glued onto back-electrode 404 using a conductive ink or conductive glue. For example, CuPro-Cote can be used. In some embodiments, electrodes 440 are glued to layer 404 and then a bead of conductive ink or conductive glue is applied. Care is taken so that electrodes 440 are not in electrical contact with layer 410/(415)/412. Additionally, electrodes 440 in the present invention have a broad range of lengths and widths and shape characteristics and are by no means limited to the shape of 440 illustrated in FIG. 15. In the embodiments as shown in FIG. 15, the two electrodes 440 on opposite ends of the elongated solar cell 402 are not on the same side of the solar cell cylinder. The first electrode 440 is on the bottom side of the elongated solar cell 402 while the second electrode 440 is on the top side of the elongated solar cell 402. Such an arrangement facilitates the connection of the solar cells in a serial manner. In some embodiments in accordance with the present invention, the two electrodes 440 can be on the same side of elongated solar cell 402.

In some embodiments, each electrode 440 is made of a thin strip of conductive material that is attached to conductive layer 404/1304 (FIG. 15). In some embodiments, each electrode 440 is made of a conductive ribbon of metal (e.g., copper, aluminum, gold, silver, molybdenum, or an alloy thereof) or a conductive ink. As will be explained in conjunction with subsequent drawings, counter-electrode 420 and electrodes 440 are used to electrically connect elongated solar cells 402, preferably in series.

5.1.2 Transparent Tubular Casing

Figure 3C:
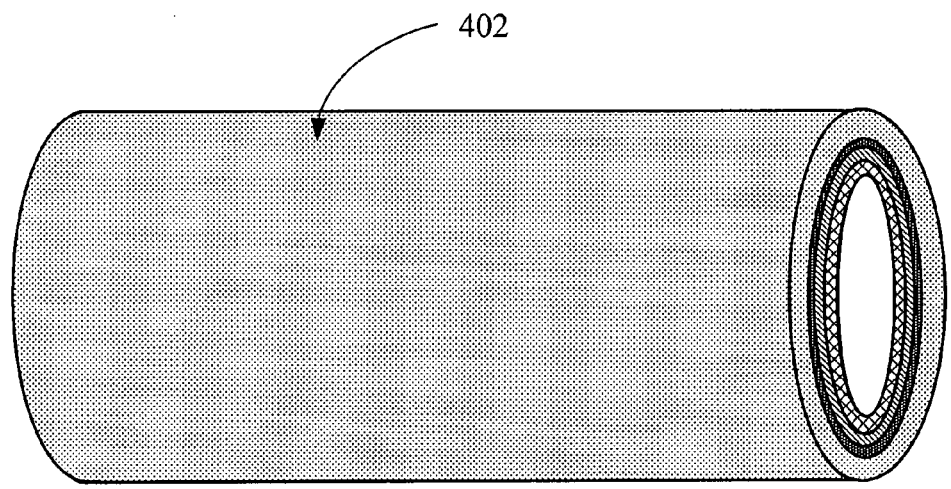
FIG. 3C illustrates the multi-layer components of an elongated solar cell in accordance with an embodiment of the present invention.
Figure 3D:
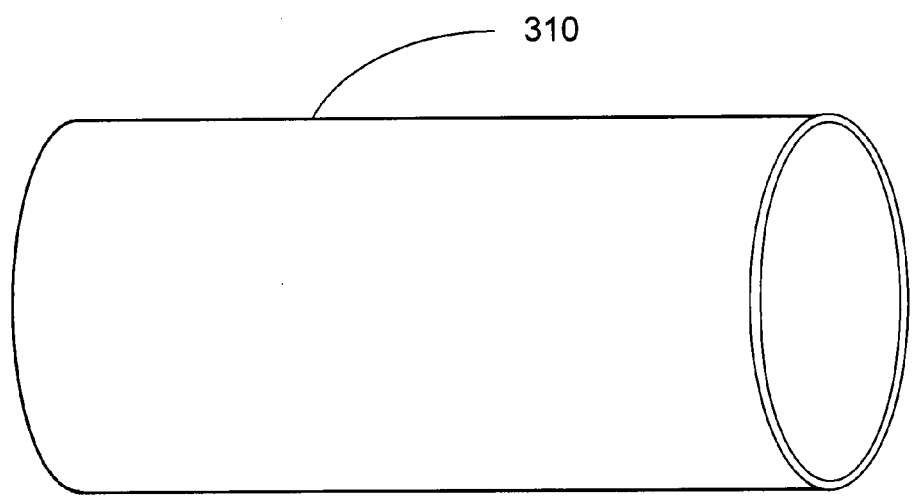
FIG. 3D illustrates a transparent tubular casing, in accordance with an embodiment of the present invention.

A transparent tubular casing 310, as depicted in FIGS. 3A through 3C, seals a solar cell unit 402 to provide support and protection to the solar cell. The size and dimensions of transparent tubular casing 310 are determined by the size and dimension of individual solar cells 402 in a solar cell assembly unit 402. Transparent tubular casing 310 may be made of glass, plastic or any other suitable material. Examples of materials that can be used to make transparent tubular casing 310 include, but are not limited to, glass (e.g., soda lime glass), acrylics such as polymethylmethacrylate, polycarbonate, fluoropolymer (e.g., Tefzel or Teflon), polyethylene terephthalate (PET), Tedlar, or some other suitable transparent material.

5.1.2.1 Transparent Tubular Casing Construction

In some embodiments, transparent tubular casing 310 is constructed using blow molding. Blow molding involves clamping the ends of a softened tube of polymers, which can be either extruded or reheated, inflating the polymer against the mold walls with a blow pin, and cooling the product by conduction or evaporation of volatile fluids in the container. Three general types of blow molding are extrusion blow molding, injection blow molding, and stretch blow molding. Extrusion blow molding is used to make items of weight greater than twelve ounces. Injection blow molding achieves accurate wall thickness. Stretch blow molding is typically used for difficult to blow crystalline and crystallizable polymers such as polypropylene and polyethylene terephthalate. U.S. Pat. No. 237,168 describes a process for blow molding (e.g., 602 in FIG. 6A). Other forms of blow molding include low density polyethylene (LDPE) blow molding, high density polyethylene (HDPE) blow molding and polypropylene (PP) blow molding Extrusion Blow Molding.

Figure 6A:
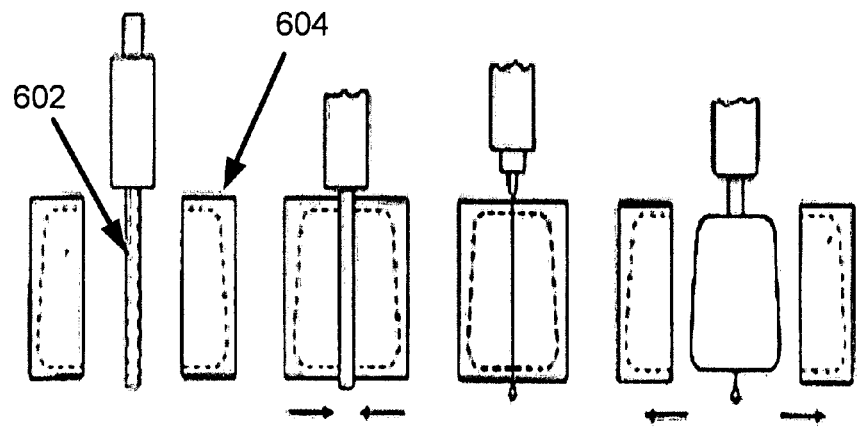
FIG. 6A illustrates an extrusion blow molding method, in accordance with the prior art.

As depicted in FIG. 6A, the extrusion blow molding method comprises a Parison (e.g., 602 in FIG. 6A) and mold halves that close onto the Parison (e.g., 604 in FIG. 6A). In extrusion blow molding (EBM), material is melted and extruded into a hollow tube (e.g., a Parison as depicted in FIG. 6A). The Parison is then captured by closing it into a cooled metal mold. Air is then blown into the Parison, inflating it into the shape of the hollow bottle, container or part. After the material has cooled sufficiently, the mold is opened and the part is ejected.

EBM processes consist of either continuous or intermittent extrusion of the Parison 602. The types of EBM equipment may be categorized accordingly. Typical continuous extrusion equipments usually comprise rotary wheel blow molding systems and a shuttle machinery that transports the finished products from the Parison. Exemplary intermittent extrusion machinery comprises a reciprocating screw machinery and an accumulator head machinery. Basic polymers, such as PP, HDPE, PVC and PET are increasingly being coextruded with high barrier resins, such as EVOH or Nylon, to provide permeation resistance to water, oxygen, $CO_2$ or other substances.

Compared to injection molding, blow molding is a low pressure process, with typical blow air pressures of 25 to 150 psi. This low pressure process allows the production of economical low-force clamping stations, while parts can still be produced with surface finishes ranging from high gloss to textured. The resulting low stresses in the molded parts also help make the containers resistant to strain and environmental stress cracking.

Injection Blow Molding.

Figure 6B:
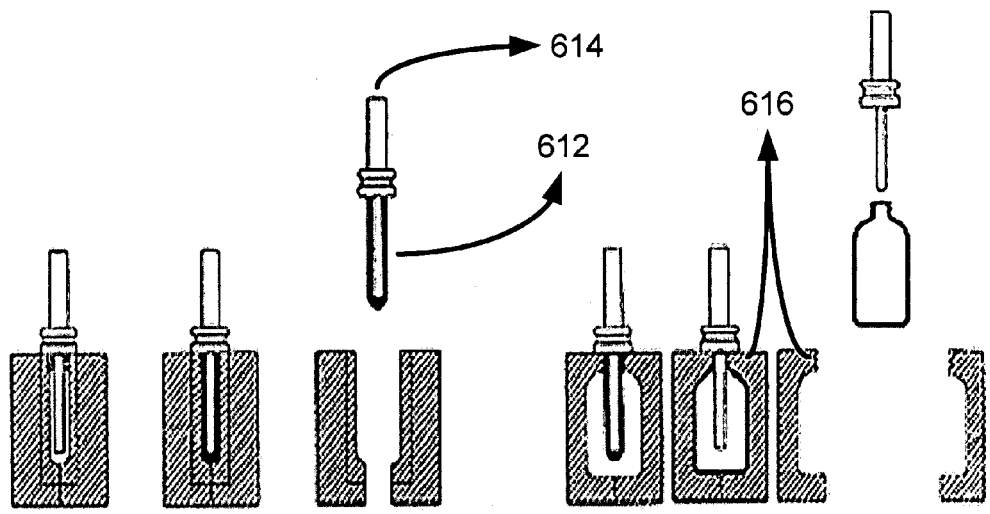
FIG. 6B illustrates an injection blow molding method, in accordance with the prior art.

In injection blow molding (IBM), as depicted in FIG. 6B, material is injection molded onto a core pin (e.g., 612 in FIG. 6B); then the core pin is rotated to a blow molding station (e.g., 614 in FIG. 6B) to be inflated and cooled. The process is divided in to three steps: injection, blowing and ejection. A typical IBM machine is based on an extruder barrel and screw assembly which melts the polymer. The molten polymer is fed into a manifold where it is injected through nozzles into a hollow, heated preform mold (e.g., 614 in FIG. 6B). The preform mold forms the external shape and is clamped around a mandrel (the core rod, e.g., 612 in FIG. 6B) which forms the internal shape of the preform. The preform consists of a fully formed bottle/jar neck with a thick tube of polymer attached, which will form the body.

The preform mold opens and the core rod is rotated and clamped into the hollow, chilled blow mold. The core rod 612 opens and allows compressed air into the preform 614, which inflates it to the finished article shape. After a cooling period the blow mold opens and the core rod is rotated to the ejection position. The finished article is stripped off the core rod and leak-tested prior to packing. The preform and blow mold can have many cavities, typically three to sixteen depending on the article size and the required output. There are three sets of core rods, which allow concurrent preform injection, blow molding and ejection.

Stretch Blow Molding

Figure 6C:
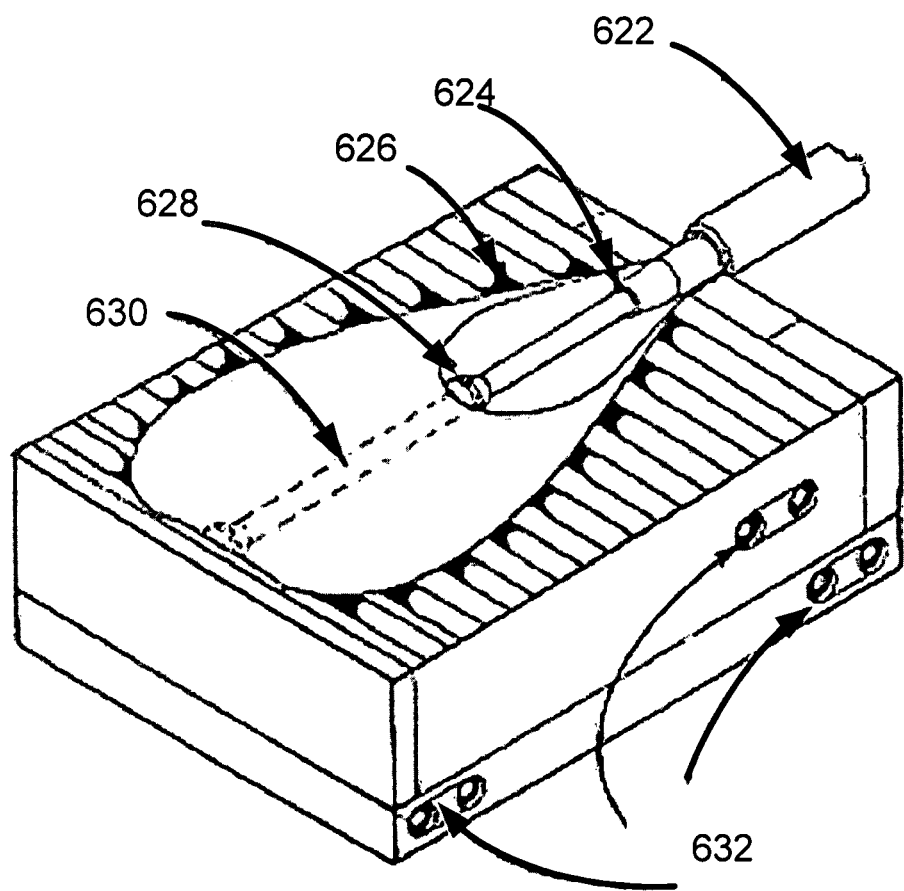
FIG. 6C illustrates a stretch blow molding method, in accordance with the prior art.

In the stretch blow molding (SBM) process, as depicted in FIG. 6C, the material is first molded into a "preform," e.g., 628 in FIG. 6C, using the injection molded process. A typical SBM system comprises a stretch blow pin (e.g., 622 in FIG. 6C), an air entrance (e.g., 624 in FIG. 6C), mold vents (e.g., 626 in FIG. 6C), a preform (e.g., 628 in FIG. 6C), and cooling channels (e.g., 632 in FIG. 6C). These preforms are produced with the necks of the bottles, including threads (the "finish") on one end. These preforms are packaged, and fed later, after cooling, into an EBM blow molding machine. In the SBM process, the preforms are heated, typically using infrared heaters, above their glass transition temperature, then blown using high pressure air into bottles using metal blow molds. Usually the preform is stretched with a core rod as part of the process (e.g., as in position 630 in FIG. 6C). The stretching of some polymers, such as PET (polyethylene terephtalate), results in strain hardening of the resin and thus allows the bottles to resist deforming under the pressures formed by carbonated beverages, which typically approach 60 psi.

FIG. 6C shows what happens inside the blow mold. The preform is first stretched mechanically with a stretch rod. As the rod travels down low-pressure air of 5 to 25 bar (70 to 350 psi) is introduced blowing a 'bubble'. Once the stretch rod is fully extended, high-pressure air of up to 40 bar (580 psi) blows the expanded bubble into the shape of the blow mold.

Plastic Tube Manufacturing.

In some embodiments, transparent tubular casing 310 is made of plastic rather than glass. Production of transparent tubular casing 310 in such embodiments differs from glass transparent tubular casing 310 production even though the basic molding mechanisms remain the same. A typical plastic transparent tubular casing 310 manufacturing process comprises the following steps: extrusion, heading, decorating, and capping, with the latter two steps being optional.

In some embodiments, transparent tubular casing 310 is made using extrusion molding. A mixture of resin is placed into an extruder hopper. The extruder is temperature controlled as the resin is fed through to ensure proper melt of the resin. The material is extruded through a set of sizing dies that are encapsulated within a right angle cross section attached to the extruder. The forming die controls the shape of transparent tubular casing 310. The formed plastic sleeve cools under blown air or in a water bath and hardens on a moving belt. After cooling step, the formed plastic sleeve is ready for cutting to a given length by a rotating knife.

The forming die controls the shape of the transparent tubular casing 310. In some embodiments in accordance with the present invention, as depicted in FIG. 14, the forming dies are custom-made such that the shape of transparent tubular casing 310 complements the shape of the solar cell unit 402. The forming die also controls the wall thickness of the transparent tubular casing 310. In some embodiments in accordance with the present invention, transparent tubular casing 310 has a wall thickness of 2 mm or thicker, 1 mm or thicker, 0.5 mm or thicker, 0.3 mm or thicker, or of any thickness between 0 and 0.3 mm.

During the production of one open-ended transparent tubular casing 310, the balance of the manufacturing process can be accomplished in one of three ways. The most common method in the United States is the "downs" process of compression, molding the head onto the tube. In this process, the sleeve is placed on a conveyor that takes it to the heading operation where the shoulder of the head is bound to the body of the tube while, at the same time, the thread is formed. The sleeve is then placed on a mandrel and transferred down to the slug pick-up station. The hot melt strip or slug is fused onto the end of the sleeve and then transferred onto the mold station. At this point, in one operation, the angle of the shoulder, the thread and the orifice are molded at the end of the sleeve. The head is then cooled, removed from the mold, and transferred into a pin conveyor. Two other heading methods are used in the United States and are found extensively worldwide: injection molding of the head to the sleeve, and an additional compression molding method whereby a molten donut of resin material is dropped into the mold station instead of the hot melt strip or slug. Transparent tubular casing 310 with one open-end are suitable to encase solar cell embodiments as depicted in FIG. 3, 4, 7, 8, 9, 10 or 11. Plastic tubing with both ends open may be used to encase solar cell embodiments as depicted in FIGS. 3 and 15.

The headed transparent tubular casing 310 is then conveyed to the accumulator. The accumulator is designed to balance the heading and decorating operation. From here, the transparent tubular casing 310 may go to the decorating operation. Inks for the press are premixed and placed in the fountains. At this point, the ink is transferred onto a plate by a series of rollers. The plate then comes in contact with a rubber blanket, picking up the ink and transferring it onto the circumference of the transparent tubular casing 310. The wet ink on the tube is cured by ultra-violet light or heat. In the embodiments in accordance with the present invention, transparency is required in the tube products so the color process is unnecessary. However, a similar method may be used to apply a protective coating to transparent tubular casing 310.

After decorating, a conveyor transfers the tube to the capping station where the cap is applied and torqued to the customer's specifications. The capping step is unnecessary for the scope of this invention.

Additional Glass Fabrication Methods.

Glass is a preferred material choice for transparent tubular casing 310 relative to plastics because glass provides a complete seal against molecular water from solar cell 402 and therefore provides protection and helps to maintain the performance and prolong the lifetime of solar cell 402. Similar to plastics, glass may be made into transparent tubular casing 310 using the standard blow molding technologies. In addition, techniques such as casting, extrusion, drawing, pressing, heat shrinking or other fabrication processes may also be applied to manufacture suitable glass transparent tubular casing 310 to circumferentially cover and/or encapsulate solar cells 402. Molding technologies, in particular micromolding technologies for microfabrication, are discussed in greater detail in Madou, *Fundamentals of Microfabrication*, Chapter 6, pp. 325-379, second edition, CRC Press, New York, 2002; *Polymer Engineering Principles: Properties, Processes, and Tests for Design*, Hanser Publishers, New York, 1993; and Lee, *Understanding Blow Molding*, first edition., Hanser Gardner Publications, Munich, Cincinnati, 2000, each of which is hereby incorporated herein by reference in its entirety.

5.1.2.2 Exemplary Materials for Transparent Tubular Casing

Transparent Tubular Casing Made of Glass.

In some embodiments, transparent tubular casing 310 is made of glass. In its pure form, glass is a transparent, relatively strong, hard-wearing, essentially inert, and biologically inactive material that can be formed with very smooth and impervious surfaces. The present invention contemplates a wide variety of glasses for transparent tubular casing 310, some of which are described in this section and others of which are know to those of skill in the relevant arts. Common glass contains about 70% amorphous silicon dioxide ($SiO_2$), which is the same chemical compound found in quartz, and its polycrystalline form, sand. Common glass is used in some embodiments of the present invention to make transparent tubular casing 310. However, common glass is brittle and will break into sharp shards. Thus, in some embodiments, the properties of common glass are modified, or even changed entirely, with the addition of other compounds or heat treatment.

Pure silica ($SiO_2$) has a melting point of about 2000° C., and can be made into glass for special applications (for example, fused quartz). Two other substances are always added to common glass to simplify processing. One is soda (sodium carbonate $Na_2CO_3$), or potash, the equivalent potassium compound, which lowers the melting point to about 1000° C. However, the soda makes the glass water-soluble, which is undesirable, so lime (calcium oxide, CaO) is the third component, added to restore insolubility. The resulting glass contains about 70% silica and is called a soda-lime glass. Soda-lime glass is used in some embodiments of the present invention to make transparent tubular casing 310.

Besides soda-lime, most common glass has other ingredients added to change its properties. Lead glass, such as lead crystal or flint glass, is more 'brilliant' because the increased refractive index causes noticeably more "sparkles", while boron may be added to change the thermal and electrical properties, as in Pyrex. Adding barium also increases the refractive index. Thorium oxide gives glass a high refractive index and low dispersion, and was formerly used in producing high-quality lenses, but due to its radioactivity has been replaced by lanthanum oxide in modern glasses. Large amounts of iron are used in glass that absorbs infrared energy, such as heat absorbing filters for movie projectors, while cerium(IV) oxide can be used for glass that absorbs UV wavelengths (biologically damaging ionizing radiation).

Glass having on or more of any of these additives is used in some embodiments of the present invention to make transparent tubular casing 310.

Common examples of glass material include but are not limited to aluminosilicate, borosilicate (e.g., Pyrex, Duran, Simax), dichroic, germanium/semiconductor, glass ceramic, silicate/fused silica, soda lime, quartz, chalcogenide/sulphide, cereated glass, and fluoride glass and transparent tubular casing 310 can be made of any of these materials.

In some embodiments, transparent tubular casing 310 is made of soda lime glass. Soda lime glass is softer than borosilicate and quartz, making scribe cutting easier and faster. Soda Lime glass is very low cost and easy to mass produce. However, Soda lime glass has poor thermal shock resistance. Thus, soda lime glass is best used for transparent tubular casing 310 in thermal environments where heating is very uniform and gradual. As a result, when solar cells 402 are encased by transparent tubular casing 310 made from soda lime glass, such cells are best used in environments where temperature does not drastically fluctuate.

In some embodiments, transparent tubular casing 310 are made of glass material such as borosilicate glass. Trade names for borosilicate glass include but are not limited to Pyrex® (Corning), Duran® (Schott Glass), and Simax® (Kavalier). Like most glasses, the dominant component of borosilicate glass is $SiO_2$ with boron and various other elements added. Borosilicate glass is easier to hot work than materials such as quartz, making fabrication less costly. Material cost for borosilicate glass is also considerably less than fused quartz. Compared to most glass, except fused quartz, borosilicate glass has low coefficient of expansion, three times less than soda lime glass. This makes borosilicate glass useful in thermal environments, without the risk of breakage due to thermal shock. Like soda lime glass, a float process can be used to make relatively low cost optical quality sheet borosilicate glass in a variety of thickness from less than 1 mm to over 30 mm thick. Relative to quartz, borosilicate glass is easily moldable. In addition, borosilicate glass has minimum devitrification when molding and flame working. This means high quality surfaces can be maintained when molding and slumping. Borosilicate glass is thermally stable up to 500° C. for continuous use. Borosilicate glass is also more resistant to non-fluorinated chemicals than household soda lime glass and mechanically stronger and harder than soda lime glass. Borosilicate is usually two to three times more expensive than soda lime glass.

Soda lime and borosilicate glass are only given as examples to illustrate the various aspects of consideration when using glass material to fabricate transparent tubular casing 310. The preceding discussion imposes no limitation to the scope of the invention. Indeed, transparent tubular casing 310 can be made with glass such as, for example, aluminosilicate, borosilicate (e.g., Pyrax®, Duran®, Simax®), dichroic, germanium/semiconductor, glass ceramic, silicate/fused silica, soda lime, quartz, chalcogenide/sulphide, cereated glass and/or fluoride glass.

Transparent Tubular Casing Made of Plastic.

In some embodiments, transparent tubular casing 310 is made of clear plastic. Plastics are a cheaper alternative to glass. However, plastic material is in general less stable under heat, has less favorable optical properties and does not prevent molecular water from penetrating through transparent tubular casing 310. The last factor, if not rectified, damages solar cells 402 and severely reduces their lifetime. Accordingly, in some embodiments, the water resistant layer described in Section 5.1.1. is used to prevent water seepage into the solar cells 402 when transparent tubular casing 310 is made of plastic.

A wide variety of materials can be used in the production of transparent tubular casing 310, including, but not limited to, ethylene vinyl acetate (EVA), perfluoroalkoxy fluorocarbon (PFA), nylon/polyamide, cross-linked polyethylene (PEX), polyolefin, polypropylene (PP), polyethylene terephtalate glycol (PETG), polytetrafluoroethylene (PTFE), thermoplastic copolymer (for example, ETFE®, which is a derived from the polymerization of ethylene and tetrafluoroethylene: TEFLON® monomers), polyurethane/urethane, polyvinyl chloride (PVC), polyvinylidene fluoride (PVDF), Tygon®, Vinyl, and Viton®.

5.1.2.3 Available Commercial Sources of Transparent Tubing Products

There are ample commercial sources for obtaining or custom manufacturing transparent tubular casing 310. Technologies for manufacturing plastic or glass tubing have been standardized and customized plastic or glass tubing are commercially available from numerous companies. A search on GlobalSpec database for "clear round plastic or glass tubing," a web center of engineering resources (www.globalspec.com; GlobalSpec Inc. Troy, N.Y.), results in over 950 catalog products. Over 180 companies make specialty pipe, tubing, hose and fittings. For example, Clippard Instrument Laboratory, Inc. (Cincinnati, Ohio) provides Nylon, Urethane or Plastic Polyurethane tubing that is as thin as 0.4 mm. Coast Wire & Plastic Tech., Inc. (Carson, Calif.) manufactures a comprehensive line of polyvinylidene fluoride clear round plastic tubing product under the trademark SUMIMARK™. Their product has a wall thickness as thin as 0.3 mm. Parker Hannifin/Fluid Connectors/Parflex Division (Ravenna, Ohio) provides vinyl, plastic polyurethane, polyether base, or polyurethane based clear plastic tubing of 0.8 mm or 1 mm thickness. Similar polyurethane products may also be found in Pneumadyne, Inc (Plymouth, Minn.). Saint-Gobain High-Performance Materials (U.S.A) further provides a line of 30 Tygon® tubing products of 0.8 mm in thickness. Vindum Engineering, Inc. (San Ramon, Calif.) also provides clear PFA Teflon tube of 0.8 mm in thickness. NewAge Industries, Inc. (Southampton, Pa.) provides 63 clear round plastic tubing products that have a wall thickness of 1 mm or thinner. In particular, VisiPak Extrusion (Arnold, Mo.), a division of Sinclair & Rush, Inc., provides clear round plastic tubing product as thin as 0.5 mm. Cleartec Packaging (St. Louis, Mo., a division of MOCAP Inc.) manufactures clear round plastic tubing as thin as 0.3 mm.

In addition, numerous companies can manufacture clear round plastic or glass tubing with customized specification such as even thinner wall. Some examples are Elasto Proxy Inc. (Boisbriand, Canada), Flex Enterprises, Inc. (Victor, N.Y.), Grob, Inc. (Grafton, Wis.), Mercer Gasket & Shim (Bellmawr, N.J.), New England Small Tube Corporation (Litchfield, N.H.), Precision Extrusion, Inc. (Glens Falls, N.Y.), and PSI Urethanes, Inc. (Austin, Tex.).

5.1.3 Integrating Solar Cells into Transparent Tubular Casings

In the present invention, gaps or spaces between transparent tubular casing 310 and solar cell 402 are eliminated in order to avoid adverse effects such as oxidation. Thus, in the present invention, there is no annular space between the inside wall of transparent tubular casing 310 and the outer wall of solar cell 402. In some embodiments (e.g., FIG. 3B), a filler layer 330 is provided to seal a solar cell unit 402 from adverse exposure to water or oxygen. In some embodiments, where transparent tubular casing 310 is made of glass and therefore exposure to water is no longer a concern, a filler layer 330 may be eliminated such that solar cells 402 directly contacts transparent tubular casing 310.

In some embodiments, custom-designed transparent tubular casing 310, made of either glass or plastics or other suitable transparent material, may be used to encase the corresponding embodiments of solar cell 402 to achieve tight fitting and better protection. FIG. 14 depicts exemplary embodiments of transparent tubular casing 310 that provides proper encapsulation to the solar cell embodiments depicted in FIGS. 4, 7, 8, 9, 10, 11 and 13.

Rod or cylindrical shaped solar cells 402, individually encased by transparent tubular casing 310 (for example those shown in FIGS. 3, 4, 7, 8, 9, 10, 13, and 15), can be assembled into solar cell assemblies of any shape and size. In some embodiments, the assembly can be bifacial arrays 400 (FIG. 4), 700 (FIG. 7), 800 (FIG. 8), 900 (FIG. 9), or 1000 (FIG. 10). There is no limit to the number of solar cells 402 in this plurality (e.g., 10 or more, 100 or more, 1000 or more, 10,000 or more, between 5,000 and one million solar cells 402, etc.).

Figure 7C:
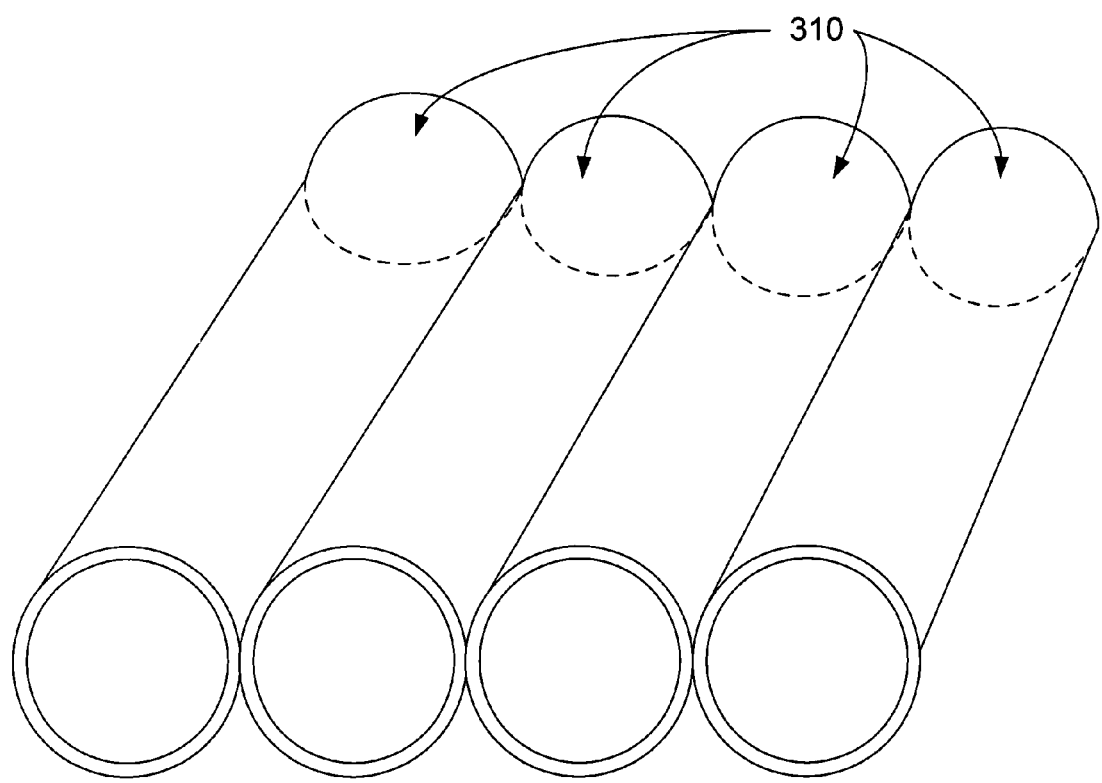
FIG. 7C is a perspective view an array of alternating tubular casings, in accordance with an embodiment of the present invention.

Alternatively, instead of being encapsulated individually and then being assembled together for example into planar arrays, solar cells 402 may also be encapsulated as arrays. For example, as depicted in FIG. 7C, multiple transparent tubular casings 310 may be manufactured as fused arrays. This method is advantageous in that little or no additional connection between the individual solar cells 402 is required. There is no limit to the number of transparent tubular casings 310 in the assembly as depicted in FIG. 7C (e.g., 10 or more, 100 or more, 1000 or more, 10,000 or more, between 5,000 and one million transparent tubular casings 310, etc.). A solar cell assembly is further completed by loading elongated solar cells 402 (for example 402 in FIG. 4A) into all or a portion of the transparent tubular casing 310 in the array of tubular casings.

5.1.3.1 Integrating Solar Cells Having a Filler Layer into Transparent Tubular Casings In some embodiments in accordance with the present invention, a solar cell 402 having a filler layer coated thereon is assembled into a transparent tubular casing 310. In some embodiments in accordance with the present invention, filler layer 330 comprises one or more of the properties of: electrical insulation, oxidation eliminating effect, water proofing, and/or physical protection of transparent conductive layer 412 of solar cell 402 during assembly of solar cell units.

Figure 20A:
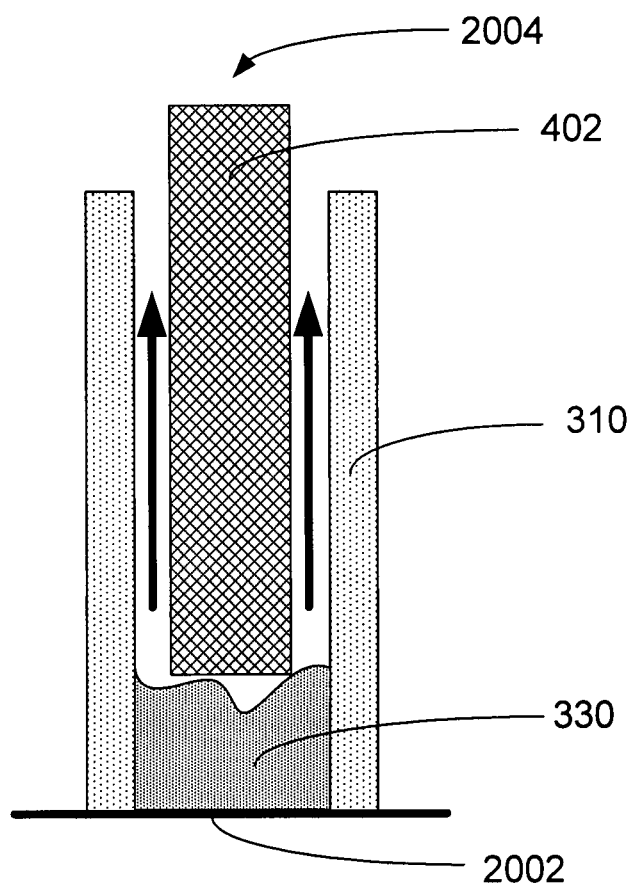
FIG. 20A illustrates a suction loading assembly method in accordance with the present invention.
Figure 22:
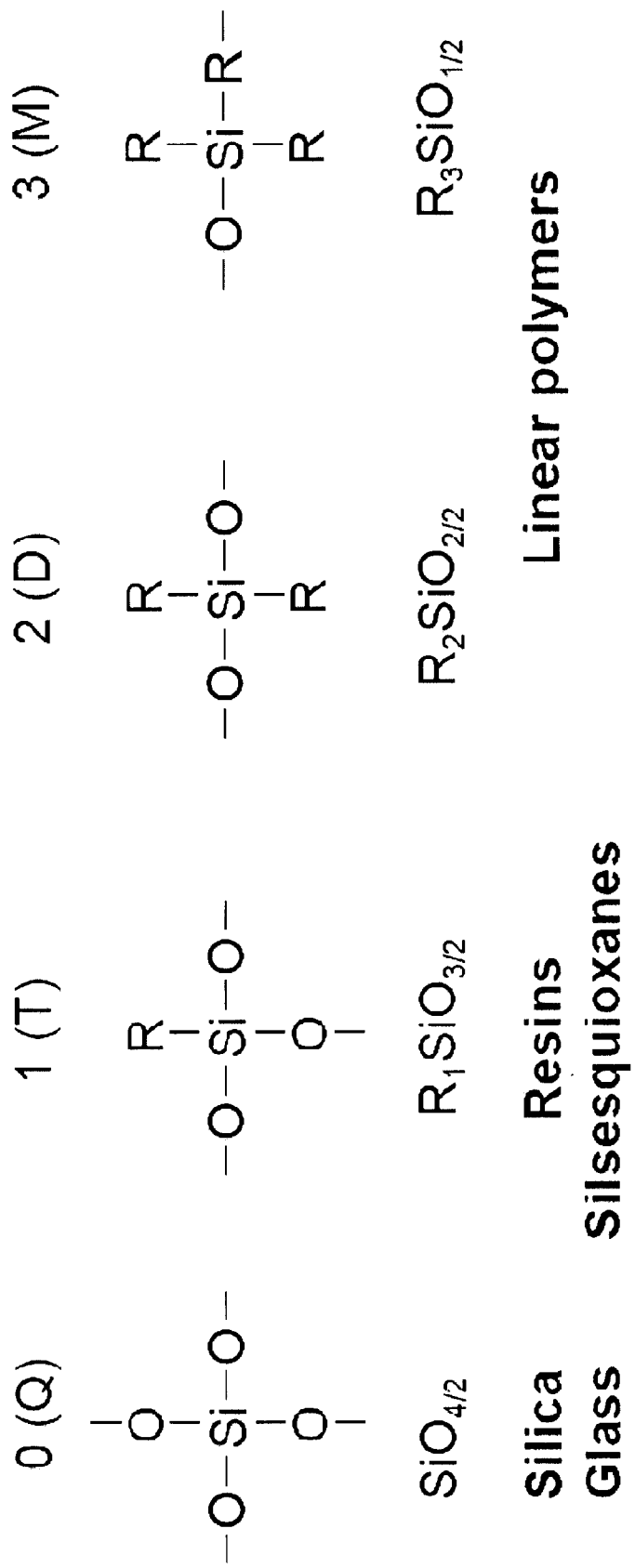
FIG. 22 illustrates Q-type silicone, silsequioxane, D-type silicon, and M-type silicon, in accordance with the prior art.

In some embodiments in accordance with the present invention, an elongated solar cell 402, optional filler layer 330, and a transparent tubular casing 310 are assembled using a suction loading method illustrated in FIG. 20A. Transparent tubular casing 310, made of transparent glass, plastics or other suitable material, is sealed at one end 2002. Materials that are used to form filler layer 330, for example, silicone gel, is poured into the sealed transparent tubular casing 310. An example of a silicone gel is Wacker SilGel® 612 (Wacker-Chemie GmbH, Munich, Germany). Wacker SilGel® 612 is a pourable, addition-curing, RTV-2 silicone rubber that vulcanizes at room temperature to a soft silicone gel. Still another example of a silicone gel is Sylgard® silicone elastomer (Dow Corning). Another example of a silicone gel is Wacker Elastosil® 601 (Wacker-Chemie GmbH, Munich, Germany). Wacker Elastosil® 601 is a pourable, addition-curing, RTV-2 silicone rubber. Referring to FIG. 22, silicones can be considered a molecular hybrid between glass and organic linear polymers. As shown in FIG. 22, if there are no R groups, only oxygen, the structure is inorganic silica glass (called a Q-type Si). If one oxygen is substituted with an R group (e.g. methyl, ethyl, phenyl, etc.) a resin or silsequioxane (T-type Si) material is formed. These silsequioxanes are more flexible than the Q-type materials. Finally, if two oxygen atoms are replaced by organic groups a very flexible linear polymer (D-type Si) is obtained. The last structure shown (M-type Si) has three oxygen atoms replaced by R groups, resulting in an end cap structure. Because the backbone chain flexibility is increasing as R groups are added, the modulus of the materials and their coefficients of thermal expansion (CTE) also change. In some embodiments of the present invention the silicone used to form filler layer is a Q-type silicone, a silsequioxane, a D-type silicon, or an M-type silicon. The elongated solar cell 402 is then loaded into transparent tubular casing 310. Optional suction force may be applied at the open end 2004 of transparent tubular casing 310 to draw the filler material upwards to completely fill the space between solar cell 402 and transparent tubular casing 310.

Figure 20B:
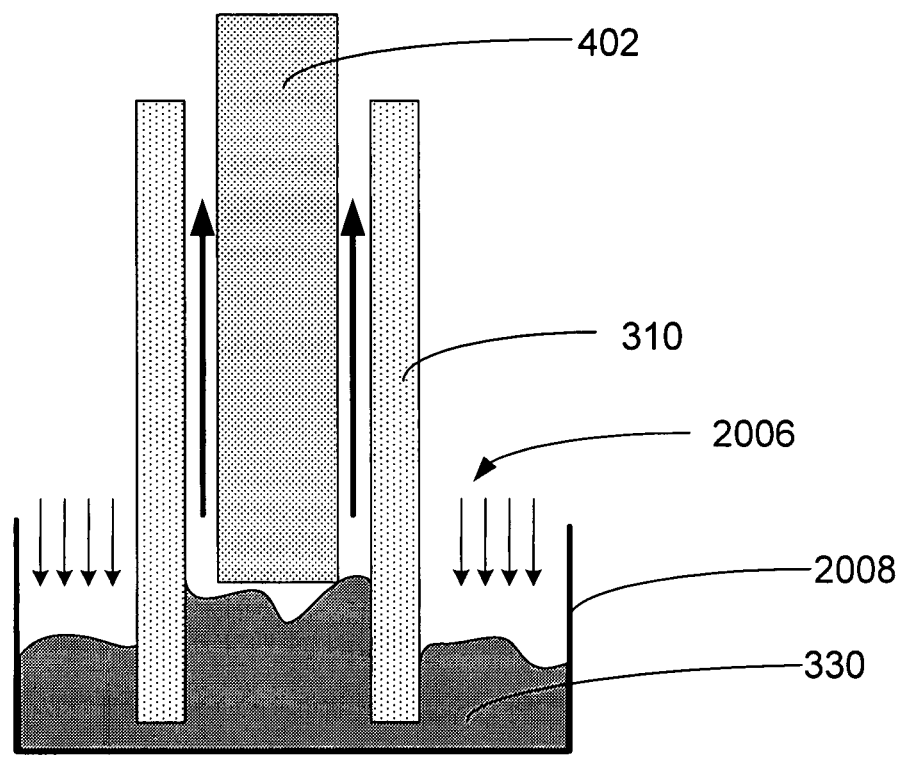
FIG. 20B illustrates a pressure loading assembly method in accordance with the present invention.

In some embodiments in accordance with the present invention, an elongated solar cell 402, filler layer 330, and a transparent tubular casing 310 may be assembled using the pressure loading method illustrated in FIG. 20B. Transparent tubular casing 310, made of transparent glass, plastics or other suitable material, is dipped in container 2008 containing optional filler layer material (e.g., silicone gel) used to form optional filler layer 330. Elongated solar cell 402 is then loaded into transparent tubular casing 310. Pressure force is applied at filler material surface 2006 to put the filler material upwards to completely fill the space between solar cell 402 and transparent tubular casing 310.

Figure 20C:
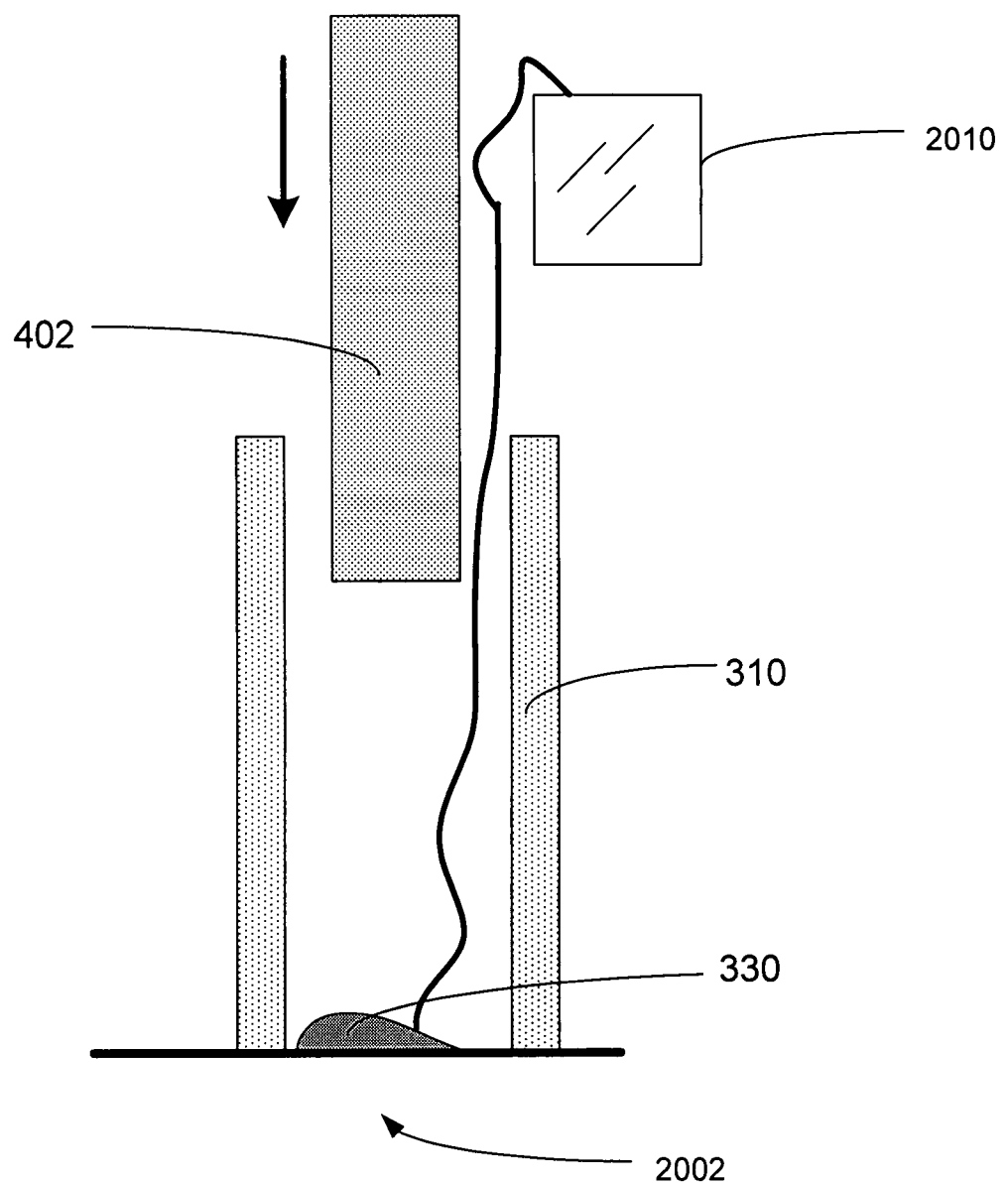
FIG. 20C illustrates a pour-and-slide loading assembly method in accordance with the present invention.

In yet other embodiments in accordance with the present invention, an elongated solar cell 402, filler layer 330 and a transparent tubular casing 310 is assembled using the pour-and-slide loading method depicted in FIG. 20C. A transparent tubular casing 310, made of transparent glass, plastics or other suitable material, is sealed at one end 2002. A container 2010, containing filler material (e.g., silicone gel), is used to pour the filler layer material into the sealed transparent tubular casing 310 while solar cell 402 is simultaneously slid into transparent tubular casing 310. The filler material that is being poured into transparent tubular casing 310 fills up the space between solar cell 402 and transparent tubular casing 310. Advantageously, the filler material that is being poured down the side of transparent tubular casing 310 provides lubrication to facilitate the slide-loading process.

5.1.3.2 Integrating Solar Cells without an Optional Filler Layer into Transparent Tubular Casings In some embodiments in accordance with the present invention, a tubular casing 310 is assembled onto solar cell 402 without a filler layer 330. In these embodiments, tubular casing 310 may directly contact solar cell 402. Tight packing and tubular casing 310 against solar cell 402 may be achieved by using one of the following methods. It will be appreciated that the methods for assembling a solar cell unit 300 described in this section can be used with solar cells 402 that are encased with a filler layer 330. However, in such embodiments, layer 330 must be deposited onto transparent conductive layer 412 of solar cells 402 prior to integrating the solar cell 402 with a transparent tubular casing.

Heat Shrink Loading.

In some embodiments, transparent tubular casing 310 heat shrinked onto solar cell 402. The heat shrink method may be used to form both plastic and glass transparent tubular casings 310. For example, heat-shrinkable plastic tubing made of polyolefin, fluoropolymer (PVC, FEP, PTFE, Kynar® PVDF), chlorinated polyolefin (Neoprene) and highly flexible elastomer (Viton®) heat-shrinkable tubing may be used to form transparent tubular casing 310. Among such materials, fluoropolymers offer increased lubricity for easy sliding, and low moisture absorption for enhanced dimensional stability. Three such materials are commercially accessible: PTFE (polytetrafluoroethylene), FEP (fluorinated ethylene propylene) and PVDF (polyvinylidene fluoride, tradename Kynar®). Transparent heat-shrinkable plastic tubing is available. In some embodiments, the heat shrink tubing is available in an expandable range of 2:1 to 3:1. In some embodiments, the heat shrink ratio of the tubing material is smaller than 2:1, for example, fluorinated ethylene-propylene (FEP) at 1.3:1. In other embodiments, a heat shrink tubing suitable for the manufacture of transparent tubular casing 310 may have heat shrink ratio greater than 3:1.

Injection Molding to Construct Transparent Tubular Casing.

Figure 21:
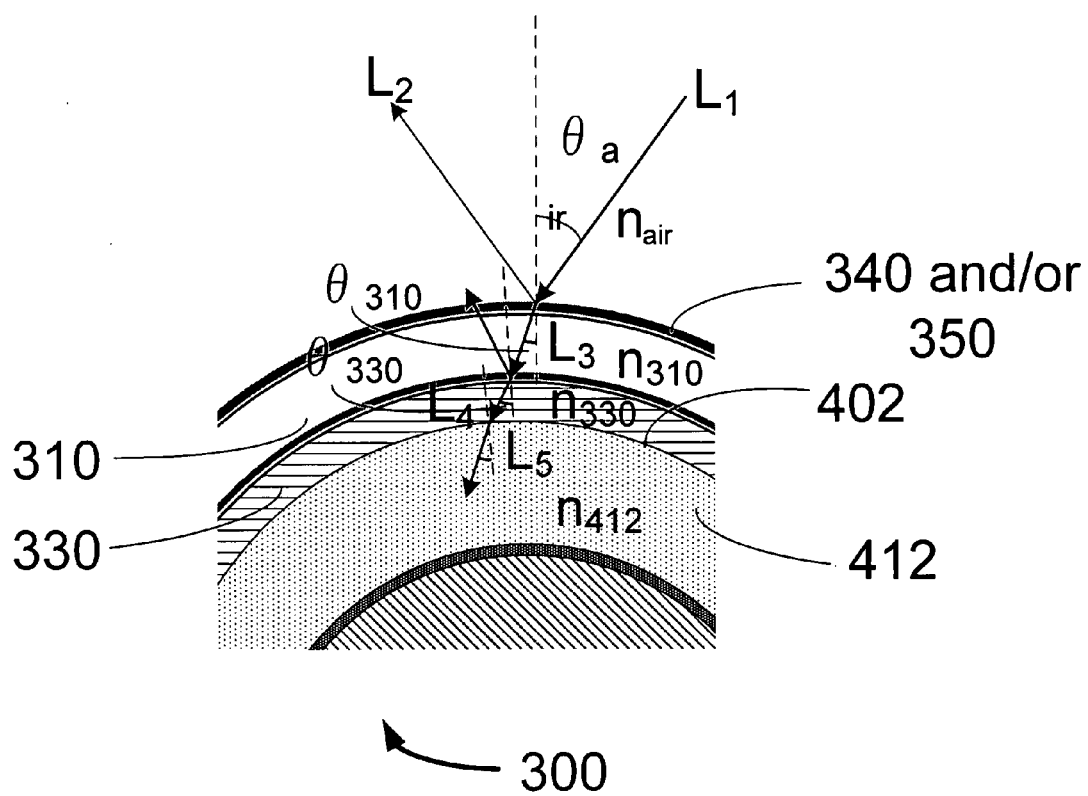
FIG. 21 illustrates a partial cross-sectional view of an elongated solar cell in a transparent tubular casing, in accordance with an embodiment of the present invention.

In some embodiments, transparent tubular casing 310 may be circumferentially disposed onto solar cell 402 by using the method of injection molding. A more detailed description of the method is already included above. In these embodiments, solar cells 402 may be used as the preformed mold and transparent tubular casing 310 (e.g., made of plastic material) is directly formed on the outer surface of solar cells 402. Plastic material does not completely seal molecular water from solar cells 402. Because water interferes with the function of a solar cell 402, it is therefore important to make the solar cell 402 resistant to water. In the embodiments where plastic transparent tubular casings 310 are used to cover solar cells 402, this is accomplished by covering either the solar cell 402 or transparent tubular casing 310 with one or more layers of transparent water-resistant coating 340 (FIG. 21). In some embodiments, both solar cell 402 and transparent tubular casing 310 are coated with one or more layers of transparent water-resistant coating 340 to extend the functional life time of the solar cell unit 300. In other embodiments, an optional antireflective coating 350 is also disposed on transparent tubular casing 310 to maximize solar cell efficiency.

Liquid Coating Followed by Polymerization.

In some embodiments, solar cell 402 is dipped in a liquid-like suspension or resin and subsequently exposed to catalyst or curing agent to form transparent tubular casing 310 through a polymerization process. In such embodiments, materials used to form transparent tubular casing 310 comprise silicone, poly-dimethyl siloxane (PDMS), silicone gel, epoxy, acrylics, and any combination or variation thereof.

5.1.4 Optical and Chemical Properties of the Materials for Transparent Tubular Casing and the Optional Filler Layer In order to maximize input of solar radiation, any layer outside a solar cell 402 (for example, optional filler layer 330 or transparent tubular casing 310) should not adversely affect the properties of incident radiation on the solar cell. There are multiple factors to consider in optimizing the efficiency of solar cells 402. A few significant factors will be discussed in detail in relation to solar cell production.

Transparency.

In order to establish maximized input into solar cell absorption layer (e.g., semiconductor junction 410), absorption of the incident radiation by any layer outside a solar cell 402 should be avoided or minimized. This transparency requirement varies as a function of the absorption properties of the underlying semiconductor junction 410 of solar cells 402. In general, transparent tubular casing 310 and optional filler layer 330 should be as transparent as possible to the wavelengths absorbed by the semiconductor junction 410. For example, when the semiconductor junction 410 is based on CIGS, materials used to make transparent tubular casing 310 and optional filer layer 330 should be transparent to light in the 500 nm to 1200 nm wavelength range.

Ultraviolet Stability.

Any material used to construct a layer outside solar cell 402 should be chemically stable and, in particular, stable upon exposure to UV radiation. More specifically, such material should not become less transparent upon UV exposure. Ordinary glass partially blocks UVA (wavelengths 400 and 300 nm) and it totally blocks UVC and UVB (wavelengths lower than 300 nm). The UV blocking effect of glass is usually due additives, e.g. sodium carbonate, in glass. In some embodiments, additives in transparent tubular casings 310 made of glass can render the casing 310 entirely UV protective. In such embodiments, because the transparent tubular casing 310 provides complete protection from UV wavelengths, the UV stability requirements of the underlying optional filler layer 330 are reduced. For example, EVA, PVB, TPU (urethane), silicones, polycarbonates, and acrylics can be adapted to form a filler layer 330 when transparent tubular casing 310 is made of UV protective glass. Alternatively, in some embodiments, where transparent tubular casing 310 is made of plastic material, UV stability requirement should be strictly followed.

Plastic materials that are sensitive to UV radiation should not be used as transparent tubular casing 310 because yellowing of the material and/or optional filler layer 330 blocks radiation input into the solar cells 402 and reduces their efficiency. In addition, cracking of transparent tubular casing 310 due to UV exposure permanently damages solar cells 402. For example, fluoropolymers like ETFE, and THV (Dyneon) are UV stable and highly transparent, while PET is transparent, but not sufficiently UV stable. In some embodiments, transparent tubular casing 310 is made of fluoropolymer based on monomers of tetrafluoroethylene, hexafluoropropylene and vinylidene fluoride. In addition, polyvinyl chloride ("PVC" or "vinyl"), one of the most common synthetic materials, is also sensitive to UV exposure. Methods have been developed to render PVC UV-stabilized, but even UV stabilized PVC is typically not sufficiently durable (for example, yellowing and cracking of PVC product will occur over relative short term usage). Urethanes are better suited, but depend on the exact chemical nature of the polymer backbone. Urethane material is stable when the polymer backbone is formed by less reactive chemical groups (e.g., aliphatic or aromatic). On the other hand when the polymer backbone is formed by more reactive groups (e.g., double bonds), yellowing of the material occurs as a result of UV-catalyzed breakdown of the double bonds. Similarly, EVA will yellow and so will PVB upon continued exposure to UV light. Other options are polycarbonate (can be stabilized against UV for up to 10 years OD exposure) or acrylics (inherently UV stable).

Reflective Properties.

Referring to FIG. 21, an incident beam $L_1$ hits the surface of transparent tubular casing 310. Part of the incident beam $L_1$ is reflected as $L_2$ while the remainder of incident beam $L_1$ (e.g., as refracted beam $L_3$ in FIG. 21) travels through transparent tubular casing 310. In some embodiments in accordance with the present invention, the refracted beam $L_3$ directly hits transparent conductive layer 412 of solar cell 402 (e.g., when optional filler layer 330 is absent). Alternatively, when filler layer 330 is present, as depicted in FIG. 21, $L_3$ hits the outer surface of the filler layer 330, and the processes of reflection and refraction is repeated as it was when $L_1$ hit the surface of transparent tubular casing 310, with some of $L_3$ reflected into filler layer 330 and some of $L_3$ refracted by filler layer 330.

In order to maximize input of solar radiation, reflection at the outer surface of transparent tubular casing 310 should be minimized. Antireflective coating, either as a separate layer 350 or in combination with the water resistant coating 340, may be applied on the outside of transparent tubular casing 310. In some embodiments, this antireflective coating is made of $MgF_2$. In some embodiments, this antireflective coating is made of silicon nitrate or titanium nitrate. In other embodiments, this antireflective coating is made of one or more layers of silicon monoxide (SiO). For example, shiny silicon can act as a mirror and reflects more than thirty percent of the light that shines on it. A single layer of SiO reduces surface reflection to about ten percent, and a second layer of SiO can lower the reflection to less than four percent. Other organic antireflective materials, in particular, one which prevents back reflection from the surface of or lower layers in the semiconductor device and eliminates the standing waves and reflective notching due to various optical properties of lower layers on the wafer and the photosensitive film, are disclosed in U.S. Pat. No. 6,803,172, which is hereby incorporated by reference herein in its entirety. Additional antireflective coating materials and methods are disclosed in U.S. Pat. Nos. 6,689,535; 6,673,713; 6,635,583; 6,784,094; and 6,713,234, each of which is hereby incorporated herein by reference in its entirety.

Alternatively, the outer surface of transparent tubular casing 310 may be textured to reduce reflected radiation. Chemical etching creates a pattern of cones and pyramids, which capture light rays that might otherwise be deflected away from the cell. Reflected light is redirected down into the cell, where it has another chance to be absorbed. Material and methods for creating an anti-reflective layer by etching or by a combination of etching and coating techniques are disclosed in U.S. Pat. Nos. 6,039,888; 6,004,722; and 6,221,776; each of which is hereby incorporated herein by reference in its entirety.

Refractive Properties.

As depicted in FIG. 21, part of incident beam $L_1$ is refracted as refracted beam $L_3$. How much and to which direction incident beam $L_1$ is bent from its path is determined by the refractive indices of the media in which beams $L_1$ and $L_3$ travel. Snell's law specifies:

$$\eta_1 \sin(\theta_1) = \eta_2 \sin(\theta_2),$$

where $\eta_1$ and $\eta_2$ are the refractive indices of the two bordering media 1 and 2 while $\theta_1$ and $\theta_2$ represent the angle of incidence and the angle of refraction, respectively.

In FIG. 21, the first refraction process occurs when incident beam $L_1$ travels from air through transparent tubular casing 310 as $L_3$. Ambient air has a refractive index around 1 (vacuum space has a refractive index of 1, which is the smallest among all known materials), which is much smaller than the refractive index of glass material (ranging from 1.4 to 1.9 with the commonly used material having refractive indices around 1.5) or plastic material (around 1.45). Because $\eta_{air}$ is always much smaller than $\eta_{310}$ whether tubular casing is formed by glass or plastic material, the refractive angle $\theta_{310}$ is always much smaller than the incident angle $\theta_{air}$, i.e., the incident beam is always bent towards solar cell 402 as it travels through transparent tubular casing 310.

In the presence of a filler layer 330, beam $L_3$ becomes the new incident beam when it travels through the filler layer 330. Ideally, according to Snell's law and the preceding analysis, the refractive index of the filler layer 330 (e.g., $\eta_{310}$ in FIG. 21) should be larger than the refractive index of transparent tubular casing 310 so that the refracted beam of incident beam $L_3$ will also be bent towards solar cell 402. In this ideal situation, every incident beam on transparent tubular casing 310 will be bent towards solar cell 402 after two reflection processes. In practice, however, optional filler layer 330 is made of a fluid-like material (albeit sometimes very viscous fluid-like material) such that loading of solar cells 402 into transparent tubular casing 310 may be achieved as described above. In practice, efficient solar radiation absorption is achieved by choosing filler material that has refractive index close to those of transparent tubular casing 310. In some embodiments, materials that form transparent tubular casing 310 comprise transparent materials (either glass or plastic or other suitable materials) with refractive indices around 1.5. For example, fused silica glass has a refractive index of 1.46. Borosilicate glass materials have refractive indices between 1.45 and 1.55 (e.g., Pyrex® glass has a refractive index of 1.47). Flint glass materials with various amounts of lead additive have refractive indices between 1.5 and 1.9. Common plastic materials have refractive indices between 1.46 and 1.55.

Exemplary materials with the appropriate optical properties for forming filler layer 330 further comprise silicone, polydimethyl siloxane (PDMS), silicone gel, epoxy, and acrylic material. Because silicone-based adhesives and sealants have a high degree of flexibility, they lack the strength of other epoxy or acrylic resins. Transparent tubular casing 310, optional filler layer 330, optional antireflective layer 350, water-resistant layer 340, or any combination thereof form a package to maximize and maintain solar cell 402 efficiency, provide physical support, and prolong the life time of solar cell units 402.

In some embodiments, glass, plastic, epoxy or acrylic resin may be used to form transparent tubular casing 310. In some embodiments, optional antireflective 350 and/or water resistant coating 340 are circumferentially disposed on transparent tubular casing 310. In some such embodiments, filler layer 330 is formed by softer and more flexible optically suitable material such as silicone gel. For example, in some embodiments, filler layer 330 is formed by a silicone gel such as a silicone-based adhesives or sealants. In some embodiments, filler layer 330 is formed by GE RTV 615 Silicone. RTV 615 is an optically clear, two-part flowable silicone product that requires SS4120 as primer for polymerization. (RTV615-1P), both available from General Electric (Fairfield, Conn.). Silicone-based adhesives or sealants are based on tough silicone elastomeric technology. The characteristics of silicone-based materials, such as adhesives and sealants, are controlled by three factors: resin mixing ratio, potting life and curing conditions.

Advantageously, silicone adhesives have a high degree of flexibility and very high temperature resistance (up to 600° F.). Silicone-based adhesives and sealants have a high degree of flexibility. Silicone-based adhesives and sealants are available in a number of technologies (or cure systems). These technologies include pressure sensitive, radiation cured, moisture cured, thermo-set and room temperature vulcanizing (RTV). In some embodiments, the silicone-based sealants use two-component addition or condensation curing systems or single component (RTV) forms. RTV forms cure easily through reaction with moisture in the air and give off acid fumes or other by-product vapors during curing.

Pressure sensitive silicone adhesives adhere to most surfaces with very slight pressure and retain their tackiness. This type of material forms viscoelastic bonds that are aggressively and permanently tacky, and adheres without the need of more than finger or hand pressure. In some embodiments, radiation is used to cure silicone-based adhesives. In some embodiments, ultraviolet light, visible light or electron bean irradiation is used to initiate curing of sealants, which allows a permanent bond without heating or excessive heat generation. While UV-based curing requires one substrate to be UV transparent, the electron beam can penetrate through material that is opaque to UV light. Certain silicone adhesives and cyanoacrylates based on a moisture or water curing mechanism may need additional reagents properly attached to the solar cell 402 without affecting the proper functioning of solar cells 402. Thermo-set silicone adhesives and silicone sealants are cross-linked polymeric resins cured using heat or heat and pressure. Cured thermo-set resins do not melt and flow when heated, but they may soften. Vulcanization is a thermosetting reaction involving the use of heat and/or pressure in conjunction with a vulcanizing agent, resulting in greatly increased strength, stability and elasticity in rubber-like materials. RTV silicone rubbers are room temperature vulcanizing materials. The vulcanizing agent is a cross-linking compound or catalyst. In some embodiments in accordance with the present invention, sulfur is added as the traditional vulcanizing agent.

In some embodiments, for example, when optional filler layer 330 is absent, epoxy or acrylic material may be applied directly over solar cell 402 to form transparent tubular casing 310 directly. In such embodiments, care is taken to ensure that the non-glass transparent tubular casing 310 is also equipped with water resistant and/or antireflective properties to ensure efficient operation over a reasonable period of usage time.

Electrical Insulation.

An important characteristics of transparent tubular casing 310 and optional filler layer 330 is that these layers should provide complete electrical insulation. No conductive material should be used to form either transparent tubular casing 310 or optional filler layer 330.

Dimension Requirement.

The combined width of each of the layers outside solar cell 402 (e.g., the combination of transparent tubular casing 310 and/or optional filler 20, layer 330) in some embodiments is:

$$r_i \geq \frac{r_o}{\eta_{outer\,ring}}$$

where, referring to FIG. 3B, $r_i$ is the radius of solar cell 402, assuming that semiconductor junction 410 is a thin-film junction;

$r_o$ is the radius of the outermost layer of transparent tubular casing 310 and/or optional filler layer 330; and $\eta_{outer\,ring}$ is the refractive index of the outermost layer of transparent tubular casing 310 and/or optional filler layer 330. As noted above, the refractive index of many of the materials used to make transparent tubular casing 310 and/or optional filler layer 330 is about 1.5. Thus, in typical embodiments, values of $r_o$ are permissible that are less than $1.5 \ast r_i$. This constraint places a boundary on allowable thickness for the combination of transparent tubular casing 310 and/or optional filler layer 330.

5.1.3.5 Additional Methods for Forming Transparent Tubular Casing

In some embodiments, transparent tubular casing 310 is formed on an underlying layer (e.g., is formed on transparent conductive layer 412, filler layer 330 or a water resistant layer) by spin coating, dip coating, plastic spraying, casting, Doctor's blade or tape casting, glow discharge polymerization, or UV curing. These technologies are discussed in greater detail in Madou, *Fundamentals of Microfabrication*, Chapter 3, pp. 159-161, second edition, CRC Press, New York, 2002, which is hereby incorporated by reference in its entirety. Casting is particularly suitable in instances where transparent tubular casing 310 is formed from acrylics or polycarbonates. UV curing is particularly suitable in instances where transparent tubular casing 310 is formed from an acrylic.

5.2 Exemplary Semiconductor Junctions

Figure 5A:
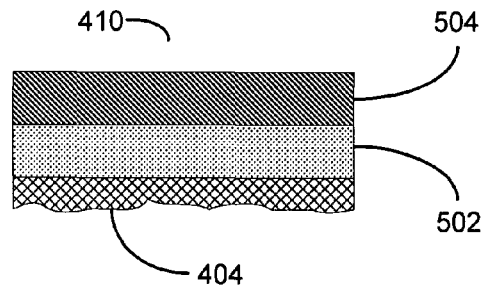
FIGS. 5A-5D illustrate semiconductor junctions that are used in various elongated solar cells in various embodiments of the present invention.

Referring to FIG. 5A, in one embodiment, semiconductor junction 410 is a heterojunction between an absorber layer 502, disposed on back-electrode 404, and a junction partner layer 504, disposed on absorber layer 502. Layers 502 and 504 are composed of different semiconductors with different band gaps and electron affinities such that junction partner layer 504 has a larger band gap than absorber layer 502. In some embodiments, absorber layer 502 is p-doped and junction partner layer 504 is n-doped. In such embodiments, transparent conductive layer 412 is $n^+$-doped. In alternative embodiments, absorber layer 502 is n-doped and junction partner layer 504 is p-doped. In such embodiments, transparent conductive layer 412 is $p^+$-doped. In some embodiments, the semiconductors listed in Pandey, *Handbook of Semiconductor Electrodeposition*, Marcel Dekker Inc., 1996, Appendix 5, which is hereby incorporated by reference herein in its entirety, are used to form semiconductor junction 410.

5.2.1 Thin-Film Semiconductor Junctions Based on Copper Indium Diselenide and Other Type I-III-VI Materials Continuing to refer to FIG. 5A, in some embodiments, absorber layer 502 is a group I-III-VI$_2$ compound such as copper indium di-selenide (CuInSe$_2$; also known as CIS). In some embodiments, absorber layer 502 is a group I-III-VI$_2$ ternary compound selected from the group consisting of CdGeAs$_2$, ZnSnAs$_2$, CuInTe$_2$, AgInTe$_2$, CuInSe$_2$, CuGaTe$_2$, ZnGeAs$_2$, CdSnP$_2$, AgInSe$_2$, AgGaTe$_2$, CuInS$_2$, CdSiAs$_2$, ZnSnP$_2$, CdGeP$_2$, ZnSnAs$_2$, CuGaSe$_2$, AgGaSe$_2$, AgInS$_2$, ZnGeP$_2$, ZnSiAs$_2$, ZnSiP$_2$, CdSiP$_2$, or CuGaS$_2$ of either the p-type or the n-type when such compound is known to exist.

In some embodiments, junction partner layer 504 is CdS, ZnS, ZnSe, or CdZnS. In one embodiment, absorber layer 502 is p-type CIS and junction partner layer 504 is $n^-$ type CdS, ZnS, ZnSe, or CdZnS. Such semiconductor junctions 410 are described in Chapter 6 of Bube, *Photovoltaic Materials,* 1998, Imperial College Press, London, which is hereby incorporated by reference in its entirety. Such semiconductor junctions 410 are described in Chapter 6 of Bube, *Photovoltaic Materials,* 1998, Imperial College Press, London, which is hereby incorporated by reference in its entirety.

In some embodiments, absorber layer 502 is copper-indium-gallium-diselenide (CIGS). Such a layer is also known as Cu(InGa)Se$_2$. In some embodiments, absorber layer 502 is copper-indium-gallium-diselenide (CIGS) and junction partner layer 504 is CdS, ZnS, ZnSe, or CdZnS. In some embodiments, absorber layer 502 is p-type CIGS and junction partner layer 504 is n-type CdS, ZnS, ZnSe, or CdZnS. Such semiconductor junctions 410 are described in Chapter 13 of *Handbook of Photovoltaic Science and Engineering*, 2003, Luque and Hegedus (eds.), Wiley & Sons, West Sussex, England, Chapter 12, which is hereby incorporated by reference in its entirety. In some embodiments, CIGS is deposited using techniques disclosed in Beck and Britt, Final Technical Report, January 2006, NREL/SR-520-39119; and Delahoy and Chen, August 2005, "Advanced CIGS Photovoltaic Technology," subcontract report; Kapur et al., January 2005 subcontract report, NREL/SR-520-37284, "Lab to Large Scale Transition for Non-Vacuum Thin Film CIGS Solar Cells"; Simpson et al., October 2005 subcontract report, "Trajectory-Oriented and Fault-Tolerant-Based Intelligent Process Control for Flexible CIGS PV Module Manufacturing," NREL/SR-520-38681; and Ramanathan et al., 31$^{st}$ IEEE Photovoltaics Specialists Conference and Exhibition, Lake Buena Vista, Fla., Jan. 3-7, 2005, each of which is hereby incorporated by reference herein in its entirety.

In some embodiments CIGS absorber layer 502 is grown on a molybdenum back-electrode 404 by evaporation from elemental sources in accordance with a three stage process described in Ramanthan et al., 2003, "Properties of 19.2% Efficiency ZnO/CdS/CuInGaSe$_2$ Thin-film Solar Cells," Progress in Photovoltaics: Research and Applications 11, 225, which is hereby incorporated by reference herein in its entirety. In some embodiments layer 504 is a ZnS(O,OH) buffer layer as described, for example, in Ramanathan et al., Conference Paper, "CIGS Thin-Film Solar Research at NREL: FY04 Results and Accomplishments," NREL/CP-520-37020, January 2005, which is hereby incorporated by reference herein in its entirety.

In some embodiments, layer 502 is between 0.5 μm and 2.0 μm thick. In some embodiments, the composition ratio of Cu/(In+Ga) in layer 502 is between 0.7 and 0.95. In some embodiments, the composition ratio of Ga/(In+Ga) in layer 502 is between 0.2 and 0.4. In some embodiments the CIGS absorber has a <110> crystallographic orientation. In some embodiments the CIGS absorber has a <112> crystallographic orientation. In some embodiments the CIGS absorber is randomly oriented.

Figure 5B:
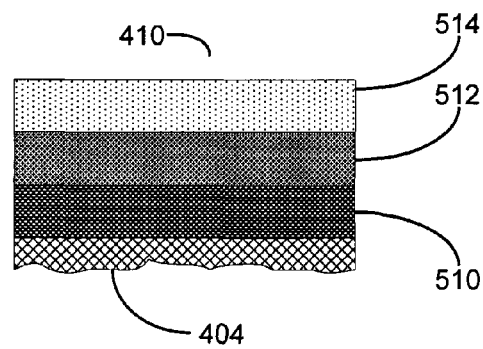
Figure 5C:
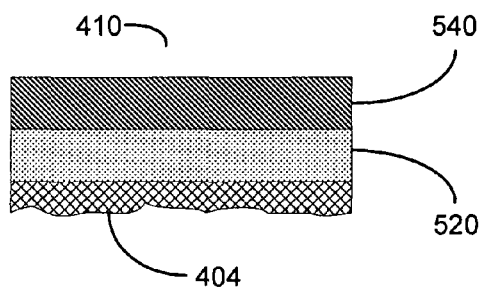
Figure 5D:
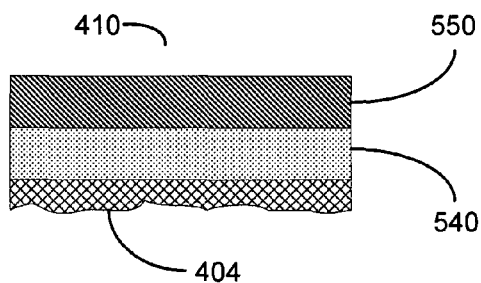

5.2.2 Semiconductor Junctions Based on Amorphous Silicon or Polycrystalline Silicon In some embodiments, referring to FIG. 5B, semiconductor junction 410 comprises amorphous silicon. In some embodiments this is an n/n type heterojunction. For example, in some embodiments, layer 514 comprises SnO$_2$(Sb), layer 512 comprises undoped amorphous silicon, and layer 510 comprises n+ doped amorphous silicon.

In some embodiments, semiconductor junction 410 is a p-i-n type junction. For example, in some embodiments, layer 514 is p$^+$ doped amorphous silicon, layer 512 is undoped amorphous silicon, and layer 510 is n$^+$ amorphous silicon. Such semiconductor junctions 410 are described in Chapter 3 of Bube, *Photovoltaic Materials*, 1998, Imperial College Press, London, which is hereby incorporated by reference in its entirety.

In some embodiments of the present invention, semiconductor junction 410 is based upon thin-film polycrystalline. Referring to FIG. 5B, in one example in accordance with such embodiments, layer 510 is a p-doped polycrystalline silicon, layer 512 is depleted polycrystalline silicon and layer 514 is n-doped polycrystalline silicon. Such semiconductor junctions are described in Green, *Silicon Solar Cells: Advanced Principles & Practice*, Centre for Photovoltaic Devices and Systems, University of New South Wales, Sydney, 1995; and Bube, *Photovoltaic Materials*, 1998, Imperial College Press, London, pp. 57-66, which is hereby incorporated by reference in its entirety.

In some embodiments of the present invention, semiconductor junctions 410 based upon p-type microcrystalline Si:H and microcrystalline Si:C:H in an amorphous Si:H solar cell are used. Such semiconductor junctions are described in Bube, *Photovoltaic Materials*, 1998, Imperial College Press, London, pp. 66-67, and the references cited therein, which is hereby incorporated by reference in its entirety.

In some embodiments, of the present invention, semiconductor junction 410 is a tandem junction. Tandem junctions are described in, for example, Kim et al., 1989, "Lightweight (AlGaAs)GaAs/CuInSe2 tandem junction solar cells for space applications," Aerospace and Electronic Systems Magazine, IEEE Volume 4, Issue 11, November 1989 Page(s):23-32; Deng, 2005, "Optimization of a-SiGe based triple, tandem and single-junction solar cells Photovoltaic Specialists Conference, 2005 Conference Record of the Thirty-first IEEE 3-7 Jan. 2005 Page(s): 1365-1370; Arya et al., 2000, Amorphous silicon based tandem junction thin-film technology: a manufacturing perspective," Photovoltaic Specialists Conference, 2000. Conference Record of the Twenty-Eighth IEEE 15-22 Sep. 2000 Page(s):1433-1436; Hart, 1988, "High altitude current-voltage measurement of GaAs/Ge solar cells," Photovoltaic Specialists Conference, 1988, Conference Record of the Twentieth IEEE 26-30 September 1988 Page(s):764-765 vol. 1; Kim, 1988, "High efficiency GaAs/CuInSe2 tandem junction solar cells," Photovoltaic Specialists Conference, 1988, Conference Record of the Twentieth IEEE 26-30 Sep. 1988 Page(s):457-461 vol. 1; Mitchell, 1988, "Single and tandem junction CuInSe2 cell and module technology," Photovoltaic Specialists Conference, 1988., Conference Record of the Twentieth IEEE 26-30 Sep. 1988 Page(s):1384-1389 vol. 2; and Kim, 1989, "High specific power (AlGaAs)GaAs/CuInSe2 tandem junction solar cells for space applications," Energy Conversion Engineering Conference, 1989, IECEC-89, Proceedings of the 24$^{th}$ Intersociety 6-11 Aug. 1989 Page(s):779-784 vol. 2, each of which is hereby incorporated by reference herein in its entirety.

5.2.3 Semiconductor Junctions Based on Gallium Arsenide and Other Type III-V Materials In some embodiments, semiconductor junctions 410 are based upon gallium arsenide (GaAs) or other III-V materials such as InP, AlSb, and CdTe. GaAs is a direct-band gap material having a band gap of 1.43 eV and can absorb 97% of AM1 radiation in a thickness of about two microns. Suitable type III-V junctions that can serve as semiconductor junctions 410 of the present invention are described in Chapter 4 of Bube, *Photovoltaic Materials*, 1998, Imperial College Press, London, which is hereby incorporated by reference in its entirety.

Furthermore, in some embodiments semiconductor junction 410 is a hybrid multijunction solar cell such as a GaAs/Si mechanically stacked multijunction as described by Gee and Virshup, 1988, 20$^{th}$ *IEEE Photovoltaic Specialist Conference*, IEEE Publishing, N.Y., p. 754, which is hereby incorporated by reference herein in its entirety, a GaAs/CuInSe$_2$ MSMJ four-terminal device, consisting of a GaAs thin film top cell and a ZnCdS/CuInSe$_2$ thin bottom cell described by Stanbery et al., 19$^{th}$ *IEEE Photovoltaic Specialist Conference*, IEEE Publishing, New York, p. 280, and Kim et al., 20$^{th}$ *IEEE Photovoltaic Specialist Conference*, IEEE Publishing, New York, p. 1487, each of which is hereby incorporated by reference herein in its entirety. Other hybrid multijunction solar cells are described in Bube, *Photovoltaic Materials*, 1998, Imperial College Press, London, pp. 131-132, which is hereby incorporated by reference herein in its entirety.

5.2.4 Semiconductor Junctions Based on Cadmium Telluride and Other Type II-VI Materials In some embodiments, semiconductor junctions 410 are based upon II-VI compounds that can be prepared in either the n-type or the p-type form. Accordingly, in some embodiments, referring to FIG. 5C, semiconductor junction 410 is a p-n heterojunction in which layers 520 and 540 are any combination set forth in the following table or alloys thereof.

| Layer 520 | Layer 540 |
| --- | --- |
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing semiconductor junctions 410 are based upon II-VI compounds are described in Chapter 4 of Bube, *Photovoltaic Materials*, 1998, Imperial College Press, London, which is hereby incorporated by reference in its entirety.

5.2.5 Semiconductor Junctions Based on Crystalline Silicon

While semiconductor junctions 410 that are made from thin film semiconductor films are preferred, the invention is not so limited. In some embodiments semiconductor junctions 410 is based upon crystalline silicon. For example, referring to FIG. 5D, in some embodiments, semiconductor junction 410 comprises a layer of p-type crystalline silicon 540 and a layer of n-type crystalline silicon 550. Methods for manufacturing crystalline silicon semiconductor junctions 410 are described in Chapter 2 of Bube, *Photovoltaic Materials*, 1998, Imperial College Press, London, which is hereby incorporated by reference herein in its entirety.

5.3 Albedo Embodiments

The solar cell design of the present invention is advantageous because it can collect light through the entire circumferential surface. Accordingly, in some embodiments of the present invention, these solar cell assemblies (e.g., solar cell assembly 400, 700, 800, 900, etc.) are arranged in a reflective environment in which surfaces around the solar cell assembly have some amount of albedo. Albedo is a measure of reflectivity of a surface or body. It is the ratio of electromagnetic radiation (EM radiation) reflected to the amount incident upon it. This fraction is usually expressed as a percentage from 0% to 100%. In some embodiments, surfaces in the vicinity of the solar cell assemblies of the present invention are prepared so that they have a high albedo by painting such surfaces a reflective white color. In some embodiments, other materials that have a high albedo can be used. For example, the albedo of some materials around such solar cells approach or exceed ninety percent. See, for example, Boer, 1977, Solar Energy 19, 525, which is hereby incorporated by reference herein in its entirety. However, surfaces having any amount of albedo (e.g., five percent or more, ten percent or more, twenty percent or more) are within the scope of the present invention. In one embodiment, the solar cells assemblies of the present invention are arranged in rows above a gravel surface, where the gravel has been painted white in order to improve the reflective properties of the gravel. In general, any Lambertian or diffuse reflector surface can be used to provide a high albedo surface.

By way of example, in some embodiments of the present invention, the bifacial solar cell assemblies (panels) of the present invention have a first and second face and are placed in rows facing South in the Northern hemisphere (or facing North in the Southern hemisphere). Each of the panels is placed some distance above the ground (e.g., 100 cm above the ground). The East-West separation between the panels is somewhat dependent upon the overall dimensions of the panels. By way of illustration only, panels having overall dimensions of about 106 cm×44 cm are placed in the rows such that the East-West separation between the panels is between 10 cm and 50 cm. In one specific example the East-West separation between the panels is 25 cm.

In some embodiments, the central point of the panels in the rows of panels is between 0.5 meters and 2.5 meters from the ground. In one specific example, the central point of the panels is 1.55 meters from the ground. The North-South separation between the rows of panels is dependent on the dimensions of the panels. By way of illustration, in one specific example, in which the panels have overall dimensions of about 106 cm×44 cm, the North-South separation is 2.8 meters. In some embodiments, the North-South separation is between 0.5 meters and 5 meters. In some embodiments, the North-South separation is between 1 meter and 3 meters.

In some embodiments, models for computing the amount of sunlight received by solar panels as put forth in Lorenzo et al., 1985, Solar Cells 13, pp. 277-292, which is hereby incorporated by reference herein in its entirety, are used to compute the optimum horizontal tilt and East-West separation of the solar panels in the rows of solar panels that are placed in a reflective environment. In some embodiments, internal or external reflectors are implemented in the solar cell assembly to take advantage of the albedo effect and enhance light input into the solar cell assembly. An exemplary embodiment of the internal reflectors (e.g., reflector 1404) is depicted in FIG. 16. More description of albedo surfaces that can be used in conjunction with the present invention are disclosed in U.S. patent application Ser. No. 11/315,523, which is hereby incorporated by reference in its entirety.

5.4 Dual Layer Core Embodiments

Embodiments of the present invention in which conductive core 404 of the solar cells 402 of the present invention is made of a uniform conductive material have been disclosed. The invention is not limited to these embodiments. In some embodiments, conductive core 404 in fact has an inner core and an outer conductive core. The inner core can be referred to as a substrate 403 while the outer core can be referred to as back-electrode 404 in such embodiment. In such embodiments, the outer conductive core is circumferentially disposed on substrate 403. In such embodiments, substrate 403 is typically nonconductive whereas the outer core is conductive. Substrate 403 has an elongated shape consistent with other embodiments of the present invention. For instance, in one embodiment, substrate 403 is made of glass fibers in the form of a wire. In some embodiments, substrate 403 is an electrically conductive nonmetallic material. However, the present invention is not limited to embodiments in which substrate 403 is electrically conductive because the outer core can function as the electrode. In some embodiments, substrate 403 is tubing (e.g., plastic or glass tubing).

In some embodiments, substrate 403 is made of a material such as polybenzamidazole (e.g., Celazole®, available from Boedeker Plastics, Inc., Shiner, Tex.). In some embodiments, the inner core is made of polymide (e.g., DuPont™ Vespel®, or DuPont™ Kapton®, Wilmington, Del.). In some embodiments, the inner core is made of polytetrafluoroethylene (PTFE) or polyetheretherketone (PEEK), each of which is available from Boedeker Plastics, Inc. In some embodiments, substrate 403 is made of polyamide-imide (e.g., Torlon® PAI, Solvay Advanced Polymers, Alpharetta, Ga.).

In some embodiments, substrate 403 is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, substrate 403 is a phenoloic laminate having a NEMA grade of G-3, G-5, G-7, G-9, G-10 or G-11. Exemplary phenolic laminates are available from Boedeker Plastics, Inc.

In some embodiments, substrate 403 is made of polystyrene. Examples of polystyrene include general purpose polystyrene and high impact polystyrene as detailed in Marks' *Standard Handbook for Mechanical Engineers*, ninth edition, 1987, McGraw-Hill, Inc., p. 6-174, which is hereby incorporated by reference herein in its entirety. In still other embodiments, substrate 403 is made of cross-linked polystyrene. One example of cross-linked polystyrene is Rexolite® (C-Lec Plastics, Inc). Rexolite is a thermoset, in particular a rigid and translucent plastic produced by cross linking polystyrene with divinylbenzene.

In some embodiments, substrate 403 is a polyester wire (e.g., a Mylar® wire). Mylar® is available from DuPont Teijin Films (Wilmington, Del.). In still other embodiments, substrate 403 is made of Durastone®, which is made by using polyester, vinylester, epoxid and modified epoxy resins combined with glass fibers (Roechling Engineering Plastic Pte Ltd., Singapore).

In still other embodiments, substrate 403 is made of polycarbonate. Such polycarbonates can have varying amounts of glass fibers (e.g., 10%, 20%, 30%, or 40%) in order to adjust tensile strength, stiffness, compressive strength, as well as the thermal expansion coefficient of the material. Exemplary polycarbonates are Zelux® M and Zelux® W, which are available from Boedeker Plastics, Inc.

In some embodiments, substrate 403 is made of polyethylene. In some embodiments, substrate 403 is made of low density polyethylene (LDPE), high density polyethylene (HDPE), or ultra high molecular weight polyethylene (UHMW PE). Chemical properties of HDPE are described in Marks' *Standard Handbook for Mechanical Engineers*, ninth edition, 1987, McGraw-Hill, Inc., p. 6-173, which is hereby incorporated by reference herein in its entirety. In some embodiments, substrate 403 is made of acrylonitrile-butadiene-styrene, polytetrifluoro-ethylene (Teflon), polymethacrylate (lucite or plexiglass), nylon 6,6, cellulose acetate butyrate, cellulose acetate, rigid vinyl, plasticized vinyl, or polypropylene. Chemical properties of these materials are described in Marks' *Standard Handbook for Mechanical Engineers*, ninth edition, 1987, McGraw-Hill, Inc., pp. 6-172 through 6-175, which is hereby incorporated by reference herein in its entirety.

Additional exemplary materials that can be used to form substrate 403 are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), *Plastics*, Morgan-Grampiand, Ltd., 2 vols. 1970; Tobolsky and Mark (eds.), *Polymer Science and Materials*, Wiley, 1971; Glanville, *The Plastics's Engineer's Data Book*, Industrial Press, 1971; Mohr (editor and senior author), Oleesky, Shook, and Meyers, *SPI Handbook of Technology and Engineering of Reinforced Plastics Composites*, Van Nostrand Reinhold, 1973, each of which is hereby incorporated by reference herein in its entirety.

In general, outer core is made out of any material that can support the photovoltaic current generated by solar cell with negligible resistive losses. In some embodiments, outer core is made of any conductive metal, such as aluminum, molybdenum, steel, nickel, silver, gold, or an alloy thereof. In some embodiments, outer core is made out of a metal-, graphite-, carbon black-, or superconductive carbon black-filled oxide, epoxy, glass, or plastic. In some embodiments, outer core is made of a conductive plastic. In some embodiments, this conductive plastic is inherently conductive without any requirement for a filler. In some embodiments, inner core is made out of a conductive material and outer core is made out of molybdenum. In some embodiments, inner core is made out of a nonconductive material, such as a glass rod, and outer core is made out of molybdenum.

5.5 Exemplary Dimensions

The present invention encompasses solar cell assemblies having any dimensions that fall within a broad range of dimensions. For example, referring to FIG. 4B, the present invention encompasses solar cell assemblies having a length/ between 1 cm and 50,000 cm and a width w between 1 cm and 50,000 cm. In some embodiments, the solar cell assemblies have a length/between 10 cm and 1,000 cm and a width w between 10 cm and 1,000 cm. In some embodiments, the solar cell assemblies have a length l between 40 cm and 500 cm and a width w between 40 cm and 500 cm.

5.6 Additional Solar Cell Embodiments

Using FIG. 3B for reference to element numbers, in some embodiments, copper-indium-gallium-diselenide (Cu(InGa)Se$_2$), referred to herein as CIGS, is used to make the absorber layer of junction 110. In such embodiments, back-electrode 404 can be made of molybdenum. In some embodiments, back-electrode 404 comprises an inner core of polyimide and an outer core that is a thin film of molybdenum sputtered onto the polyimide core prior to CIGS deposition. On top of the molybdenum, the CIGS film, which absorbs the light, is evaporated. Cadmium sulfide (CdS) is then deposited on the CIGS in order to complete semiconductor junction 410. Optionally, a thin intrinsic layer (i-layer) 415 is then deposited on the semiconductor junction 410. The i-layer 415 can be formed using a material including but not limited to, zinc oxide, metal oxide or any transparent material that is highly insulating. Next, transparent conductive layer 412 is disposed on either the i-layer (when present) or the semiconductor junction 410 (when the i-layer is not present). Transparent conductive layer 412 can be made of a material such as aluminum doped zinc oxide (ZnO:Al), gallium doped zinc oxide, boron doped zinc oxide, indium-zinc oxide, or indium-tin oxide.

ITN Energy Systems, Inc., Global Solar Energy, Inc., and the Institute of Energy Conversion (IEC), have collaboratively developed technology for manufacturing CIGS photovoltaics on polyimide substrates using a roll-to-roll co-evaporation process for deposition of the CIGS layer. In this process, a roll of molybdenum-coated polyimide film (referred to as the web) is unrolled and moved continuously into and through one or more deposition zones. In the deposition zones, the web is heated to temperatures of up to ~450° C. and copper, indium, and gallium are evaporated onto it in the presence of selenium vapor. After passing out of the deposition zone(s), the web cools and is wound onto a take-up spool. See, for example, 2003, Jensen et al., "Back Contact Cracking During Fabrication of CIGS Solar Cells on Polyimide Substrates," NCPV and Solar Program Review Meeting 2003, NREL/CD-520-33586, pages 877-881, which is hereby incorporated by reference in its entirety. Likewise, Birkmire et al., 2005, Progress in Photovoltaics: Research and Applications 13, 141-148, hereby incorporated by reference, disclose a polyimide/Mo web structure, specifically, PI/Mo/Cu (InGa)Se$_2$/CdS/ZnO/ITO/Ni—Al. Deposition of similar structures on stainless foil has also been explored. See, for example, Simpson et al., 2004, "Manufacturing Process Advancements for Flexible CIGS PV on Stainless Foil," DOE Solar Energy Technologies Program Review Meeting, PV Manufacturing Research and Development, PO32, which is hereby incorporated by reference herein in its entirety.

In some embodiments of the present invention, an absorber material is deposited onto a polyimide/molybdenum web, such as those developed by Global Solar Energy (Tucson, Ariz.), or a metal foil (e.g., the foil disclosed in Simpson et al.). In some embodiments, the absorber material is any of the absorbers disclosed herein. In a particular embodiment, the absorber is Cu(InGa)Se$_2$. In some embodiments, the elongated core is made of a nonconductive material such as undoped plastic. In some embodiments, the elongated core is made of a conductive material such as a conductive metal, a metal-filled epoxy, glass, or resin, or a conductive plastic (e.g., a plastic containing a conducting filler). Next, semiconductor junction 410 is completed by depositing a window layer onto the absorber layer. In the case where the absorber layer is Cu(InGa)Se$_2$, CdS can be used. Finally, optional i-layer 415 and transparent conductive layer 412 are added to complete the solar cell. Next, the foil is wrapped around and/or glued to a wire-shaped or tube-shaped elongated core. The advantage of such a fabrication method is that material that cannot withstand the deposition temperature of the absorber layer, window layer, i-layer or transparent conductive layer 412 can be used as an inner core for the solar cell. This manufacturing process can be used to manufacture any of the solar cells 402 disclosed in the present invention, where the conductive core 402 comprises an inner core and an outer conductive core. The inner core is any conductive or nonconductive material disclosed herein whereas the outer conductive core is the web or foil onto which the absorber layer, window layer, and transparent conductive layer were deposited prior to rolling the foil onto the inner core. In some embodiments, the web or foil is glued onto the inner core using appropriate glue.

An aspect of the present invention provides a method of manufacturing a solar cell comprising depositing an absorber layer on a first face of a metallic web or a conducting foil. Next, a window layer is deposited on to the absorber layer. Next, a transparent conductive layer is deposited on to the window layer. The metallic web or conducting foil is then rolled around an elongated core, thereby forming an elongated solar cell 402. In some embodiments, the absorber layer is copper-indium-gallium-diselenide (Cu(InGa)Se$_2$) and the window layer is cadmium sulfide. In some embodiments, the metallic web is a polyimide/molybdenum web. In some embodiments, the conducting foil is steel foil or aluminum foil. In some embodiments, the elongated core is made of a conductive metal, a metal-filled epoxy, a metal-filled glass, a metal-filled resin, or a conductive plastic.

In some embodiments, a transparent conducting oxide conductive film is deposited on a tubular shaped or rigid solid rod shaped core rather than wrapping a metal web or foil around the elongated core. In such embodiments, the tubular shaped or rigid solid rod shaped core can be, for example, a plastic rod, a glass rod, a glass tube, or a plastic tube. Such embodiments require some form of conductor in electrical communication with the interior face or back contact of the semiconductor junction. In some embodiments, divots in the tubular shaped or rigid solid rod shaped elongated core are filled with a conductive metal in order to provide such a conductor. The conductor can be inserted in the divots prior to depositing the transparent conductive layer or conductive back contact film onto the tubular shaped or rigid solid rod shaped elongated core. In some embodiments such a conductor is formed from a metal source that runs lengthwise along the side of the elongated solar cell 402. This metal can be deposited by evaporation, sputtering, screen printing, inkjet printing, metal pressing, conductive ink or glue used to attach a metal wire, or other means of metal deposition.

More specific embodiments will now be disclosed. In some embodiments, the elongated core is a glass tubing having a divot that runs lengthwise on the outer surface of the glass tubing, and the manufacturing method comprises depositing a conductor in the divot prior to the rolling step. In some embodiments, the glass tubing has a second divot that runs lengthwise on the surface of the glass tubing. In such embodiments, the first divot and the second divot are on approximate or exact opposite circumferential sides of the glass tubing. In such embodiments, accordingly, the method further comprises depositing a conductor in the second divot prior to the rolling or, in embodiments in which rolling is not used, prior to the deposition of an inner transparent conductive layer or conductive film, junction, and outer transparent conductive layer onto the elongated core.

In some embodiments, the elongated core is a glass rod having a first divot that runs lengthwise on the surface of the glass rod and the method comprises depositing a conductor in the first divot prior to the rolling. In some embodiments, the glass rod has a second divot that runs lengthwise on the surface of the glass rod and the first divot and the second divot are on approximate or exact opposite circumferential sides of the glass rod. In such embodiments, accordingly, the method further comprises depositing a conductor in the second divot prior to the rolling or, in embodiments in which rolling is not used, prior to the deposition of an inner transparent conductive layer or conductive film, junction, and outer transparent conductive layer onto the elongated core. Suitable materials for the conductor are any of the materials described as a conductor herein including, but not limited to, aluminum, molybdenum, titanium, steel, nickel, silver, gold, or an alloy thereof.

Figure 13:
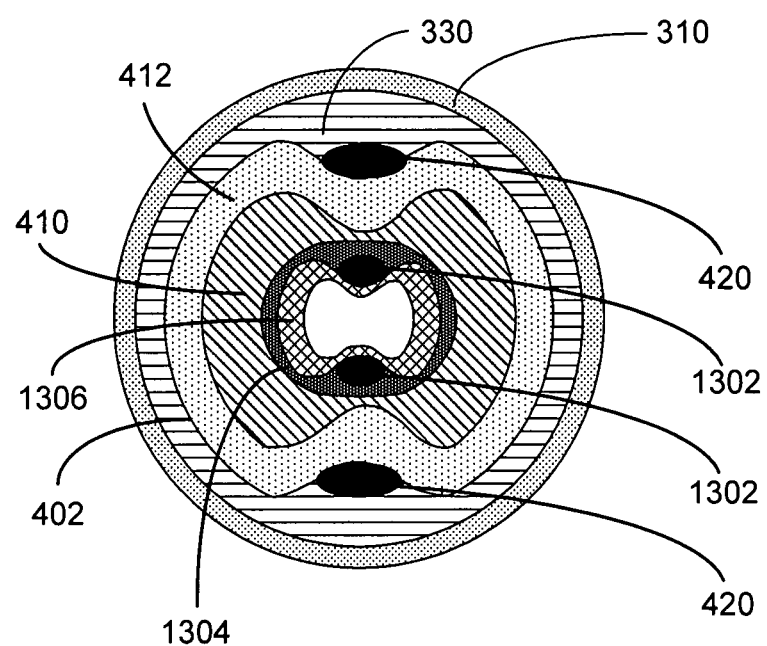
FIG. 13 illustrates a cross-sectional view of a solar cell in accordance with an embodiment of the present invention.

FIG. 13 details a cross-section of a solar cell 402 in accordance with the present invention. Solar cell 402 can be manufactured using either the rolling method or deposition techniques. Components that have reference numerals corresponding to other embodiments of the present invention (e.g., 410, 412, and 420) are made of the same materials disclosed in such embodiments. In FIG. 13, there is an elongated tubing 1306 having a first and second divot running lengthwise along the tubing (perpendicular to the plane of the page) that are on circumferentially opposing sides of tubing 1306 as illustrated. In typical embodiments, tubing 1306 is not conductive. For example, tubing 1306 is made of plastic or glass in some embodiments. Conductive wiring 1302 is placed in the first and second divot as illustrated in FIG. 13. In some embodiments, the conductive wiring is made of any of the conductive materials of the present invention. In some embodiments, conductive wiring 1302 is made out of aluminum, molybdenum, steel, nickel, titanium, silver, gold, or an alloy thereof. In embodiments where 1304 is a conducting foil or metallic web, the conductive wiring 1302 is inserted into the divots prior to wrapping the metallic web or conducting foil 1304 around the elongated core 1306. In embodiments where 1304 is a transparent conductive oxide or conductive film, the conductive wiring 1302 is inserted into the divots prior to depositing the transparent conductive oxide or conductive film 1304 onto elongated core 1306. As noted, in some embodiments the metallic web or conducting foil 1304 is wrapped around tubing 1306. In some embodiments, metallic web or conducting foil 1304 is glued to tubing 1306. In some embodiments layer 1304 is not a metallic web or conducting foil. For instance, in some embodiments, layer 1304 is a transparent conductive layer. Such a layer is advantageous because it allow for thinner absorption layers in the semiconductor junction. In embodiments where layer 1304 is a transparent conductive layer, the transparent conductive layer, semiconductor junction 410 and outer transparent conductive layer 412 are deposited using deposition techniques.

One aspect of the invention provides a solar cell assembly comprising a plurality of elongated solar cells 402 each having the structure disclosed in FIG. 13. That is, each elongated solar cell 402 in the plurality of elongated solar cells comprises an elongated tubing 1306, a metallic web or a conducting foil (or, alternatively, a layer of TCO) 1304 circumferentially disposed on the elongated tubing 1306, a semiconductor junction 410 circumferentially disposed on the metallic web or the conducting foil (or, alternatively, a layer of TCO) 1304 and a transparent conductive oxide layer 412 disposed on the semiconductor junction 410. The elongated solar cells 402 in the plurality of elongated solar cells are geometrically arranged in a parallel or a near parallel manner thereby forming a planar array having a first face and a second face. The plurality of elongated solar cells is arranged such that one or more elongated solar cells in the plurality of elongated solar cells are not in electrically conductive contact with adjacent elongated solar cells. In some embodiments, the elongated solar cells can be in physical contact with each other if there is an insulative layer between adjacent elongated solar cells. The solar cell assembly further comprises a plurality of metal counter-electrodes. Each respective elongated solar cell 402 in the plurality of elongated solar cells is bound to a first corresponding metal counter-electrode 420 in the plurality of metal counter-electrodes such that the first metal counter-electrode lies in a first groove that runs lengthwise on the respective elongated solar cell 402. The apparatus further comprises a transparent electrically insulating substrate that covers all or a portion of the face of the planar array. A first and second elongated solar cell in the plurality of elongated solar cells are electrically connected in series by an electrical contact that connects the first electrode of the first elongated solar cell to the first corresponding counter-electrode of the second elongated solar cell. In some embodiments, the elongated tubing 1306 is glass tubing or plastic tubing having a one or more grooves filled with a conductor 1302. In some embodiments, each respective elongated solar cell 402 in the plurality of elongated solar cells is bound to a second corresponding metal counter-electrode 420 in the plurality of metal counter-electrodes such that the second metal counter-electrode lies in a second groove that runs lengthwise on the respective elongated solar cell 402 and such that the first groove and the second groove are on opposite or substantially opposite circumferential sides of the respective elongated solar cell 402. In some embodiments, the plurality of elongated solar cells 402 is configured to receive direct light from the first face and the second face of the planar array.

5.7 Static Concentrators

Figure 11:
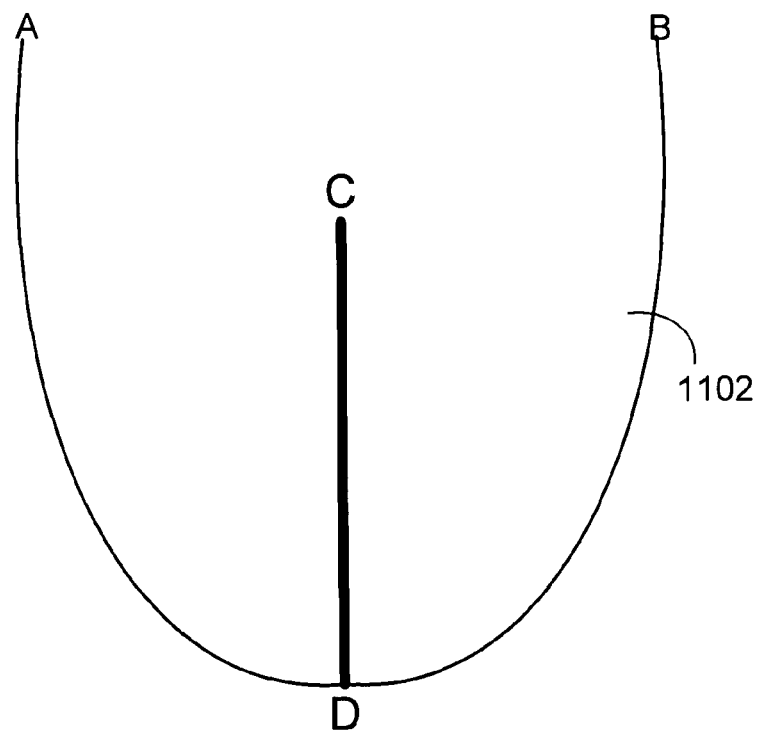
FIG. 11 illustrates a static concentrator for use in some embodiments of the present invention.

Encapsulated solar cell unit 300 may be assembled into bifacial arrays as, for example, any of assemblies 400 (FIG. 4), 700 (FIG. 7), 800 (FIG. 8), 900 (FIG. 9), or 1000 (FIG. 10). In some embodiments, static concentrators are used to improve the performance of the solar cell assemblies of the present invention. The use of a static concentrator in one exemplary embodiment is illustrated in FIG. 11, where static concentrator 1102, with aperture AB, is used to increase the efficiency of bifacial solar cell assembly CD, where solar cell assembly CD is, for example, any of assemblies 400 (FIG. 4), 700 (FIG. 7), 800 (FIG. 8), 900 (FIG. 9), or 1000 (FIG. 10) of other assemblies of solar cell units 300 of the present invention. Static concentrator 1102 can be formed from any static concentrator materials known in the art such as, for example, a simple, properly bent or molded aluminum sheet, or reflector film on polyurethane. Concentrator 1102 is an example of a low concentration ratio, nonimaging, compound parabolic concentrator (CPC)-type collector. Any (CPC)-type collector can be used with the solar cell assemblies of the present invention. For more information on (CPC)-type collectors, see Pereira and Gordon, 1989, Journal of Solar Energy Engineering, 111, pp. 111-116, which is hereby incorporated by reference herein in its entirety.

Additional static concentrators that can be used with the present invention are disclosed in Uematsu et al., 1999, Proceedings of the 11$^{th}$ International Photovoltaic Science and Engineering Conference, Sapporo, Japan, pp. 957-958; Uematsu et al., 1998, Proceedings of the Second World Conference on Photovoltaic Solar Energy Conversion, Vienna, Austria, pp. 1570-1573; Warabisako et al., 1998, Proceedings of the Second World Conference on Photovoltaic Solar Energy Conversion, Vienna, Austria, pp. 1226-1231; Eames et al., 1998, Proceedings of the Second World Conference on Photovoltaic Solar Energy Conversion, Vienna Austria, pp. 2206-2209; Bowden et al., 1993, Proceedings of the 23$^{rd}$ IEEE Photovoltaic Specialists Conference, pp. 1068-1072; and Parada et al., 1991, Proceedings of the 10$^{th}$ EC Photovoltaic Solar Energy Conference, pp. 975-978, each of which is hereby incorporated by reference herein in its entirety.

Figure 12:
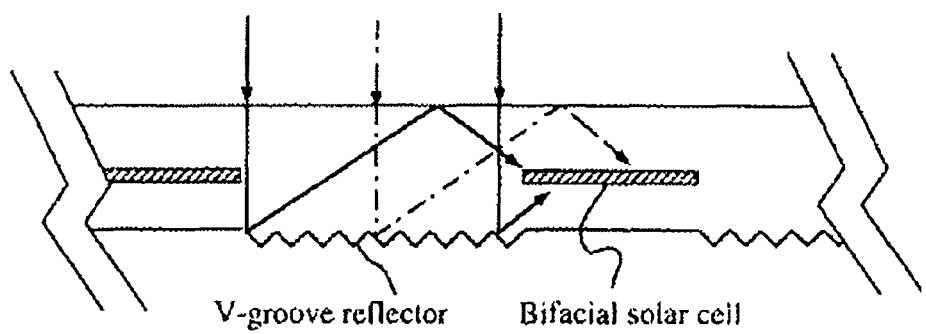
FIG. 12 illustrates a static concentrator used in some embodiments of the present invention.

In some embodiments, a static concentrator as illustrated in FIG. 12 is used. The bifacial solar cells illustrated in FIG. 12 can be any bifacial solar cell assembly of the present invention including, but not limited to assembly 400 (FIG. 4), 700 (FIG. 7), 800 (FIG. 8), 900 (FIG. 9), or 1000 (FIG. 10). The static concentrator illustrated in FIG. 12 uses two sheets of cover glass on the front and rear of the module with submillimeter V-grooves that are designed to capture and reflect incident light as illustrated in the figure. More details of such concentrators are found in Uematsu et al., 2001, Solar Energy Materials & Solar Cell 67, 425-434 and Uematsu et al., 2001, Solar Energy Materials & Solar Cell 67, 441-448, each of which is hereby incorporated by reference herein in its entirety. Additional static concentrators that can be used with the present invention are discussed in *Handbook of Photovoltaic Science and Engineering*, 2003, Luque and Hegedus (eds.), Wiley & Sons, West Sussex, England, Chapter 12, which is hereby incorporated by reference herein in its entirety.

5.8 Internal Reflector Embodiments

After elongated solar cells 402 are encapsulated as depicted, for example, in FIG. 15, they may be arranged to form solar cell assemblies. FIG. 16 illustrates a solar cell assembly 1600 in accordance with the present invention. In this exemplary embodiment, an internal reflector 1404 is used to enhance solar input into the solar cell system. As shown in FIG. 16, elongated solar cells 402 and an internal reflector 1404 are assembled into an alternating array as shown. Elongated solar cells 402 in solar cell assembly 1600 have counter-electrodes 420 and electrodes 440. As illustrated in FIG. 16, solar cell assembly 1600 comprises a plurality of elongated solar cells 402. There is no limit to the number of solar cells 402 in this plurality (e.g., 10 or more, 100 or more, 1000 or more, 10,000 or more, between 5,000 and one million solar cells 402, etc.). Accordingly, solar cell assembly 1600 also comprises a plurality of internal reflectors 1404. There is no limit to the number of internal reflectors 1404 in this plurality (e.g., 10 or more, 100 or more, 1000 or more, 10,000 or more, between 5,000 and one million reflector 1404, etc.).

Within solar cell assembly 1600, internal reflectors 1404 run lengthwise along corresponding elongated solar cells 402. In some embodiments, internal reflectors 1404 have a hollow core. As in the case of elongated conductive core 404, a hollow nonconductive core (e.g. substrate 403 of FIG. 3B) is advantageous in many instances because it reduces the amount of material needed to make such devices, thereby lowering costs. In some embodiments, internal reflector 1404 is a plastic casing with a layer of highly reflective material (e.g., polished aluminum, aluminum alloy, silver, nickel, steel, etc.) deposited on the plastic casing. In some embodiments, internal reflector 1404 is a single piece made out of polished aluminum, aluminum alloy, silver, nickel, steel, etc. In some embodiments, internal reflector 1404 is a metal or plastic casing onto which is layered a metal foil tape. Exemplary metal foil tapes include, but are not limited to, 3M aluminum foil tape 425, 3M aluminum foil tape 427, 3M aluminum foil tape 431, and 3M aluminum foil tape 439 (3M, St. Paul, Minn.). Internal reflector 1404 can adopt a broad range of designs, only one of which is illustrated in FIG. 16. Central to the design of reflectors 1404 found in a preferred embodiment of the present invention is the desire to reflect direct light that enters into both sides of solar cell assembly 1600 (i.e., side 1620 and side 1640).

In general, reflectors 1404 of the present invention are designed to optimize reflection of light into adjacent elongated solar cells 402. Direct light that enters one side of solar cell assembly 1600 (e.g., side 1940, above the plane of the solar cell assembly drawn in FIG. 16) is directly from the sun whereas light that enters the other side of the solar cell (e.g., side 1620, below the plane of the solar cell assembly drawn in FIG. 16) will have been reflected off of a surface. In some embodiments, this surface is Lambertian, a diffuse or an involute reflector. Thus, because each side of the solar cell assembly faces a different light environment, the shape of internal reflector 1404 on side 1620 may be different than on side 1640.

Although internal reflector 1404 is illustrated in FIG. 16 as having a symmetrical four-sided cross-sectional shape, the cross-sectional shape of the internal reflectors 1404 of the present invention are not limited to such a configuration. In some embodiments, a cross-sectional shape of an internal reflector 1404 is astroid. In some embodiments, a cross-sectional shape of an internal reflector 1404 is four-sided and at least one side of the four-sided cross-sectional shape is linear. In some embodiments, a cross-sectional shape of an internal reflector 1404 is four-sided and at least one side of the four-sided cross-sectional shape is parabolic. In some embodiments, a cross-sectional shape of an internal reflector 1404 is four-sided and at least one side of the four-sided cross-sectional shape is concave. In some embodiments, a cross-sectional shape of an internal reflector 1404 is four-sided; and at least one side of the four-sided cross-sectional shape is circular or elliptical. In some embodiments, a cross-sectional shape of an internal reflector in the plurality of internal reflectors is four-sided and at least one side of the four-sided cross-sectional shape defines a diffuse surface on the internal reflector. In some embodiments, a cross-sectional shape of an internal reflector 1404 is four-sided and at least one side of the four-sided cross-sectional shape is the involute of a cross-sectional shape of an elongated solar cell 402. In some embodiments, a cross-sectional shape of an internal reflector 1404 is two-sided, three-sided, four-sided, five-sided, or six-sided. In some embodiments, a cross-sectional shape of an internal reflector in the plurality of internal reflectors 1404 is four-sided and at least one side of the four-sided cross-sectional shape is faceted.

Additional features are added to reflectors 1404 to enhance the reflection onto adjacent elongated solar cells 402 in some embodiments. Modified reflectors 1404 are equipped with a strong reflective property such that incident light is effectively reflected off the side surfaces 1610 of the reflectors 1404. In some embodiments, the reflected light off surfaces 1610 does not have directional preference. In other embodiments, the reflector surfaces 1610 are designed such that the reflected light is directed towards the elongated solar cell 402 for optimal absorbance.

In some embodiments, the connection between an internal reflector 1404 and an adjacent elongated solar cell is provided by an additional adaptor piece. Such an adapter piece has surface features that are complementary to both the shapes of internal reflectors 1404 as well as elongated solar cells 402 in order to provide a tight fit between such components. In some embodiments, such adaptor pieces are fixed on internal reflectors 1404. In other embodiments, the adaptor pieces are fixed on elongated solar cells 402. In additional embodiments, the connection between elongated solar cells 402 and reflectors 1404 may be strengthened by electrically conducting glue or tapes.

Diffuse Reflection.

Figure 17A:
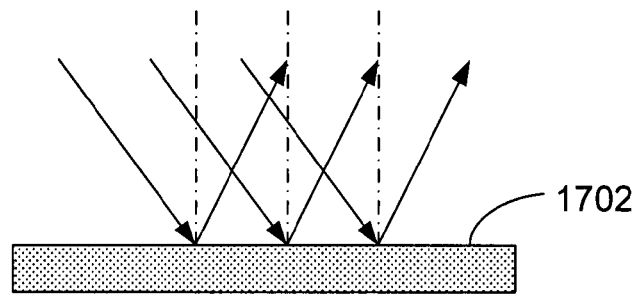
FIG. 17A illustrates light reflection on a specular surface, in accordance with the prior art.
Figure 17B:
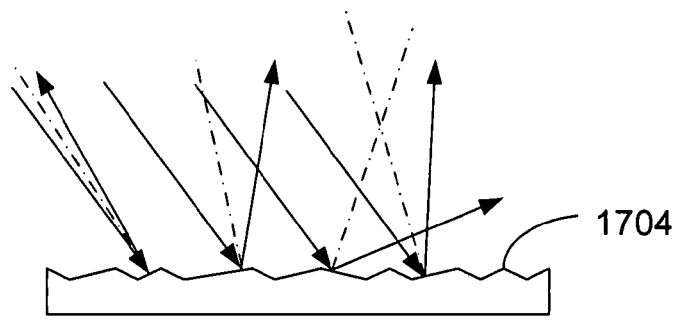
FIG. 17B illustrates light reflection on a diffuse surface, in accordance with the prior art.

In some embodiments in accordance with the present invention, the side surface 1610 of reflector 1404 is a diffuse reflecting surface (e.g., 1610 in FIG. 16). The concept of diffuse reflection can be better appreciated with a first understanding of specular reflection. Specular reflection is defined as the reflection off smooth surfaces such as mirrors or a calm body of water (e.g., 1702 in FIG. 17A). On a specular surface, light is reflected mainly in the direction of the reflected ray and is attenuated by an amount dependent upon the physical properties of the surface. Since the light reflected from the surface is mainly in the direction of the reflected ray, the position of the observer (e.g., the position of the elongated solar cells 402) determines the perceived illumination of the surface. Specular reflection models the light reflecting properties of shiny or mirror-like surfaces. In contrast to specular reflection, reflection off rough surfaces such as clothing, paper, and the asphalt roadway leads to a different type of reflection known as diffuse reflection (FIG. 17B). Light incident on a diffuse reflection surface is reflected equally in all directions and is attenuated by an amount dependent upon the physical properties of the surface. Since light is reflected equally in all directions the perceived illumination of the surface is not dependent on the position of the observer or receiver of the reflected light (e.g. the position of the elongated solar cell 402). Diffuse reflection models the light reflecting properties of matt surfaces.

Diffuse reflection surfaces reflect off light with no directional dependence for the viewer. Whether the surface is microscopically rough or smooth has a tremendous impact upon the subsequent reflection of a beam of light. Input light from a single directional source is reflected off in all directions on a diffuse reflecting surface (e.g., 1704 in FIG. 17B). Diffuse reflection originates from a combination of internal scattering of light, e.g., the light is absorbed and then re-emitted, and external scattering from the rough surface of the object.

Lambertian Reflection.

Figure 17C:
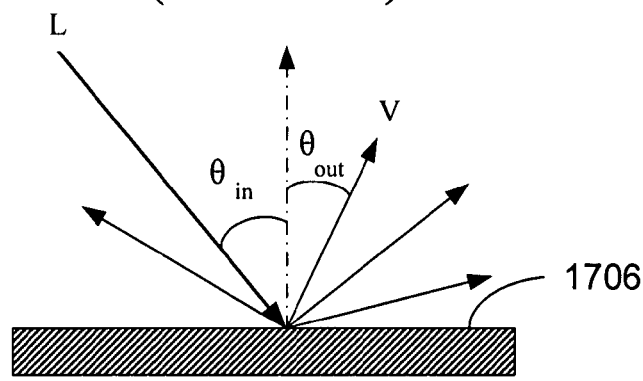
FIG. 17C illustrates light reflection on a Lambertian surface, in accordance with the prior art.

In some embodiments in accordance with the present invention, surface 1610 of reflector 1404 is a Lambertian reflecting surface (e.g., 1706 in FIG. 17C). A Lambertian source is defined as an optical source that obeys Lambert's cosine law, i.e., that has an intensity directly proportional to the cosine of the angle from which it is viewed (FIG. 17C). Accordingly, a Lambertian surface is defined as a surface that provides uniform diffusion of incident radiation such that its radiance (or luminance) is the same in all directions from which it can be measured (e.g., radiance is independent of viewing angle) with the caveat that the total area of the radiating surface is larger than the area being measured.

On a perfectly diffusing surface, the intensity of the light emanating in a given direction from any small surface component is proportional to the cosine of the angle of the normal to the surface. The brightness (luminance, radiance) of a Lambertian surface is constant regardless of the angle from which it is viewed.

The incident light $\vec{l}$ strikes a Lambertian surface (FIG. 17C) and reflects in different directions. When the intensity of $\vec{l}$ is defined as $I_{in}$, the intensity (e.g., $I_{out}$) of a reflected light $\vec{v}$ can be defined as following in accordance to Lambert's cosine law:

$$I_{out}(\vec{v}) = I_{in}(\vec{l})\varphi(\vec{v}, \vec{l})\frac{\cos\theta_{in}}{\cos\theta_{out}}$$

where $\varphi(\vec{v}, \vec{l}) = k_d \cos\theta_{out}$ and $k_d$ is related to the surface property. The incident angle is defined as $\theta_{in}$, and the reflected angle is defined as $\theta_{out}$. Using the vector dot product formula, the intensity of the reflected light can also be written as:

$$I_{out}(\vec{v}) = k_d I_{in}(\vec{l})\vec{l}\cdot\vec{n},$$

where n denotes a vector that is normal to the Lambertian surface.

Such a Lambertian surface does not lose any incident light radiation, but re-emits it in all the available solid angles with a $2\pi$ radians, on the illuminated side of the surface. Moreover, a Lambertian surface emits light so that the surface appears equally bright from any direction. That is, equal projected areas radiate equal amounts of luminous flux. Though this is an ideal, many real surfaces approach it. For example, a Lambertian surface can be created with a layer of diffuse white paint. The reflectance of such a typical Lambertian surface may be 93%. In some embodiments, the reflectance of a Lambertian surface may be higher than 93%. In some embodiments, the reflectance of a Lambertian surface may be lower than 93%. Lambertian surfaces have been widely used in LED design to provide optimized illumination, for example in U.S. Pat. No. 6,257,737 to Marshall, et al.; U.S. Pat. No. 6,661,521 to Stern; and U.S. Pat. No. 6,603,243 to Parkyn, et al., which are hereby incorporated by reference in their entireties.

Advantageously, Lambertian surfaces 1610 on reflector 1404 effectively reflect light in all directions. The reflected light is then directed towards the elongated solar cell 402 to enhance solar cell performance.

Reflection on Involute Surfaces.

Figure 18A:
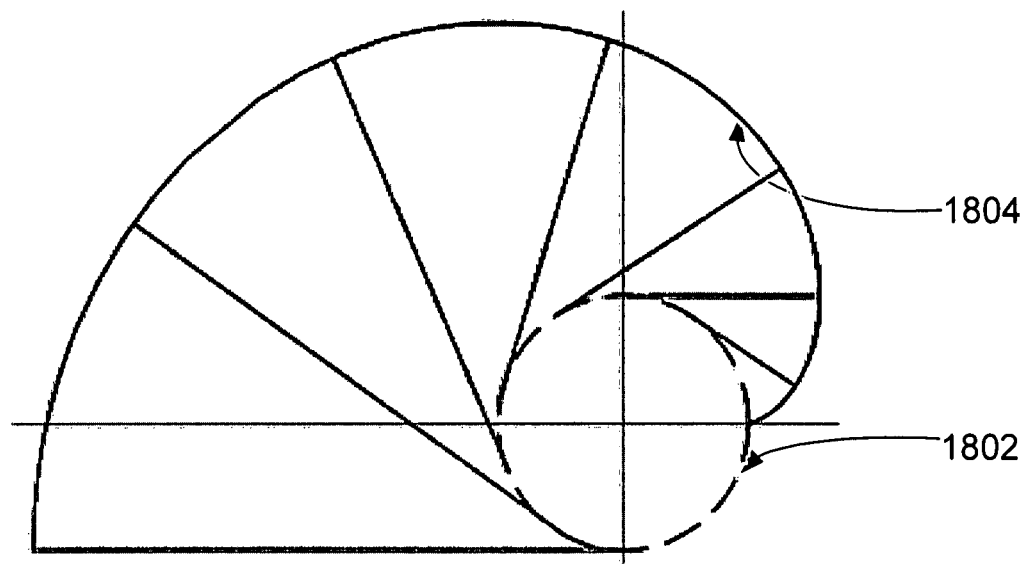
FIG. 18A illustrates a circle and an involute of the circle, in accordance with the prior art

In some embodiments in accordance with the present invention, surface 1610 of the reflector 1404 is an involute surface of the elongated solar cell tube 402. In some embodiments, the elongated solar cell tube 402 is circular or near circular. Reflector surface 1610 is preferably the involute of a circle (e.g. 1804 in FIG. 18A). The involute of circle 1802 is defined as the path traced out by a point on a straight line that rolls around a circle. For example, the involute of a circle can be drawn in the following steps. First, attach a string to a point on a curve. Second, extend the string so that it is tangent to the curve at the point of attachment. Third, wind the string up, keeping it always taut. The locus of points traced out by the end of the string (e.g. 1804 in FIG. 18) is called the involute of the original circle 1802. The original circle 1802 is called the evolute of its involute curve 1804.

Although in general a curve has a unique evolute, it has infinitely many involutes corresponding to different choices of initial point. An involute can also be thought of as any curve orthogonal to all the tangents to a given curve. For a circle of radius r, at any time t, its equation can be written as:

$$x = r\cos t$$

$$y = r\sin t.$$

Correspondingly, the parametric equation of the involute of the circle is:

$$x_i = r(\cos t + t\sin t)$$

$$y_i = r(\sin t - t\cos t).$$

Evolute and involute are reciprocal functions. The evolute of an involute of a circle is a circle.

Involute surfaces have been implemented in numerous patent designs to optimize light reflections. For example, a flash lamp reflector (U.S. Pat. No. 4,641,315 to Draggoo, hereby incorporated by reference herein in its entirety) and concave light reflector devices (U.S. Pat. No. 4,641,315 to Rose, hereby incorporated by reference herein in its entirety), which are hereby incorporated by reference in their entireties, both utilize involute surfaces to enhance light reflection efficiency.

Figure 18B:
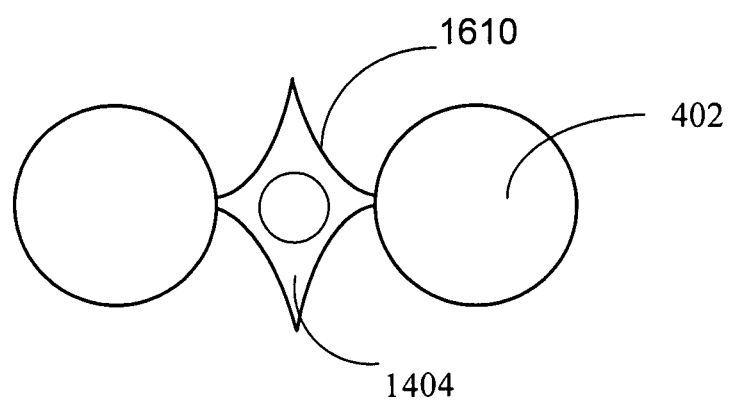
FIG. 18B illustrates a cross-sectional view of a solar cell architecture in accordance with an embodiment of the present invention.

In FIG. 18B, an internal reflector 1404 is connected to two elongated solar cells 402. Details of both reflector 1404 and solar cell 402 are omitted to highlight the intrinsic relationship between the shapes of the elongated solar cell 402 and the shape of the side surface 1610 of the internal reflector 1404. Side surfaces 1610 are constructed such that they are the involute of the circular elongated solar cell 402.

Advantageously, the involute-evolute design imposes optimal interactions between the side surfaces 1610 of reflectors 1404 and the adjacent elongated solar cell 402. When the side surface 1610 of the reflector 1404 is an involute surface corresponding to the elongated solar cell 402 that is adjacent or attached to the reflector 1404, light reflects effectively off the involute surface in a direction that is optimized towards the elongated solar cell 402.

In some embodiments not illustrated in FIG. 16, elongated solar cells 402 are swaged at their ends such that the diameter at the ends is less than the diameter towards the center of such cells. Electrodes 440 are placed on these swaged ends.

Solar Cell Assembly.

As illustrated in FIG. 16, solar cells in the plurality of elongated solar cells 402 are geometrically arranged in a parallel or near parallel manner. In some embodiments, elongated conductive core 404 is any of the dual layer cores described in Section 5.4. In some embodiments, rather forming a conductive core 404, back-electrode 404 is a thin layer of metal deposited on a substrate 403 as illustrated, for example, in FIG. 3B. In some embodiments, the terminal ends of elongated solar cells 402 can be stripped down to the outer core. For example, consider the case in which elongated solar cell 402 is constructed out of an inner core made of a cylindrical substrate 403 and an outer core (back-electrode 404) made of molybdenum. In such a case, the end of elongated solar cell 402 can be stripped down to the molybdenum back-electrode 404 and electrode 440 can be electrically connected with back-electrode 404.

In some embodiments, each internal reflector 1404 connects to two encapsulated elongated solar cells 402 (e.g., depicted as 300 in FIGS. 15 and 16), for example, in the manner illustrated in FIG. 16. Because of this, elongated solar cells 402 are effectively joined into a single composite device. In FIG. 16, electrodes 440 extend the connection from back-electrode 404. In some embodiments, internal reflector units 1404 are connected to encapsulated solar cells 300 via indentations on transparent tubular casing 310. In some embodiments, the indentations on transparent tubular casing 310 are created to complement the shape of the internal reflector unit 1404. Indentations on two transparent tubular casing 310 are used to lock in one internal reflector unit 1404 that is positioned between the two encapsulated solar cells 300. In some embodiments, adhesive materials, e.g., epoxy glue, are used to fortify the connections between the internal reflector unit 1404 and the adjacent encapsulated solar cell units 300 such that solar radiation is properly reflected towards the encapsulated solar cell units 300 for absorption.

Figure 19:
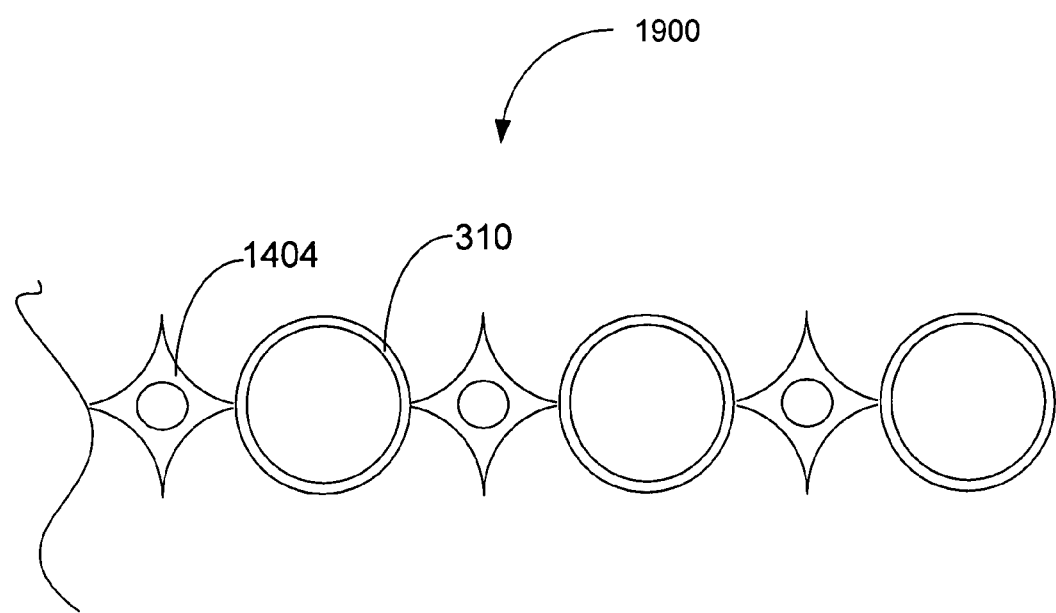
FIG. 19 illustrates a cross-sectional view of an array of alternating tubular casings and internal reflectors, in accordance with an embodiment of the present invention.

In some embodiments in accordance with the present invention, internal reflector unit 1404 and transparent tubular casing 310 may be created in the same molding process. For example, an array of alternating transparent tubular casing 310 and astroid reflectors 1404, e.g., shown as 1900 in FIG. 19, can be made as a single composite entity. Additional modifications may be done to enhance the albedo effect from the internal reflector unit 1404 or to promote better fitting between transparent tubular casing 310 and solar cell 402. The tubular casing 310 may contain internal modifications that complement the shapes of some embodiments of the solar cell 402. There is no limit to the number of internal reflectors 1404 or tubular casing 310 in the assembly as depicted in FIG. 19 (e.g., 10 or more, 100 or more, 1000 or more, 10,000 or more, between 5,000 and one million internal reflectors 1404 and tubular casing 310, etc.).

6. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed is:

1. A solar cell unit comprising:
(A) a solar cell, said solar cell comprising:
a rigid substrate that is either (i) tubular or (ii) a solid rod;
a back-electrode circumferentially disposed on the substrate;
a semiconductor junction circumferentially disposed on said back electrode; and
a transparent conductive layer circumferentially disposed on said semiconductor junction;
(B) a filler layer circumferentially disposed on said transparent conductive layer, wherein said filler layer has a first refractive index and comprises a gel, an adhesive or a sealant; and
(C) a transparent tubular casing circumferentially disposed on said filler layer thereby circumferentially sealing said solar cell, wherein said tubular casing has a second refractive index that is smaller or equal in value to said first refractive index, wherein $$r_i \geq \frac{r_o}{\eta_{outer\,ring}}$$

wherein
$r_i$ is a radius of said cylindrical shaped solar cell;
$r_o$ is the radius of said transparent tubular casing; and
$\eta_{outer\,ring}$ is said first refractive index.

2. The solar cell unit of claim 1, wherein said first refractive index is approximately equal to said second refractive index.

3. The solar cell unit of claim 1, wherein said first refractive index is chosen to minimize the reflection of light by said filler layer.

4. The solar cell unit of claim 1, wherein said second refractive index is in the range of 1.4 to 1.9.

5. The solar cell unit of claim 1, wherein said second refractive index is in the range of 1.5 to 1.9.

6. The solar cell unit of claim 1, wherein said first and second refractive indexes are chosen such that light incident on said filler layer is refracted towards the center of said solar cell unit.

7. The solar cell unit of claim 1, wherein said solar cell unit further comprises:
(D) an antireflective coating circumferentially disposed on said transparent tubular casing.

8. The solar cell unit of claim 7, wherein the antireflective coating comprises $MgF_2$, silicone nitrate, titanium nitrate, silicon monoxide, or silicone oxide nitrite.

9. The solar cell unit of claim 1, wherein said transparent tubular casing is formed directly on said filler layer by casting or UV curing.

10. The solar cell unit of claim 1, wherein said semiconductor junction comprises an absorber layer and a junction partner layer, wherein
said junction partner layer is circumferentially disposed on said absorber layer; and
said absorber layer is circumferentially disposed on said back-electrode.

11. The solar cell unit of claim 10, wherein said absorber layer is copper-indium-gallium-diselenide and said junction partner layer is CdS, $SnO_2$, ZnO, $ZrO_2$, or doped ZnO.

12. The solar cell unit of claim 10, wherein the absorber layer comprises CIGS having a <110> crystallographic orientation, a <112> crystallographic orientation, or no crystallographic orientation.

13. The solar cell unit of claim 1, wherein said substrate has a solid core.

14. The solar cell unit of claim 1, wherein the substrate comprises plastic, metal or glass.

15. The solar cell unit of claim 1, wherein said transparent tubular casing comprises a plurality of transparent tubular casing layers including a first transparent tubular casing layer and a second transparent tubular casing layer, and wherein the first transparent tubular casing layer is circumferentially disposed on said filler layer and the second transparent tubular casing layer is circumferentially disposed on said first transparent tubular casing layer.

16. The solar cell unit of claim 1, wherein said transparent conductive layer is coated with a fluorescent material.

17. The solar cell unit of claim 1, wherein the substrate comprises a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

18. The solar cell unit of claim 1, wherein the substrate comprises aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass.

19. A solar cell unit comprising:
(A) a solar cell, said solar cell comprising:
a rigid substrate that is either (i) tubular or (ii) a solid rod;
a back-electrode circumferentially disposed on the substrate;
a semiconductor junction circumferentially disposed on said back electrode; and
a transparent conductive layer circumferentially disposed on said semiconductor junction;
(B) a water resistant layer circumferentially disposed on said transparent conductive layer;
(C) a filler layer distinct from and circumferentially disposed on said water resistant layer, wherein said filler layer has a first refractive index and comprises a gel, an adhesive or a sealant; and
(D) a transparent tubular casing circumferentially disposed on said filler layer thereby circumferentially sealing said solar cell, wherein said tubular casing has a second refractive index that is smaller or equal in value to said first refractive index.

* * * * *